US012787290B2

(12) United States Patent
Koto et al.

(10) Patent No.: US 12,787,290 B2
(45) Date of Patent: Nov. 3, 2026

(54) THREE-DIMENSIONAL MEMORY DEVICE INCLUDING DIELECTRIC WALL COMPARTMENTS FOR WORD LINE CONTACT VIA STRUCTURES AND METHODS OF FORMING THE SAME

(71) Applicant: Sandisk Technologies, Inc., Milpitas, CA (US)

(72) Inventors: Makoto Koto, Yokkaichi (JP); Takayuki Maekura, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 315 days.

(21) Appl. No.: 18/626,880

(22) Filed: Apr. 4, 2024

(65) Prior Publication Data

US 2025/0318118 A1 Oct. 9, 2025

(51) Int. Cl.
*H10B 43/27* (2023.01)
*H10B 51/20* (2023.01)

(52) U.S. Cl.
CPC ............. *H10B 43/27* (2023.02); *H10B 51/20* (2023.02)

(58) Field of Classification Search
CPC ................................ H10B 43/27; H10B 51/20
USPC .......................................................... 257/324
See application file for complete search history.

(56) References Cited

U.S. PATENT DOCUMENTS 9,601,502 B2 3/2017 Sano et al.
9,806,093 B2 10/2017 Toyama et al.
9,818,693 B2 11/2017 Toyama et al.
9,818,759 B2 11/2017 Kai et al.
9,960,181 B1 5/2018 Cui et al.
9,985,046 B2 5/2018 Lu et al.
10,038,006 B2 7/2018 Furihata et al.
10,192,784 B1 * 1/2019 Cui ........................ H10B 41/35
10,381,371 B2 8/2019 Ogawa et al.
10,840,260 B2 11/2020 Kai et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — Igwe U Anya
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, memory opening fill structures located in the memory openings, where each of the memory opening fill structures includes a respective vertical channel and a vertical stack of memory elements, a dielectric lattice structure embedded in the alternating stack and including a two-dimensional array of compartments that is formed by an assembly of first dielectric walls laterally extending at least substantially along a first horizontal direction and second dielectric walls laterally extending at least substantially along a second horizontal direction, and layer contact via structures vertically extending through respective compartments within the two-dimensional array of compartments and contacting a top surface of a respective one of the electrically conductive layers.

20 Claims, 55 Drawing Sheets

(56) References Cited

U.S. PATENT DOCUMENTS

| | | | |
|---|---|---|---|
| 10,872,857 B1 | 12/2020 | Otsu et al. | |
| 10,879,264 B1 | 12/2020 | Otsu et al. | |
| 10,903,237 B1 | 1/2021 | Hosoda et al. | |
| 11,282,783 B2 | 3/2022 | Otsu et al. | |
| 11,322,440 B2 | 5/2022 | Kubo | |
| 11,342,245 B2 | 5/2022 | Cui et al. | |
| 11,355,506 B2 | 6/2022 | Tokita et al. | |
| 11,450,679 B2 | 9/2022 | Tanaka et al. | |
| 11,488,975 B2 | 11/2022 | Totoki et al. | |
| 11,495,612 B2 | 11/2022 | Tanaka et al. | |
| 11,812,598 B2 | 11/2023 | Watanabe | |
| 2017/0179026 A1 | 6/2017 | Toyama et al. | |
| 2017/0179151 A1 | 6/2017 | Kai et al. | |
| 2017/0179152 A1 | 6/2017 | Toyama et al. | |
| 2017/0179153 A1 | 6/2017 | Ogawa et al. | |
| 2017/0179154 A1 | 6/2017 | Furihata et al. | |
| 2017/0358594 A1 | 12/2017 | Lu et al. | |
| 2020/0286901 A1* | 9/2020 | Shimomura | G11C 11/161 |
| 2021/0210424 A1 | 7/2021 | Otsu et al. | |
| 2021/0210428 A1 | 7/2021 | Ohsawa et al. | |
| 2021/0210503 A1 | 7/2021 | Matsuno et al. | |
| 2021/0210504 A1 | 7/2021 | Otsu et al. | |
| 2021/0366808 A1 | 11/2021 | Cui et al. | |
| 2021/0366920 A1 | 11/2021 | Tokita et al. | |
| 2021/0366924 A1 | 11/2021 | Tokita et al. | |
| 2021/0384206 A1 | 12/2021 | Iwai et al. | |
| 2021/0384207 A1 | 12/2021 | Iwai et al. | |
| 2021/0391345 A1 | 12/2021 | Otsu et al. | |
| 2022/0005818 A1 | 1/2022 | Tanaka et al. | |
| 2022/0005824 A1 | 1/2022 | Tanaka et al. | |
| 2022/0051979 A1 | 2/2022 | Kuroko et al. | |
| 2022/0130852 A1 | 4/2022 | Totoki et al. | |
| 2022/0157724 A1 | 5/2022 | Takii et al. | |
| 2022/0189872 A1 | 6/2022 | Sano et al. | |
| 2022/0302146 A1 | 9/2022 | Shimomura et al. | |
| 2022/0302153 A1 | 9/2022 | Tanaka et al. | |
| 2022/0328413 A1 | 10/2022 | Kubo et al. | |
| 2022/0406379 A1 | 12/2022 | Takeguchi et al. | |
| 2022/0406720 A1 | 12/2022 | Hinoue et al. | |
| 2022/0406793 A1 | 12/2022 | Takeguchi et al. | |
| 2022/0415907 A1 | 12/2022 | Watanabe | |
| 2023/0013984 A1 | 1/2023 | Otsu | |
| 2023/0038557 A1 | 2/2023 | Ogawa et al. | |
| 2023/0041950 A1 | 2/2023 | Chibvongodze et al. | |
| 2023/0044232 A1 | 2/2023 | Kai et al. | |
| 2023/0045001 A1 | 2/2023 | Ogawa et al. | |
| 2023/0380151 A1 | 11/2023 | Sano et al. | |
| 2023/0389308 A1 | 11/2023 | Tobioka | |
| 2023/0411306 A1 | 12/2023 | Matsuno | |
| 2024/0047171 A1 | 2/2024 | Tsutsumi et al. | |
| 2024/0107758 A1 | 3/2024 | Ogawa et al. | |
| 2025/0174550 A1* | 5/2025 | Maekura | G11C 16/0483 |

OTHER PUBLICATIONS

U.S. Appl. No. 18/221,689, filed Jul. 13, 2023, SanDisk Technologies LLC.

U.S. Appl. No. 18/221,711, filed Jul. 13, 2023, SanDisk Technologies LLC.

U.S. Appl. No. 18/233,759, filed Aug. 14, 2023, Western Digital Technologies, Inc..

U.S. Appl. No. 18/349,578, filed Jul. 10, 2023, SanDisk Technologies LLC.

U.S. Appl. No. 18/352,726, filed Jul. 14, 2023, SanDisk Technologies LLC.

U.S. Appl. No. 18/352,752, filed Jul. 14, 2023, SanDisk Technologies LLC.

U.S. Appl. No. 18/353,577, filed Jul. 17, 2023, SanDisk Technologies LLC.

U.S. Appl. No. 18/354,246, filed Jul. 18, 2023, SanDisk Technologies LLC.

U.S. Appl. No. 18/354,269, filed Jul. 18, 2023, SanDisk Technologies LLC.

U.S. Appl. No. 18/354,283, filed Jul. 18, 2023, SanDisk Technologies LLC.

U.S. Appl. No. 18/354,325, filed Jul. 18, 2023, SanDisk Technologies LLC.

U.S. Appl. No. 18/356,825, filed Jul. 21, 2023, SanDisk Technologies LLC.

U.S. Appl. No. 18/357,676, filed Jul. 24, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

U.S. Appl. No. 18/360,461, filed Jul. 27, 2023, SanDisk Technologies LLC.

U.S. Appl. No. 18/360,541, filed Jul. 27, 2023, SanDisk Technologies LLC.

U.S. Appl. No. 18/360,641, filed Jul. 27, 2023, SanDisk Technologies LLC.

U.S. Appl. No. 18/457,883, filed Aug. 29, 2023, SanDisk Technologies LLC.

U.S. Appl. No. 18/493,020, filed Oct. 24, 2023, SanDisk Technologies LLC.

U.S. Appl. No. 18/495,534, filed Oct. 26, 2023, Western Digital Technologies, Inc..

U.S. Appl. No. 18/523,129, filed Nov. 29, 2023, Western Digital Technologies, Inc..

* cited by examiner

THREE-DIMENSIONAL MEMORY DEVICE INCLUDING DIELECTRIC WALL COMPARTMENTS FOR WORD LINE CONTACT VIA STRUCTURES AND METHODS OF FORMING THE SAME

FIELD

The present disclosure relates generally to the field of semiconductor devices, and particularly to a three-dimensional memory device including dielectric wall compartments for word line contact via structures and methods of forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, memory openings vertically extending through the alternating stack, memory opening fill structures located in the memory openings, where each of the memory opening fill structures includes a respective vertical channel and a vertical stack of memory elements, a dielectric lattice structure embedded in the alternating stack and including a two-dimensional array of compartments that is formed by an assembly of first dielectric walls laterally extending at least substantially along a first horizontal direction and second dielectric walls laterally extending at least substantially along a second horizontal direction, and layer contact via structures vertically extending through respective compartments within the two-dimensional array of compartments and contacting a top surface of a respective one of the electrically conductive layers.

According to another aspect of the present disclosure, a method of forming a three-dimensional memory device is provided. The method comprises: forming an alternating stack of insulating layers and sacrificial material layers; forming memory openings vertically extending through the alternating stack; forming memory opening fill structures in the memory openings, wherein each of the memory opening fill structures comprises a respective vertical semiconductor channel and a respective vertical stack of memory elements; forming a dielectric grid structure in the alternating stack, wherein the dielectric grid structure includes a two-dimensional array of rectangular compartments that is defined by an assembly of first dielectric walls laterally extending along a first horizontal direction and second dielectric walls laterally extending along a second horizontal direction; forming backside trenches through the alternating stack; replacing regions of the sacrificial material layers that are proximal to the backside trenches with electrically conductive layers; and forming layer contact via structures through a respective rectangular compartment within the two-dimensional array of rectangular compartments and directly on a top surface of a respective one of the electrically conductive layers.

BRIEF DESCRIPTION OF THE DRAWINGS

FIG. 2A is a top-down view. FIG. 2B is a vertical cross-sectional view along the vertical plane B-B' of FIG. 2A. FIG. 2C is a vertical cross-sectional view along the vertical plane C-C' of FIG. 2A.

FIG. 3A is a top-down view. FIG. 3B is a vertical cross-sectional view along the vertical plane B-B' of FIG. 3A. FIG. 3C is a vertical cross-sectional view along the vertical plane C-C' of FIG. 3A.

FIG. 4A is a top-down view. FIG. 4B is a vertical cross-sectional view along the vertical plane B-B' of FIG. 4A. FIG. 4C is a vertical cross-sectional view along the vertical plane C-C' of FIG. 4A.

FIG. 5A is a top-down view. FIG. 5B is a vertical cross-sectional view along the vertical plane B-B' of FIG. 5A. FIG. 5C is a vertical cross-sectional view along the vertical plane C-C' of FIG. 5A.

FIG. 6A is a top-down view. FIG. 6B is a vertical cross-sectional view along the vertical plane B-B' of FIG. 6A. FIG. 6C is a vertical cross-sectional view along the vertical plane C-C' of FIG. 6A.

FIG. 7A is a top-down view. FIG. 7B is a vertical cross-sectional view along the vertical plane B-B' of FIG. 7A. FIG. 7C is a vertical cross-sectional view along the vertical plane C-C' of FIG. 7A.

FIG. 8A is a top-down view. FIG. 8B is a vertical cross-sectional view along the vertical plane B-B' of FIG. 8A. FIG. 8C is a vertical cross-sectional view along the vertical plane C-C' of FIG. 8A.

FIG. 10A is a top-down view. FIG. 10B is a vertical cross-sectional view along the vertical plane B-B' of FIG. 10A. FIG. 10C is a vertical cross-sectional view along the vertical plane C-C' of FIG. 10A.

FIG. 11A is a top-down view. FIG. 11B is a vertical cross-sectional view along the vertical plane B-B' of FIG. 11A. FIG. 11C is a vertical cross-sectional view along the vertical plane C-C' of FIG. 11A. FIG. 11D is a vertical cross-sectional view of a memory opening fill structure.

FIG. 12A is a top-down view. FIG. 12B is a vertical cross-sectional view along the vertical plane B-B' of FIG. 12A. FIG. 12C is a vertical cross-sectional view along the vertical plane C-C' of FIG. 12A.

FIG. 13A is a top-down view. FIG. 13B is a vertical cross-sectional view along the vertical plane B-B' of FIG. 13A. FIG. 13C is a vertical cross-sectional view along the vertical plane C-C' of FIG. 13A. FIG. 13D is a horizontal cross-sectional view along the horizontal plane D-D' of FIG. 13B. FIG. 13E is a horizontal cross-sectional view along the horizontal plane D-D' of FIG. 13B. FIG. 13F is a horizontal cross-sectional view along the horizontal plane D-D' of FIG. 13B.

FIG. 14A is a top-down view. FIG. 14B is a vertical cross-sectional view along the vertical plane B-B' of FIG. 14A. FIG. 14C is a vertical cross-sectional view along the vertical plane C-C' of FIG. 14A. FIG. 14D is a horizontal cross-sectional view along the horizontal plane D-D' of FIG. 14B. FIG. 14E is a horizontal cross-sectional view along the horizontal plane D-D' of FIG. 14B. FIG. 14F is a horizontal cross-sectional view along the horizontal plane D-D' of FIG. 14B.

FIG. 15A is a top-down view. FIG. 15B is a vertical cross-sectional view along the vertical plane B-B' of FIG. 15A. FIG. 15C is a vertical cross-sectional view along the vertical plane C-C' of FIG. 15A.

FIG. 16A is a top-down view. FIG. 16B is a vertical cross-sectional view along the vertical plane B-B' of FIG. 16A. FIG. 16C is a vertical cross-sectional view along the vertical plane C-C' of FIG. 16A. FIG. 16D is a horizontal cross-sectional view along the horizontal plane D-D' of FIG. 16B. FIG. 16E is a horizontal cross-sectional view along the horizontal plane D-D' of FIG. 16B. FIG. 16F is a horizontal cross-sectional view along the horizontal plane D-D' of FIG. 16B.

DETAILED DESCRIPTION

Figure 1:
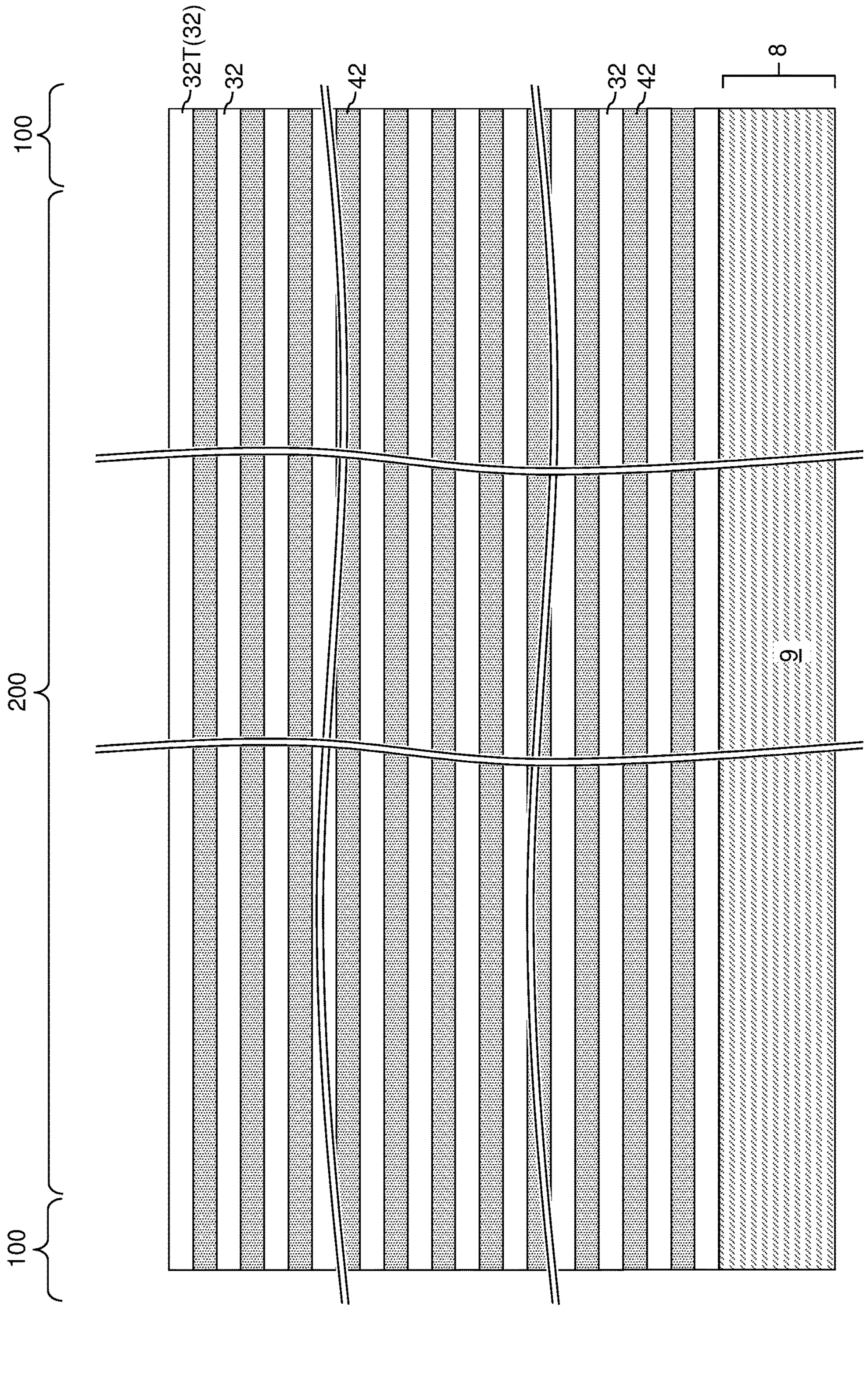
FIG. 1 is a schematic vertical cross-sectional view of an exemplary structure after formation of an alternating stack of insulating layers and sacrificial material layers over a substrate according to a embodiment of the present disclosure.

As discussed above, the embodiments of the present disclosure are directed to a three-dimensional memory device including dielectric wall compartments for word line contact via structures and methods of forming the same, the various aspects of which are described below. The embodiments of the present disclosure can be used to form various structures including a multilevel memory structure, non-limiting examples of which include three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a substrate 8, such as a silicon wafer, which may include a semiconductor material layer 9 at least at an upper portion thereof. The semiconductor material layer 9 includes at least one elemental semiconductor material (e.g., a doped well in a single crystal silicon wafer or a deposited silicon layer), at least one III-V compound semiconductor material, at least one II-VI compound semiconductor material, at least one organic semiconductor material, or other semiconductor materials known in the art. In one embodiment, the semiconductor material layer may comprise a semiconductor material having a doping of a first conductivity type.

An alternating stack (32, 46) of insulating layers 32 and spacer material layers can be formed over a semiconductor material layer 9. The spacer material layers are formed as, or are subsequently replaced with, electrically conductive layers. In case the spacer material layers are subsequently replaced with the electrically conductive layers, the spacer material layers may be formed as sacrificial material layers 42. In this case, a stack of an alternating plurality of insulating layers 32 and sacrificial material layers 42 can be formed over the semiconductor material layer 9. The stack of the alternating plurality is herein referred to as an alternating stack (32, 42).

In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise a dielectric material. In one embodiment, the sacrificial material layers 42 may comprise, and/or may consist essentially of, silicon nitride. The insulating layers 32 can be deposited, for example, by chemical vapor deposition (CVD). For example, if silicon oxide is used for the insulating layers 32, tetraethyl orthosilicate (TEOS) can be used as the precursor material for the CVD process. The sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. The topmost one of the insulating layers 32 is herein referred to as a topmost insulating layer 32T.

The sacrificial material layers are replaced with electrically conductive layers in subsequent processing steps. The contact via structures that are subsequently formed to provide electrical contact to the electrically conductive layers are herein referred to as layer contact via structures, which may comprise word line contact via structures and/or select gate contact via structures, such as drain and/or source side select gate contact via structures. The exemplary structure comprises a contact region 200 in which the layer contact via structures are to be subsequently formed, and at least one memory array region 100. The memory array region or regions 100 are laterally spaced from the contact region 200 and are employed to form three-dimensional memory arrays.

Figure 2A:
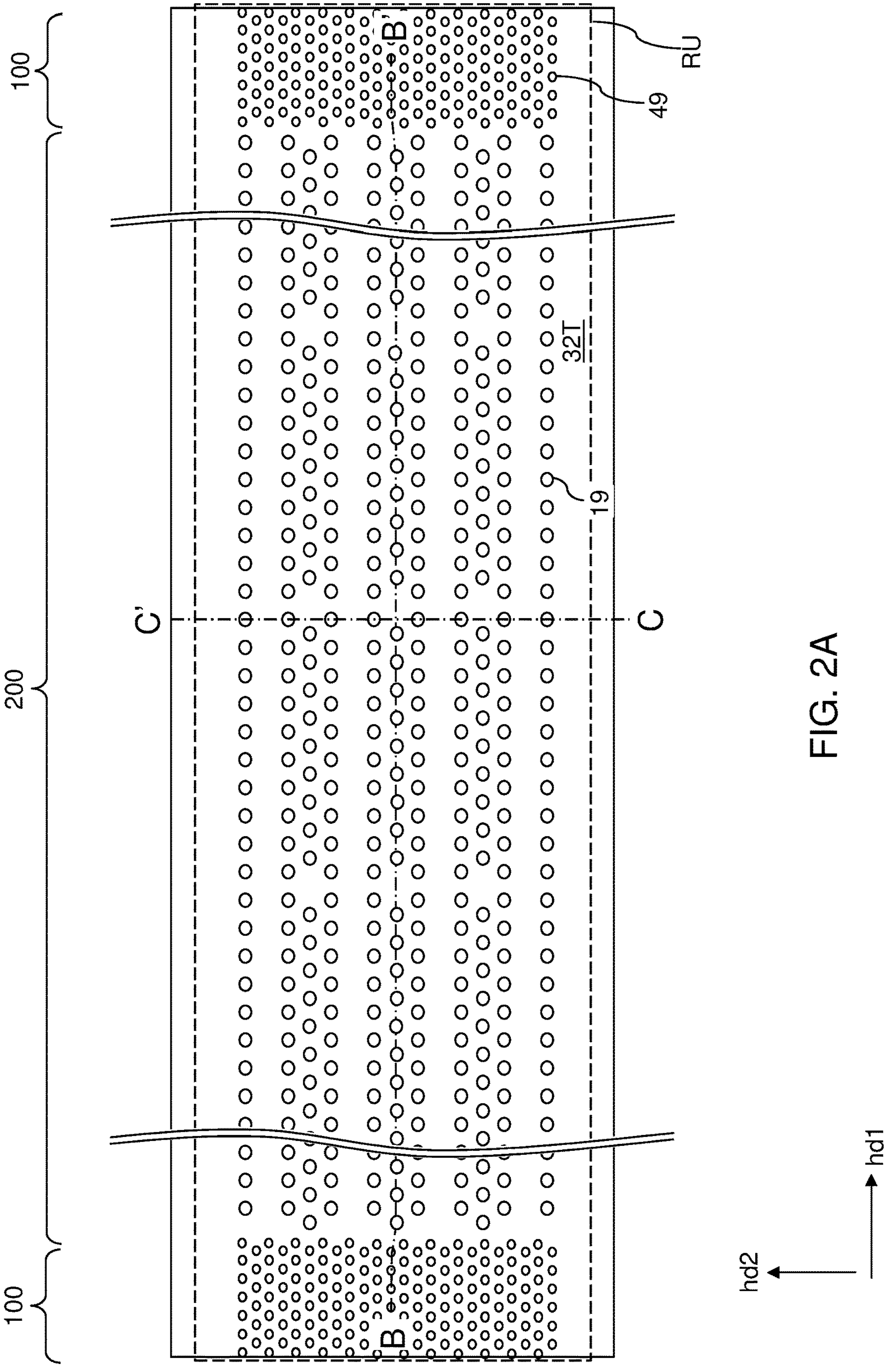
FIGS. 2A-2C are various views of the exemplary structure after formation of memory openings and support openings according to an embodiment of the present disclosure.
Figure 2B:
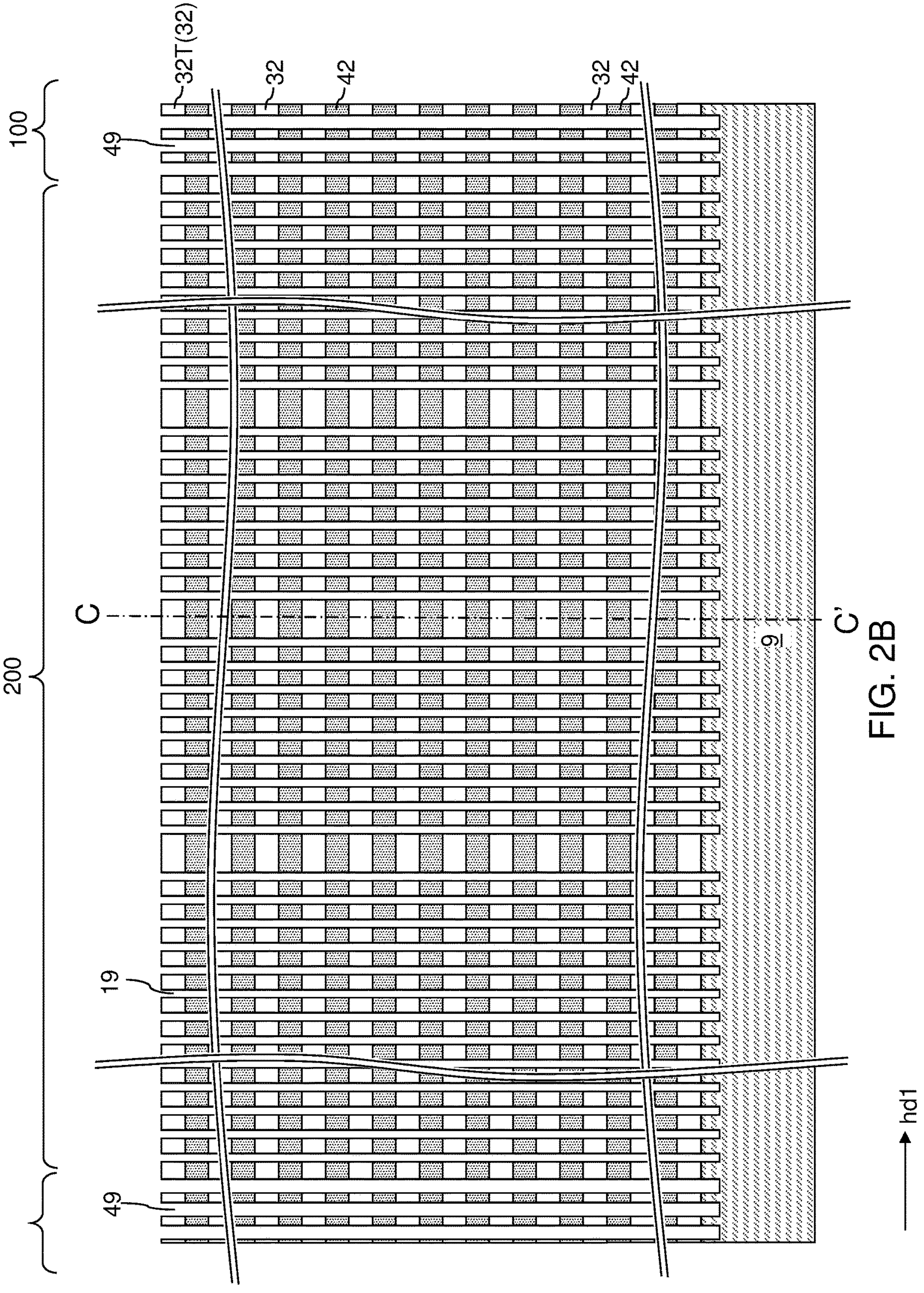
Figure 2C:
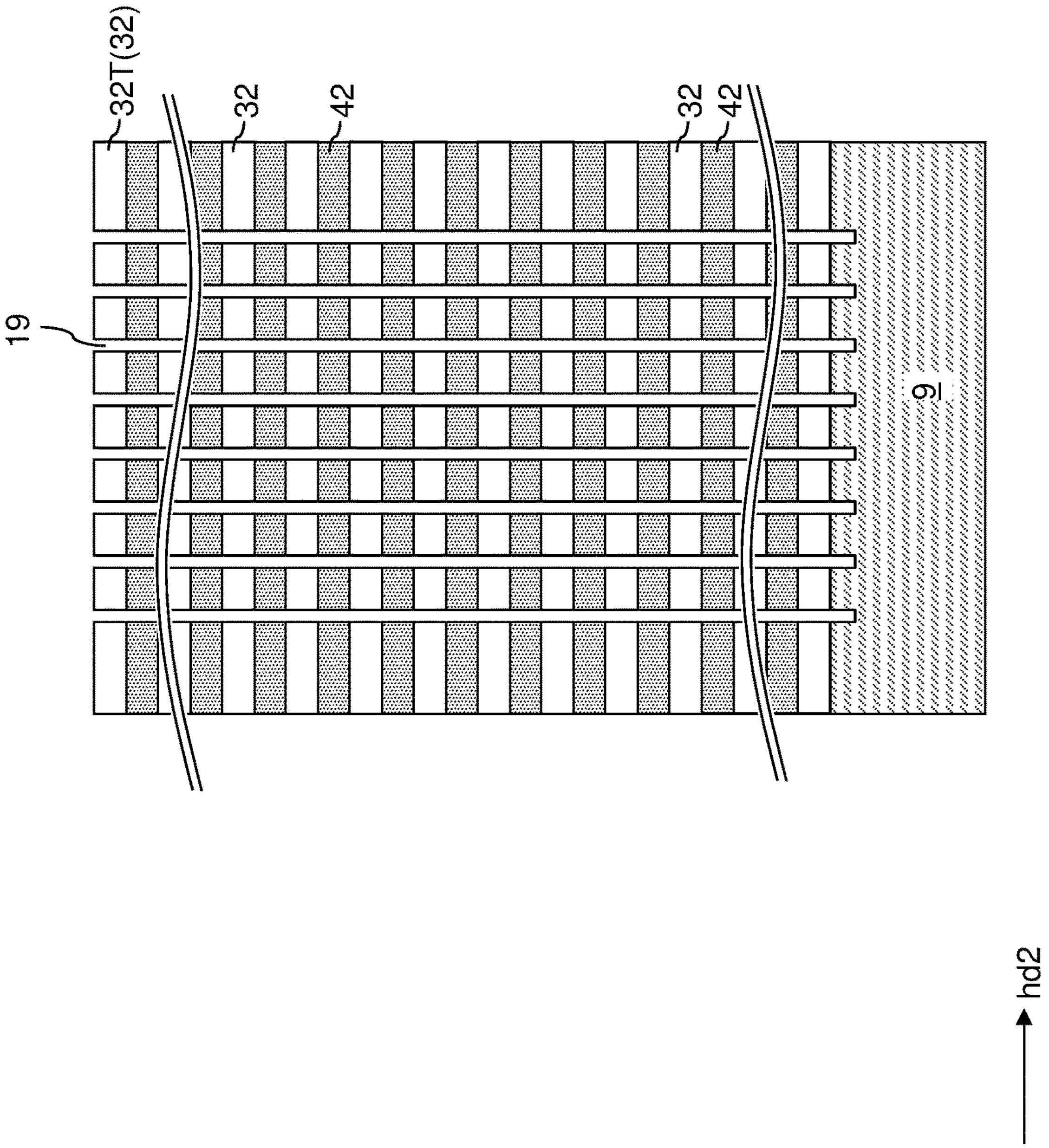

Referring to FIGS. 2A-2C, a lithographic material stack (not shown) including at least a photoresist layer can be formed over the alternating stack (32, 42), and can be lithographically patterned to form openings therein. The pattern in the lithographic material stack can be transferred through the alternating stack (32, 42) and through the alternating stack (32, 42) by at least one anisotropic etch that uses the patterned lithographic material stack as an etch mask. Portions of the alternating stack (32, 42) and underlying the openings in the patterned lithographic material stack are etched to form memory openings 49 in the memory array regions 100 and to form support openings 19 in the contact region 200. As used herein, a "memory opening" refers to an opening in which memory elements, such as a memory stack structure, is subsequently formed. As used herein, a "support opening" refers to an opening in which an electrically inactive structure that provides structural support is subsequently formed.

The memory openings 49 and the support openings extend through the entirety of the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 9. In one embodiment, an overetch into the semiconductor material layer 9 may be optionally performed after the top surface of the semiconductor material layer 9 is physically exposed at a bottom of each memory opening 49 and at a bottom of each support opening 19. The overetch may be performed prior to, or after, removal of the lithographic material stack. In other words, the recessed surfaces of the semiconductor material layer 9 may be vertically offset from the un-recessed top surfaces of the semiconductor material layer 9 by a recess depth. The recess depth can be, for example, in a range from 1 nm to 50 nm, although lesser and greater recess depths can also be used. The overetch is optional, and may be omitted. The lithographic mask stack can be subsequently removed, for example, by ashing.

In one embodiment, the memory openings 49 may have a horizontal cross-sectional shape of a circle. In one embodiment, the support openings 19 may have a horizontal cross-sectional shape of a circle having the same or different diameter than the diameter of the memory openings 49.

In one embodiment, the memory openings 49 may be arranged in rows that laterally extend along a first horizontal direction hd1 (e.g., word line direction). The rows of memory openings 49 may be laterally spaced from each other along a second horizontal direction hd2 (e.g., bit line direction) that is perpendicular to the first horizontal direction hd1. In one embodiment, the pattern of the memory openings 49 and the support openings 19 may be formed as a periodic pattern that is repeated along the second horizontal direction hd2. In this case, a repetition unit (e.g., a memory block) RU may have a rectangular areas having a pair of lengthwise sidewalls that laterally extends along the first horizontal direction hd1. The repetition unit RU may be repeated along the second horizontal direction hd2 with a periodicity that equals the width of the rectangular area along the second horizontal direction hd2. Each repetition unit RU may have at least one two-dimensional array of memory openings 49 formed within a respective memory array region 100, and a respective array of support openings 19 formed within a contact region 200. In one embodiment, each repetition unit RU may comprise two two-dimensional arrays of memory openings 49 that are laterally spaced from each other along the first horizontal direction hd1 by the contact region 200.

According to an aspect of the present disclosure, the support openings 19 may be formed in rows that laterally extend along the first horizontal direction (e.g., word line direction) hd1 within each repetition unit RU. The rows of the support openings 19 may be spaced from each other along the second horizontal direction (e.g., bit line direction) hd2 that is perpendicular to the first horizontal direction hd1. In one embodiment, multiple rows of support openings 19 may be formed in clusters that forms a respective quasi-periodic rectangular array or a quasi-periodic hexagonal array. As used herein, a quasi-periodic array refers to an array that is obtained by selectively deleting a small fraction of elements from a periodic array. Thus, the locations of the support openings 19 may correspond to locations of lattice sites in a two-dimensional periodic array except that some lattice sites of the two-dimensional periodic array do not have a respective support opening 19. In some embodiments, laterally-extending gaps may be provided between a subset of neighboring rows of support openings 19 in the contact region 200.

Figure 3A:
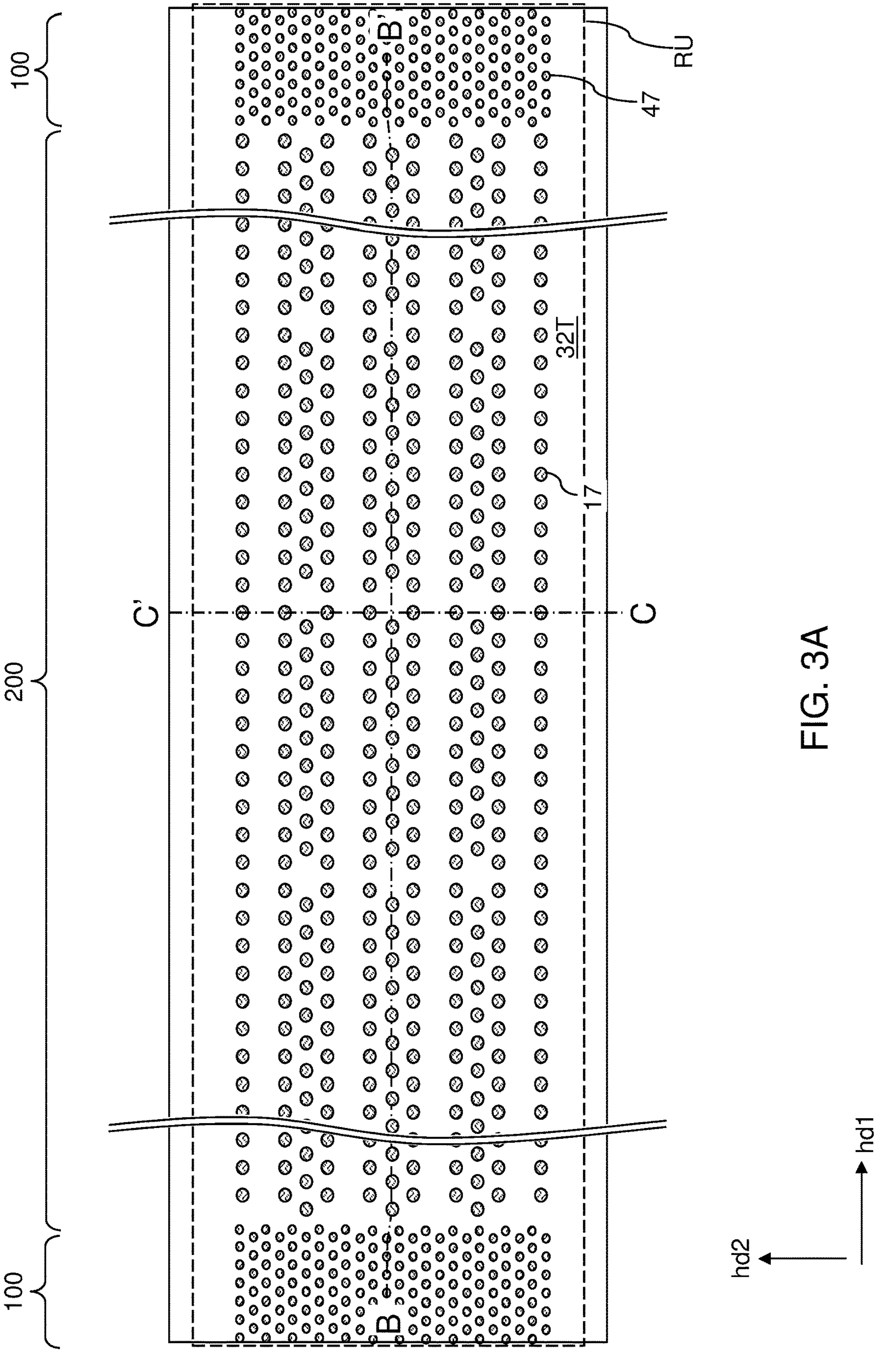
FIGS. 3A-3C are various views of the exemplary structure after formation of sacrificial opening fill structures according to an embodiment of the present disclosure.
Figure 3B:
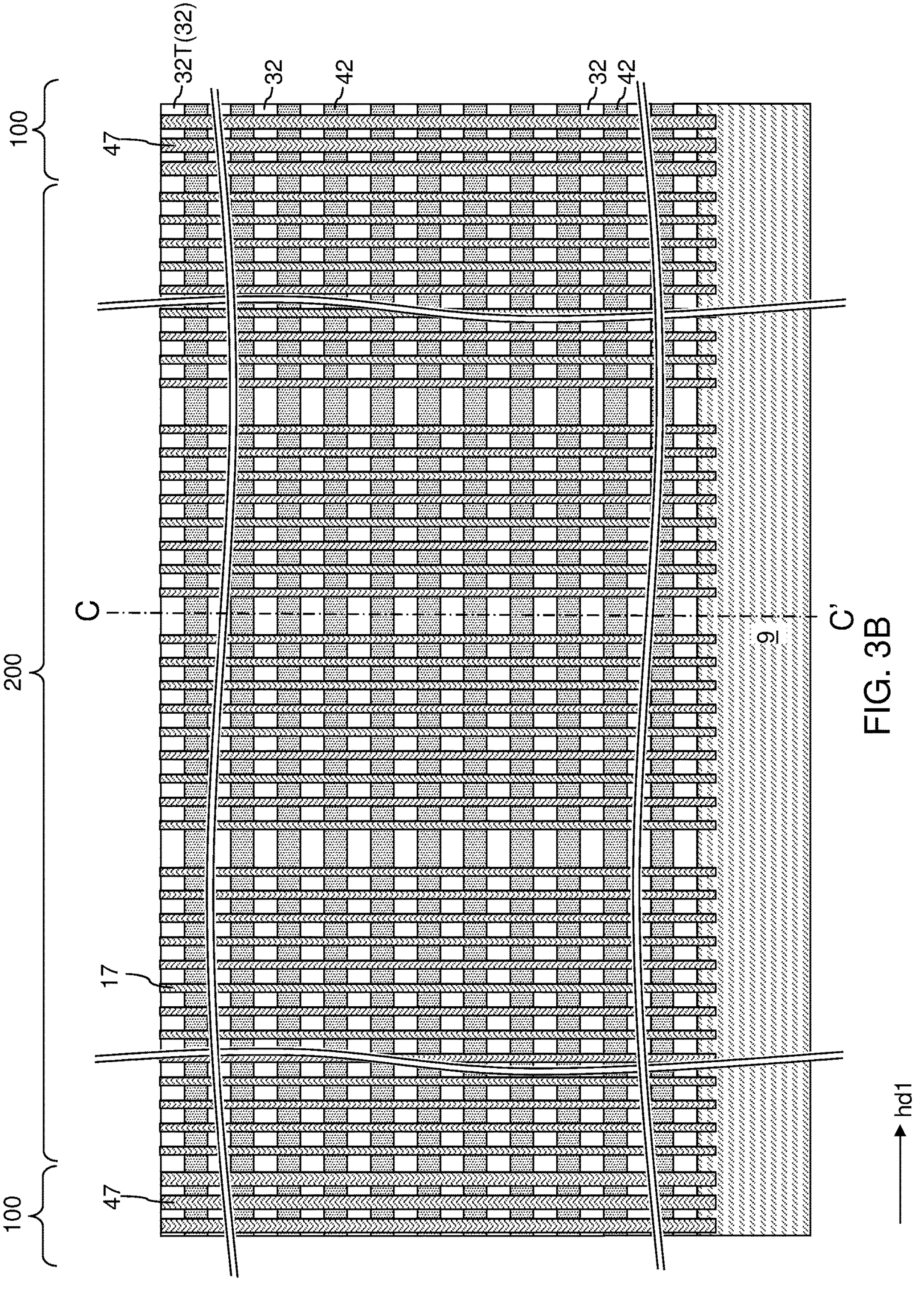
Figure 3C:
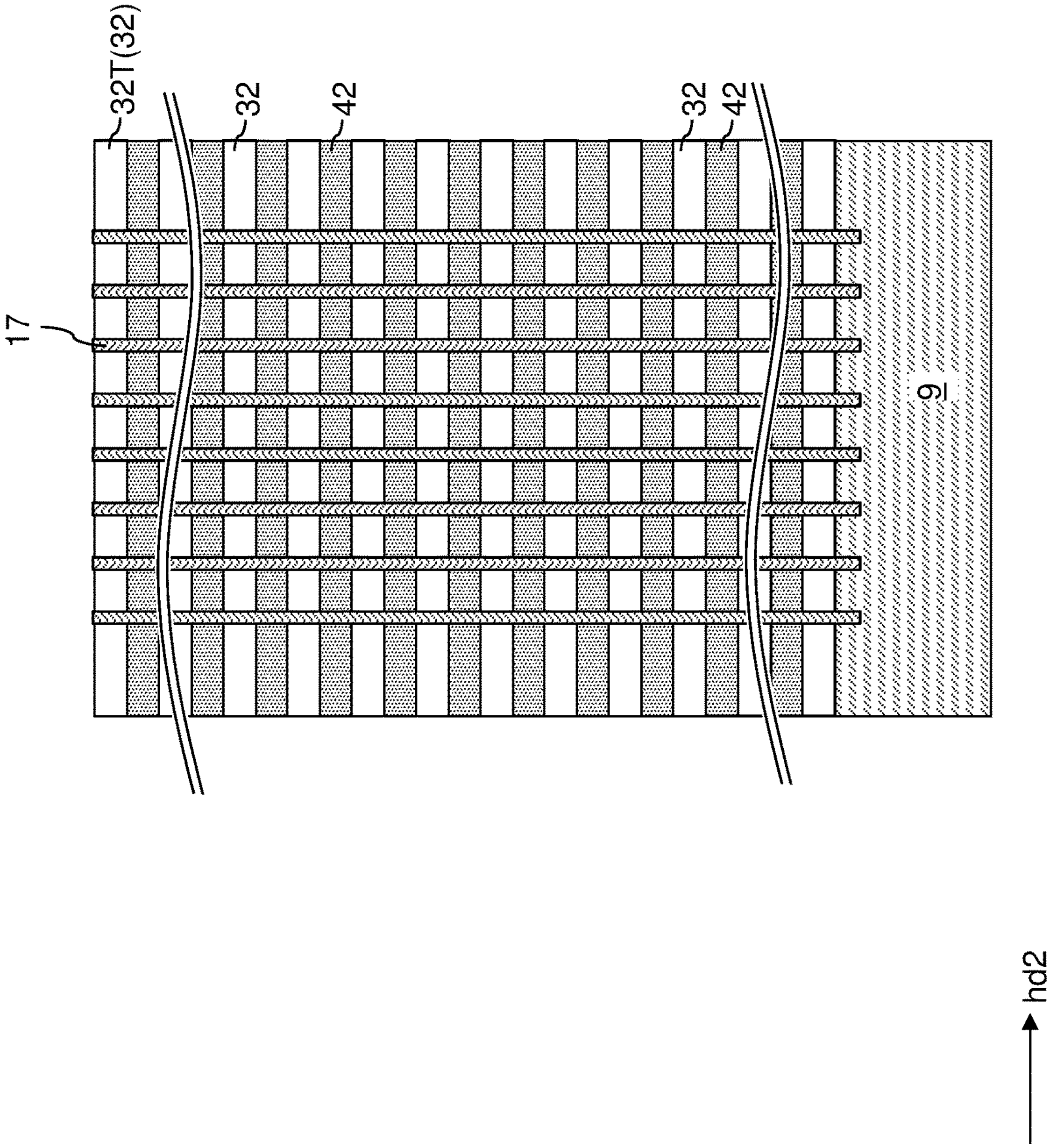

Referring to FIGS. 3A-3C, a sacrificial fill material such as amorphous carbon, diamond-like carbon, a polymer material, or organosilicate glass can be deposited in the memory openings 49 and the support openings 19. Excess portions of the sacrificial fill material can be removed from above the horizontal plane including the topmost insulating layer 32T by performing a planarization process, which may comprise a chemical mechanical polishing (CMP) process and/or a recess etch process. Each remaining portion of the sacrificial fill material filling a memory opening 49 constitutes a sacrificial memory opening fill structure 47. Each remaining portion of the sacrificial fill material filling a support opening 19 constitutes a sacrificial support opening fill structure 17.

Figure 4A:
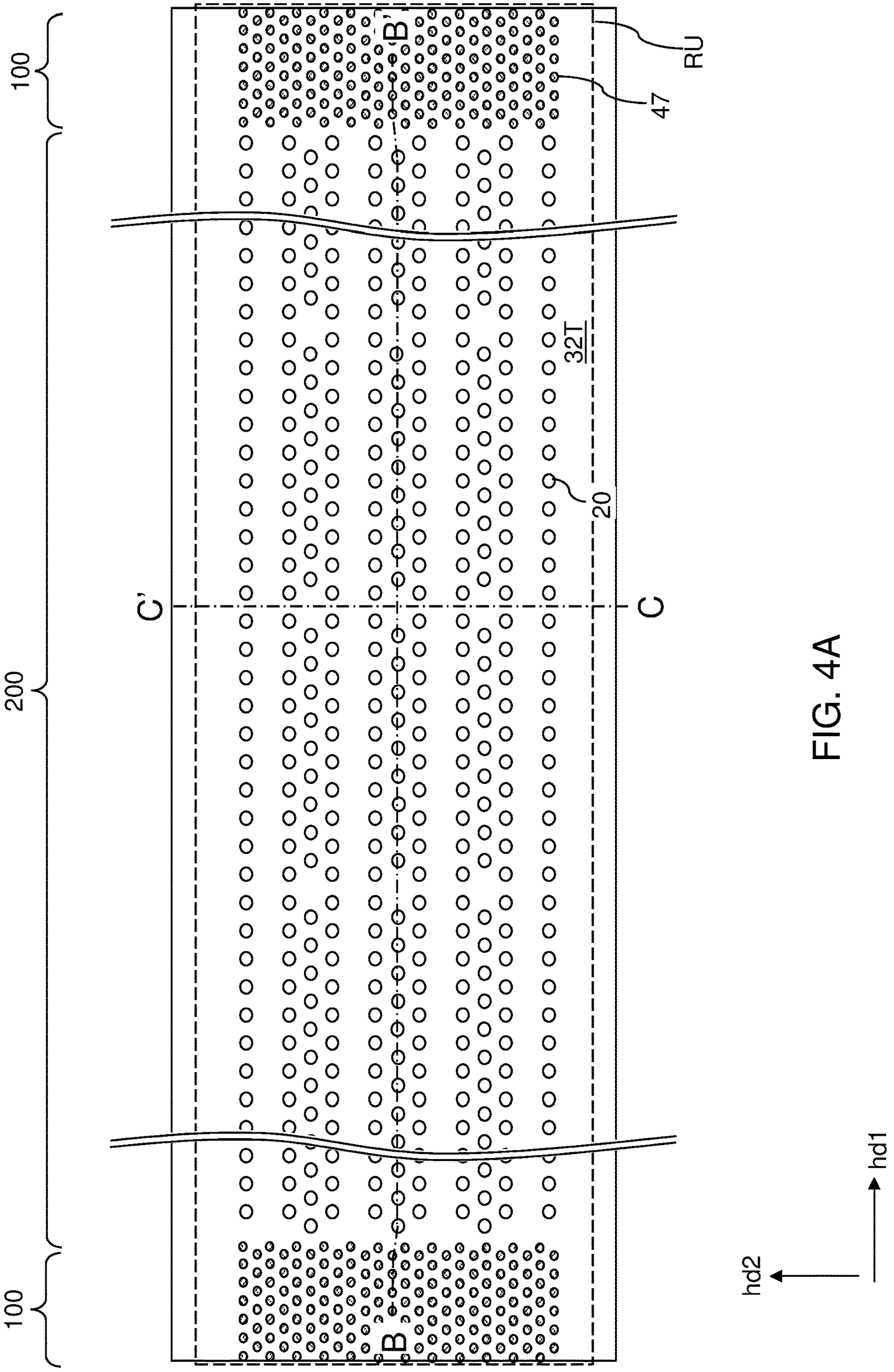
FIGS. 4A-4C are various views of the exemplary structure after replacement of sacrificial support opening fill structures with support pillar structures according to an embodiment of the present disclosure.
Figure 4B:
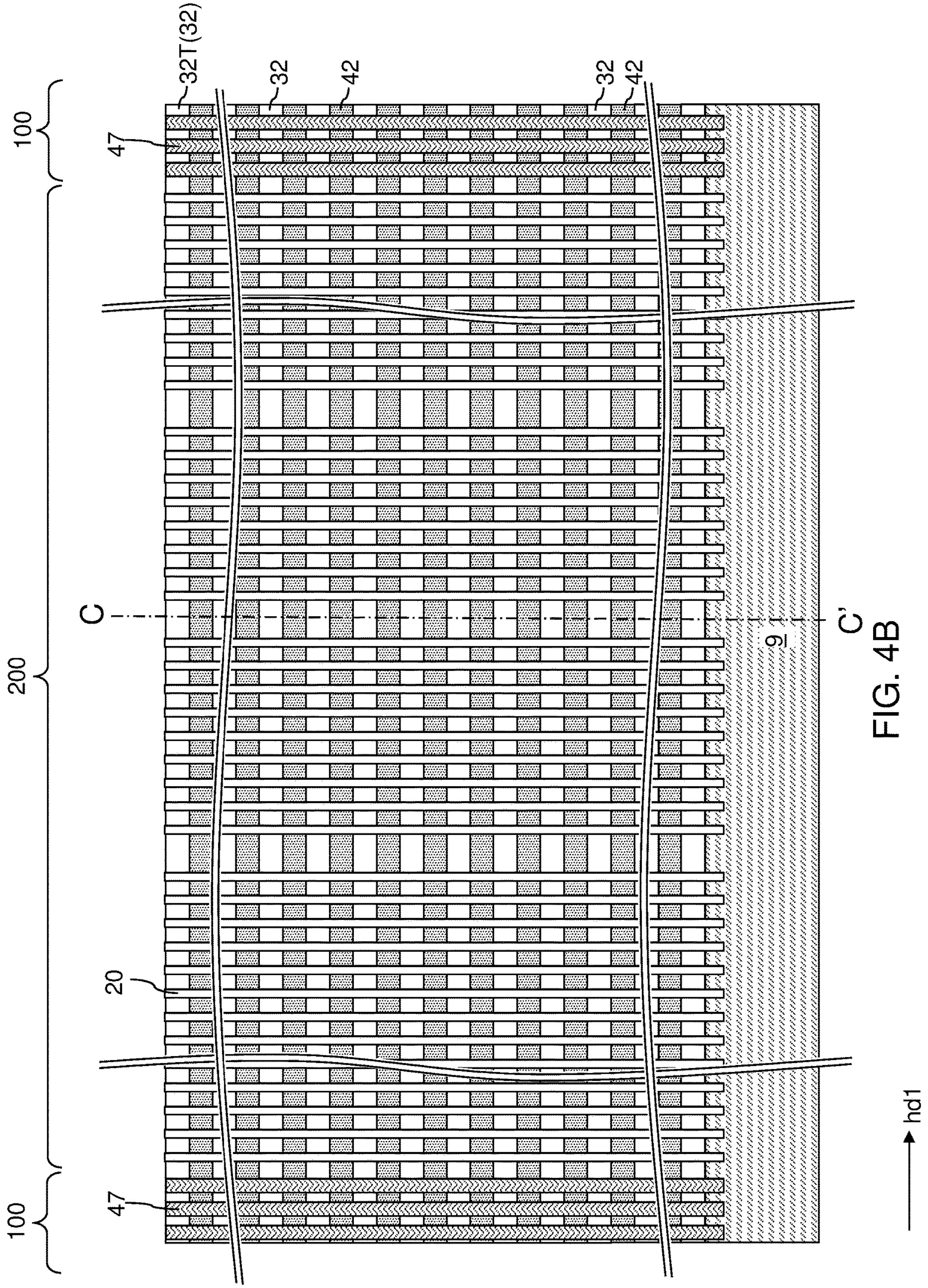
Figure 4C:
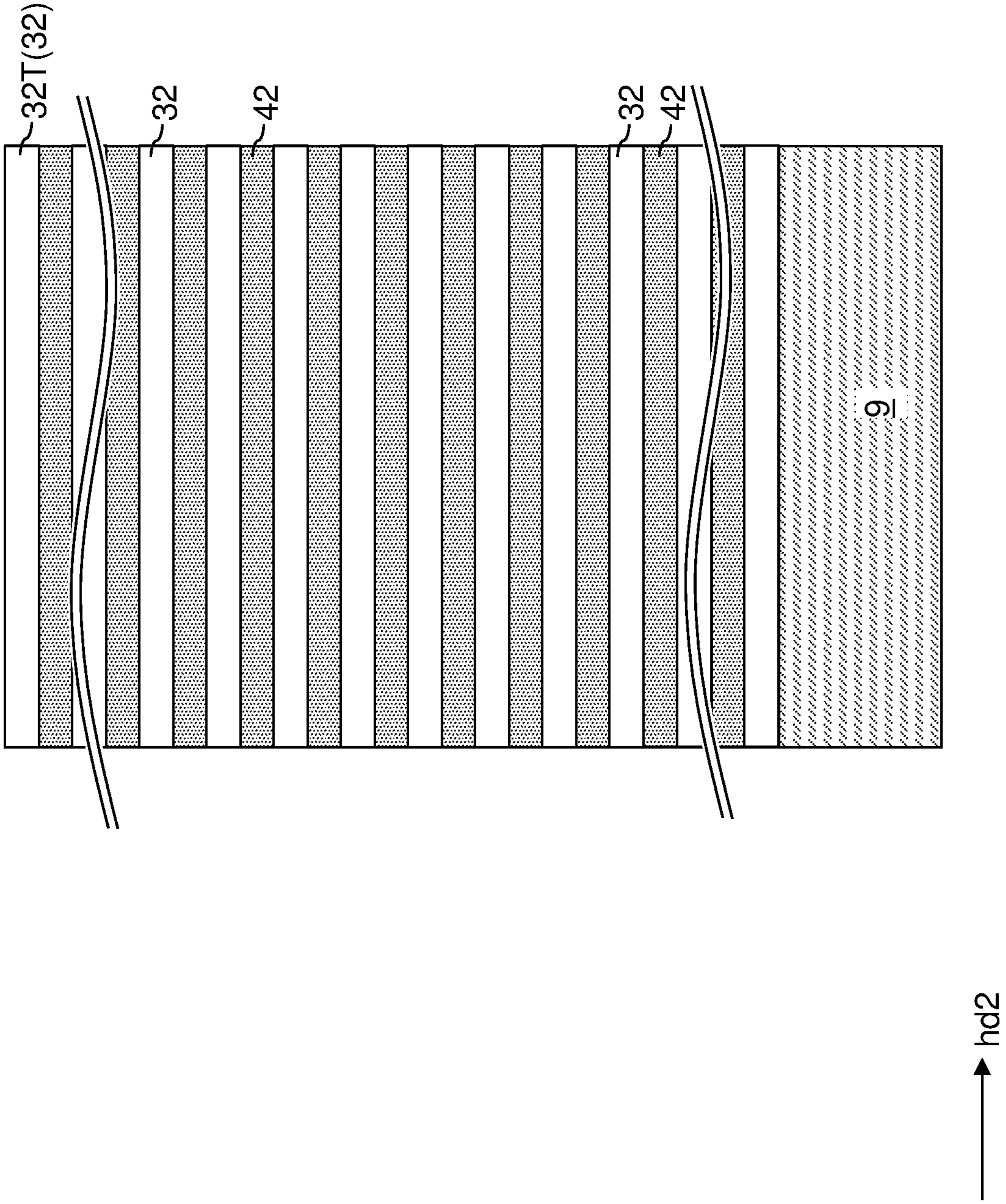

Referring to FIGS. 4A-4C, a photoresist layer (not shown) can be applied over the exemplary structure, and can be lithographically patterned to cover the memory array regions 100 without covering the contact region 200. A selective removal process can be performed to remove the sacrificial support opening fill structures 17 selective to the materials of the alternating stack (32, 42) and the semiconductor material layer 9. The selective removal process may comprise an ashing process or a selective wet etch process. Voids are formed in the volumes of support openings 19. The photoresist layer may be partly removed during removal of the sacrificial support opening fill structures 17. The photoresist layer may be completely removed after removal of the sacrificial support opening fill structures 17.

A dielectric fill material, such as silicon oxide, can be deposited in the voids of the support openings 19. Excess portions of the dielectric fill material can be removed from above the horizontal plane including the top surface of the topmost insulating layers 32T by performing a planarization process, which may comprise a chemical mechanical polishing process and/or a recess etch process. The sacrificial cover liner may be collaterally removed during the planarization process. Each remaining portion of the dielectric fill material that fills a respective one of the support openings 19 constitutes a support pillar structure 20.

Figure 5A:
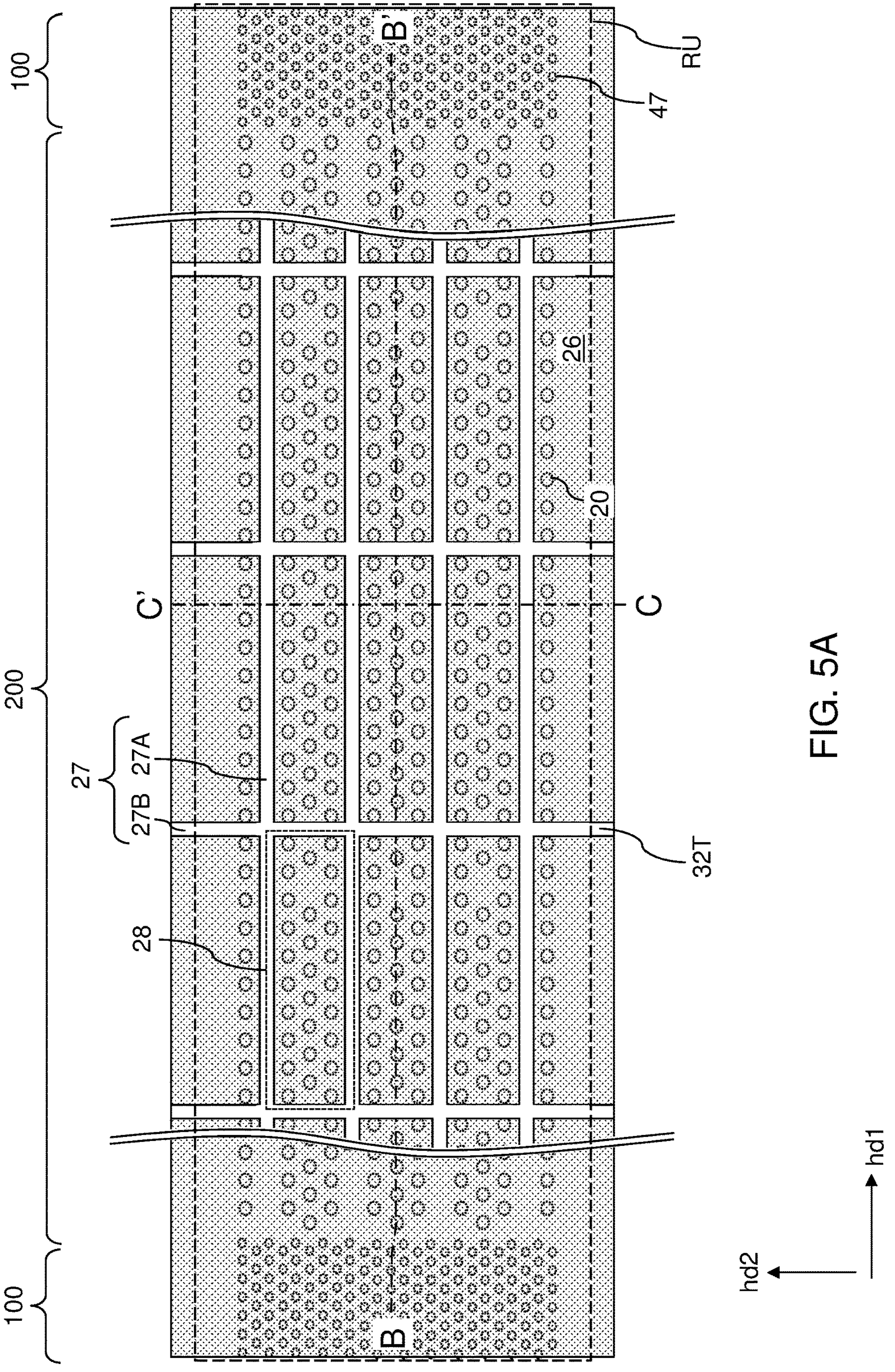
FIGS. 5A-5C are various views of the exemplary structure after formation of a patterned hard mask layer according to an embodiment of the present disclosure.
Figure 5B:
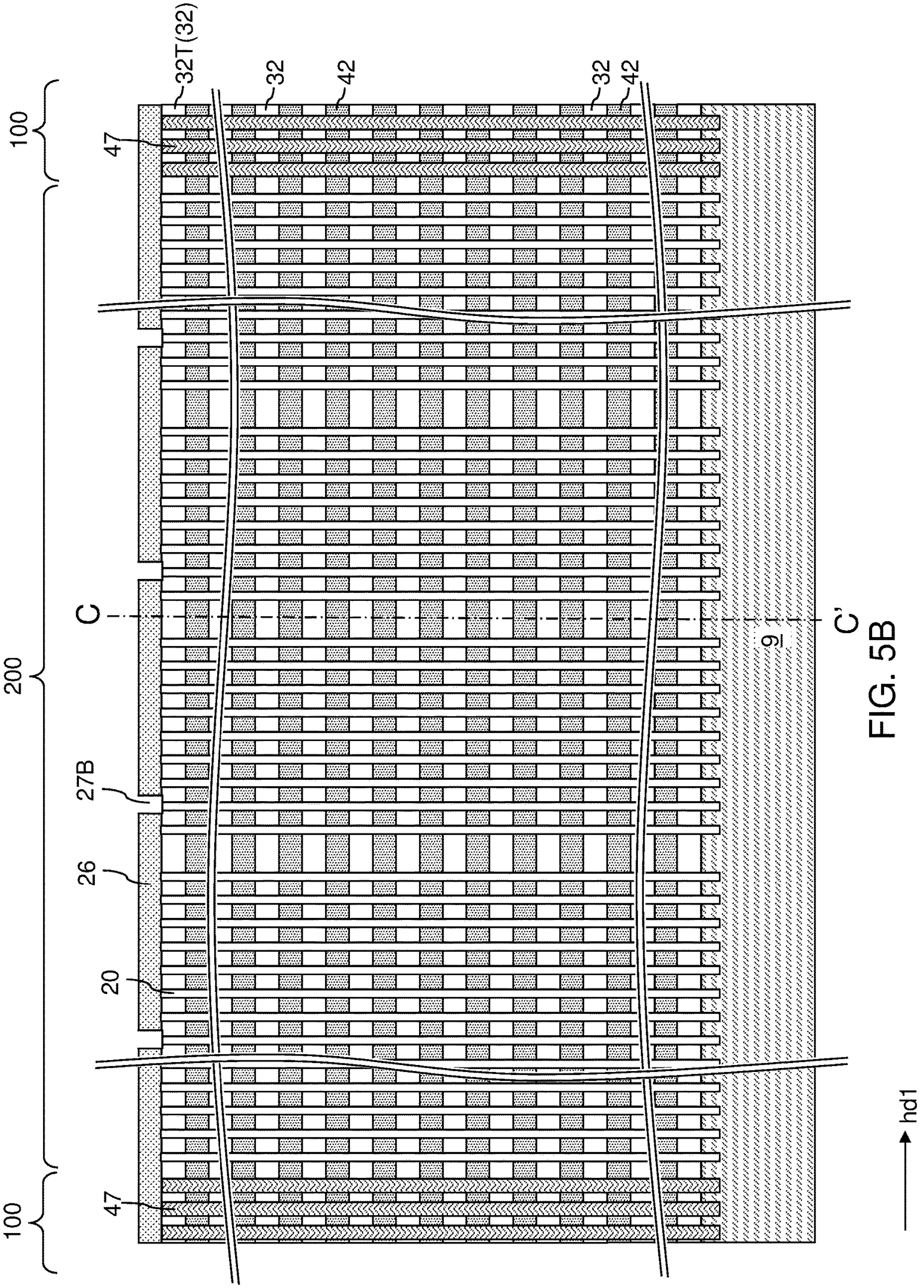
Figure 5C:
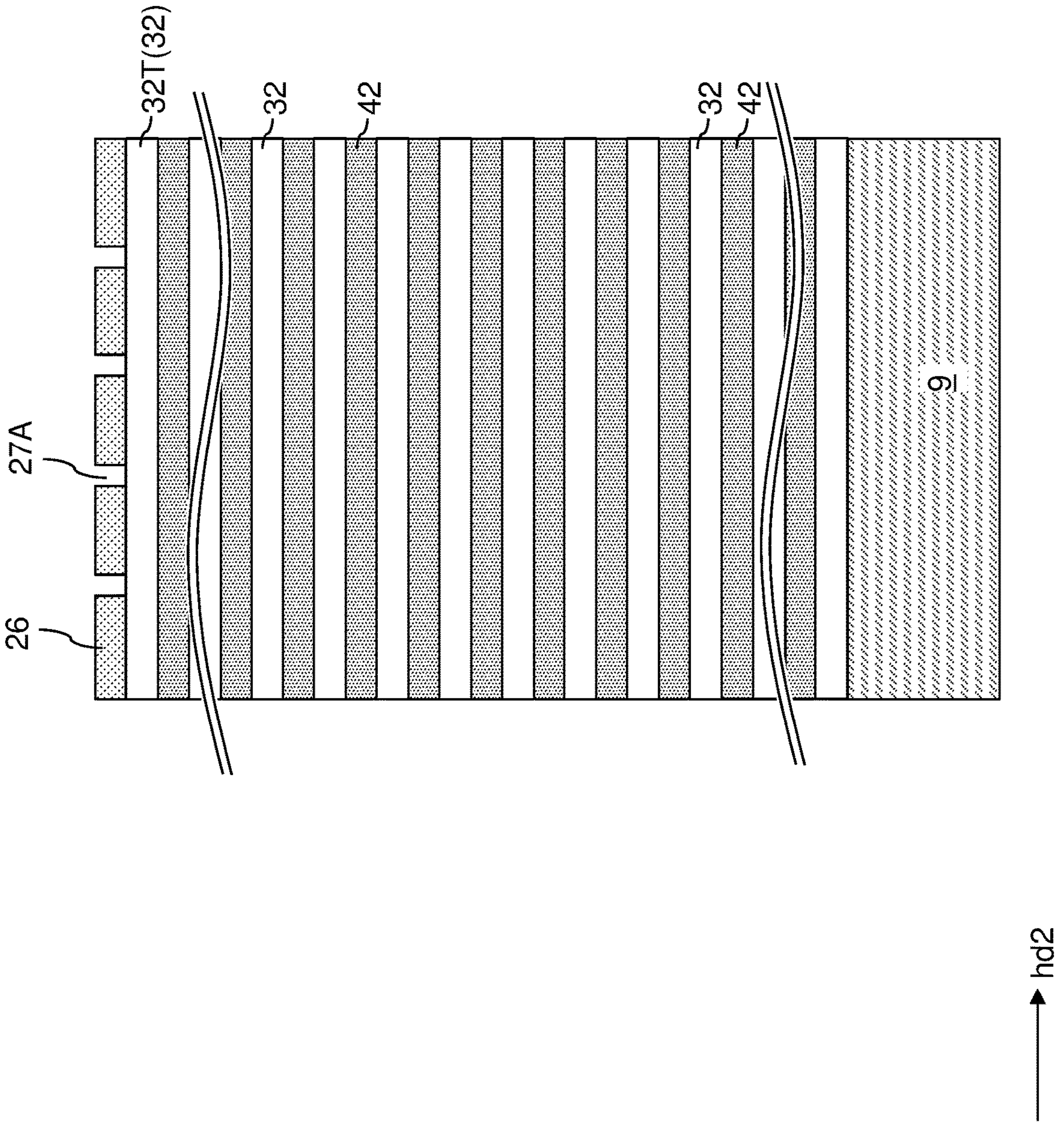

Referring to FIGS. 5A-5C, a hard mask layer can be deposited over the top surface of the topmost insulating layer 32T, and can be lithographically patterned with a pattern of grid-shaped openings 27 to form a patterned hard mask layer 26. The patterned hard mask layer 26 comprises a material that can be employed as an etch mask for etching the materials of the insulating layers 32 and the sacrificial material layers 42. For example, the patterned hard mask layer 26 may comprise silicon carbide, silicon oxycarbide, amorphous carbon, or a conductive material (such as TiN or a metal). The thickness of the patterned hard mask layer 26 may be in a range from 50 nm to 500 nm, although lesser and greater thicknesses may also be employed. The pattern of the grid-shaped openings 27 can be formed entirely in the contact region 200. In one embodiment, the pattern of the grid-shaped openings 27 may comprise first laterally-extending openings 27A that laterally extend along the first horizontal direction hd1, and second laterally-extending openings 27B that laterally extend along the second horizontal direction hd2. The first laterally-extending openings 27A and the second laterally-extending openings 27B may intersect, such that a rectangular lattice pattern of openings is formed within each repetition unit RU.

In one embodiment, a pattern of two-dimensional array of rectangular compartments 28 can be formed within each repetition unit RU. In one embodiment, each repetition unit RU may comprise, within a respective portion of the contact region 200, (M+1) first laterally-extending openings 27A that laterally extend along the first horizontal direction hd1, and (N+1) second laterally-extending openings 27B that laterally extend along the second horizontal direction hd2. M is an integer greater than 1, and N is an integer in a range from $2^4$ to $2^{10}$, and may be an integer in a range from $2^5$ to $2^8$. In one embodiment, the (M+1) first laterally-extending openings 27A in the patterned hard mask layer 26 within each repetition unit RU may be arranged as a first periodic one-dimensional array having a first uniform pitch, and the (N+1) second laterally-extending openings 27B in the patterned hard mask layer 26 within each repetition unit RU may be arranged as a second periodic one-dimensional array having a second uniform pitch.

Figure 6A:
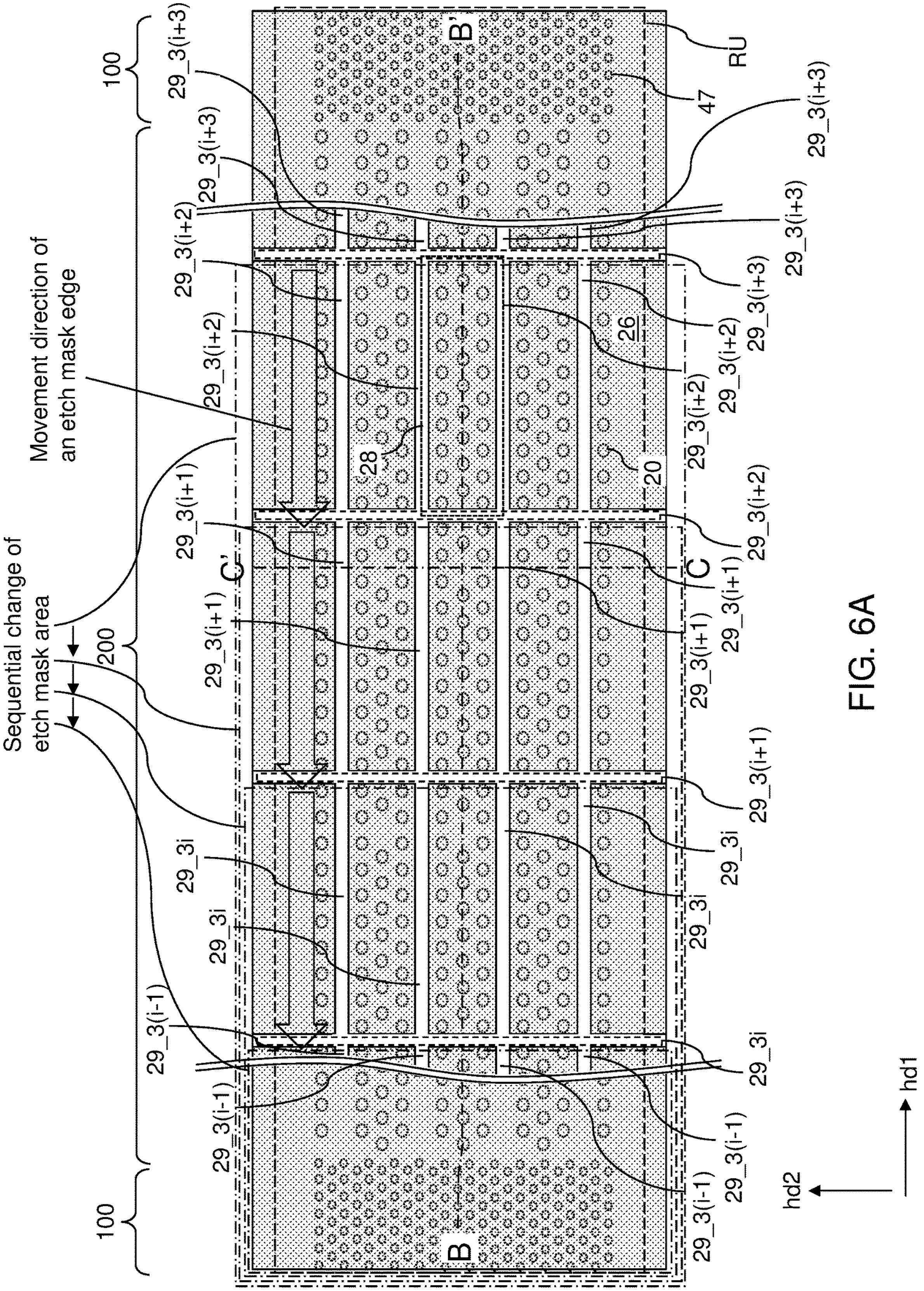
FIGS. 6A-6C are various views of the exemplary structure after formation of isolation trenches according to an embodiment of the present disclosure.
Figure 6B:
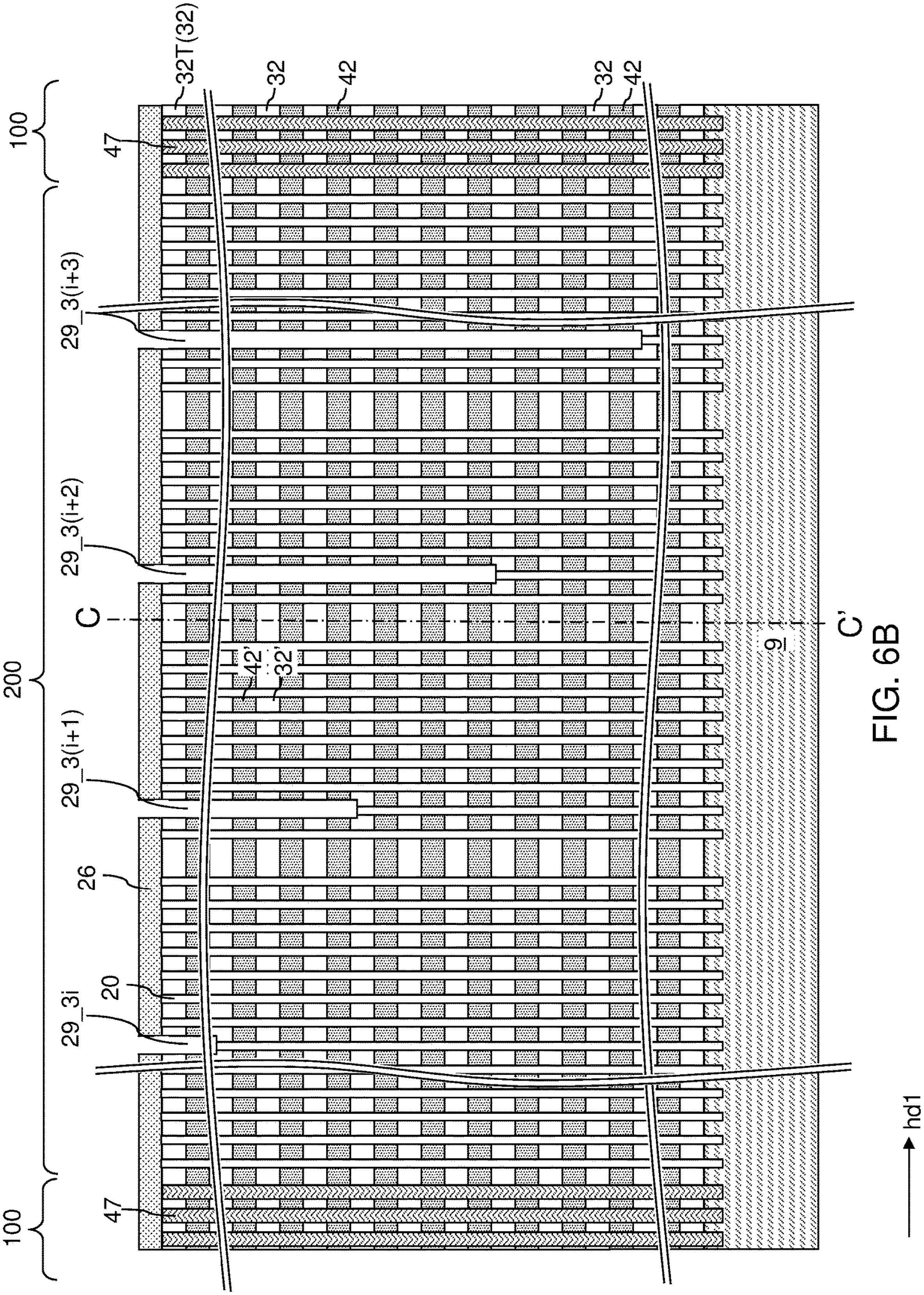
Figure 6C:
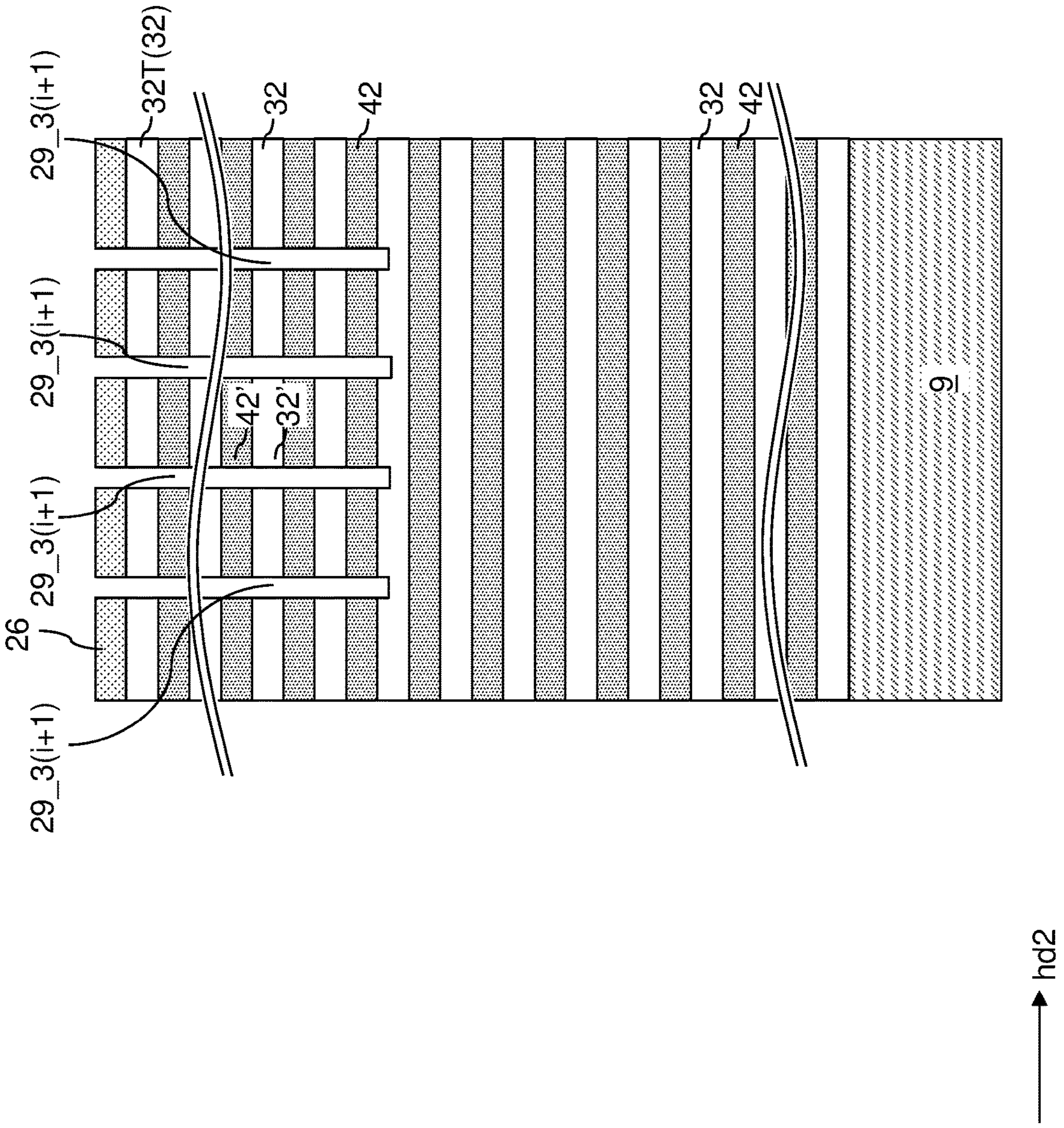

Referring to FIGS. 6A-6C, multiple patterning sequences can be performed to transfer the pattern of the laterally-extending openings in the patterned hard mask layer 26 into underlying portions of the alternating stack (32, 42) by different depths. Each of the multiple patterning sequences comprises a respective etch mask patterning step and a respective anisotropic etch step. Each etch mask patterning step provide a patterned etch mask (not illustrated), such as a patterned photoresist layer, over the patterned hard mask layer 26 such that a selected portion of the laterally-extending openings 27 in the patterned hard mask layer 26 is not covered by the patterned etch mask while the remainder of the laterally-extending openings 27 in the patterned hard mask layer 26 is covered by the patterned etch mask. Each anisotropic etch step etches a respective number of pairs of an insulating layer 32 and a sacrificial material layer 42 underneath the areas of the laterally-extending openings 27 in the patterned hard mask layer 26 that are not covered by the patterned etch mask while the combination of the patterned etch mask and the patterned hard mask layer 26 define a protected area of the alternating stack that is not etched.

Various isolation trenches 29 having different depths are formed underneath the laterally-extending openings in the patterned hard mask layer 26. Generally, any masking scheme may be employed to provide different depths for the isolation trenches 29 that are formed underneath the laterally-extending openings 27 in the patterned hard mask layer 26. The number of pairs of an insulating layer 32 and a sacrificial material layer 42 through which each isolation trench 29 vertically extends may vary from laterally-extending segment to laterally-extending segment for the various portions of the isolation trenches 29.

In one embodiment, each of the insulating layers 32 may have a same thickness which is herein referred to as a first thickness, and each of the sacrificial material layers 42 may have another same thickness which is herein referred to as a second thickness. In this case, each pair of an insulating layer 32 and a sacrificial material layer 42 in contact with each other may have a same thickness, which is herein referred to as a unit vertical distance. The unit vertical distance equals the sum of the first thickness and the second thickness.

In the accompanying drawings, each isolation trench 29 having a respective uniform depth is represented by a reference numeral 29_+, in which the reference numeral suffix "+" represents the total number of pairs of an insulating layer 32 and a sacrificial material layer 42 through which the isolation trench 29 vertically extends. For example, an isolation trench labeled with "29_3*i*" represents an isolation trench that vertically extends through 3*i* pairs of an insulating layer 32 and a sacrificial material layer 42 in which i is a positive integer. Any isolation trench having two or more different depths, and thus, is formed by adjoining two or more isolation trenches 29_+ having depths that are different from each other, is herein referred to an isolation trench 29_#. Multiple isolation trenches having two or more different depths are referred to as isolation trenches 29_#. The set of all isolation trenches 29_+ is herein referred to as all isolation trenches 29_*. Thus, the symbol "+" after "29_" represents any single positive integer representing the ratio of a depth of an isolation trench 29 to the unit vertical distance; the symbol "#" after "29_" represents a set of two or more positive integers representing the ratios of depths of multiple isolation trenches 29 to the unit vertical distance, and the symbol "*" after "29_" represents the set of all positive integers representing the ratios of depths of multiple isolation trenches 29 to the unit vertical distance and present in the exemplary structure.

In one embodiment, a set of (M+1) first isolation trenches 29_# can be formed underneath the first laterally-extending openings 27A in the patterned hard mask layer 26 within each repetition unit RU, and a set of (N+1) second isolation trenches 29_+ can be formed underneath the second laterally-extending openings 27B in the patterned hard mask layer 26. Each of the (M+1) first isolation trenches 29_# comprises multiple segments having different depths. In other words, each of the (M+1) first isolation trenches 29_# may be a union of a set of isolation trenches 29_+ having a depth and aligned along the first horizontal direction hd2 (and thus, underlies a same first laterally-extending opening 27A in the patterned hard mask layer 26). In one embodiment, the set of (M+1) first isolation trenches 29_# may be formed entirely within the area of the repetition unit RU, and each of the (M+1) first isolation trenches 29_# may be laterally spaced from the boundary of the repetition unit RU.

In one embodiment, the set of (N+1) second isolation trenches 29_+ may laterally extend along the second horizontal direction hd2 through each of the repetition units RU.

Generally, the depths of the second isolation trenches 29_+ that are parallel to the second horizontal direction hd2 can increase along the first horizontal direction hd1. As discussed above, M may be any positive integer greater than 1. In one embodiment, the increment in the depth for any second isolation trench 29_+ relative to a neighboring second isolation trench 29_+ having a lesser depth may be an M times the unit vertical distance. Generally, the depths of the second isolation trenches 29_# may stepwise increase along the first horizontal direction hd1 such that an increment in the depth of a deeper second isolation trench 29_+ relative to the depth of a shallower second isolation trench 29_+ for each neighboring pair of second isolation trenches 29_+ is M times the unit vertical distance, i.e., M times the sum of the first thickness of each insulating layer 32 and the second thickness of each sacrificial material layer 42.

In one embodiment, the depth of each segment of a first isolation trenches 29_# that laterally extends between a respective neighboring pair of a second isolation trench 29_+ and an additional second isolation trench 29_+ may be the same as the lesser of the depth of the second isolation trench 29_+ and the additional second isolation trench 29_+. Thus, each first isolation trench 29_# may have a plurality of laterally-extending segments having different depths such that each neighboring pair of laterally-extending segments differ in depth by M times the sum of the first thickness of each insulating layer 32 and the second thickness of each sacrificial material layer 42.

In the illustrated example shown in FIGS. 6A-6C, Mis 3. Thus, each neighboring pair of second isolation trenches 29_+ may differ in depth by 3 times the sum of the first thickness of each insulating layer 32 and the second thickness of each sacrificial material layer 42. The illustrated portion of the exemplary structure shows an (i−1)-th second isolation trench 29_3 (i−1) having the depth of 3 times (i−1) times the unit vertical distance, an i-th second isolation trench **29_3*i* having the depth of 3 times i times the unit vertical distance, an (i+1)-th second isolation trench 29_3 (i+1) having the depth of 3 times (i+1) times the unit vertical distance, and an (i+2)-th second isolation trench 29_3 (i+2) having the depth of 3 times (i+2) times the unit vertical distance. Each of the first isolation trenches 29_# may be union of multiple isolation trenches 29_+ that laterally extends along the first horizontal direction hd1. In this case, each segment of a first isolation trench 29_# that laterally extends between a neighboring pair of first isolation trenches 29_+ is an isolation trench 29_+. Within the illustrated region of the exemplary structure, each of the first isolation trenches 29_# includes an isolation trench having the depth of 3 times (i−1) times the unit vertical distance, a first additional isolation trench 29_3*i* having the depth of 3 times i times the unit vertical distance, a second additional isolation trench 29_3 (i+1) having the depth of 3 times (i+1) times the unit vertical distance, and a third additional isolation trench 29_3** (i+2) having the depth of 3 times (i+2) times the unit vertical distance.

Any combination of masking schemes and etching schemes may be employed for the multiple patterning sequences to provide the network of all isolation trenches 29_* illustrated in FIGS. 6A-6C. In some embodiments, each anisotropic etch step may have a respective etch depth that is a respective integer multiple of M time the unit vertical distance, i.e., M times the sum of the first thickness of each insulating layer 32 and the second thickness of each sacrificial material layer 42. The integer within the respective integer multiple may be 1, 2, 3, 4, etc.

In the illustrated example shown in FIG. 6A, the edge of the patterned etch mask may shift from one direction to another along the direction of the arrows by a lateral distance of a periodicity of the second isolation trenches 29_+ along the first horizontal direction hd1, and the areas of the etch masks may shrink as illustrated in FIG. 6A. In this embodiment, one second laterally-extending opening 27B in the patterned hard mask layer 26 may be newly uncovered in each successive etch mask patterning step. In this case, a trimmable etch mask layer may be repeated employed through trimming as the multiple patterned etch masks for the various anisotropic etch processes.

Alternatively, various combinations of coverage and lack of coverage may be employed in combination with anisotropic etch processes providing different etch depths. In this case, the each anisotropic etch step may have a respective etch depth that is a respective integer multiple of M time the unit vertical distance, and the integers for the integer multiples may be non-negative integer powers of 2, i.e., 1, 2, $2^2$, $2^3$, $2^4$, $2^5$, $2^6$, $2^7$, etc.

Figure 7A:
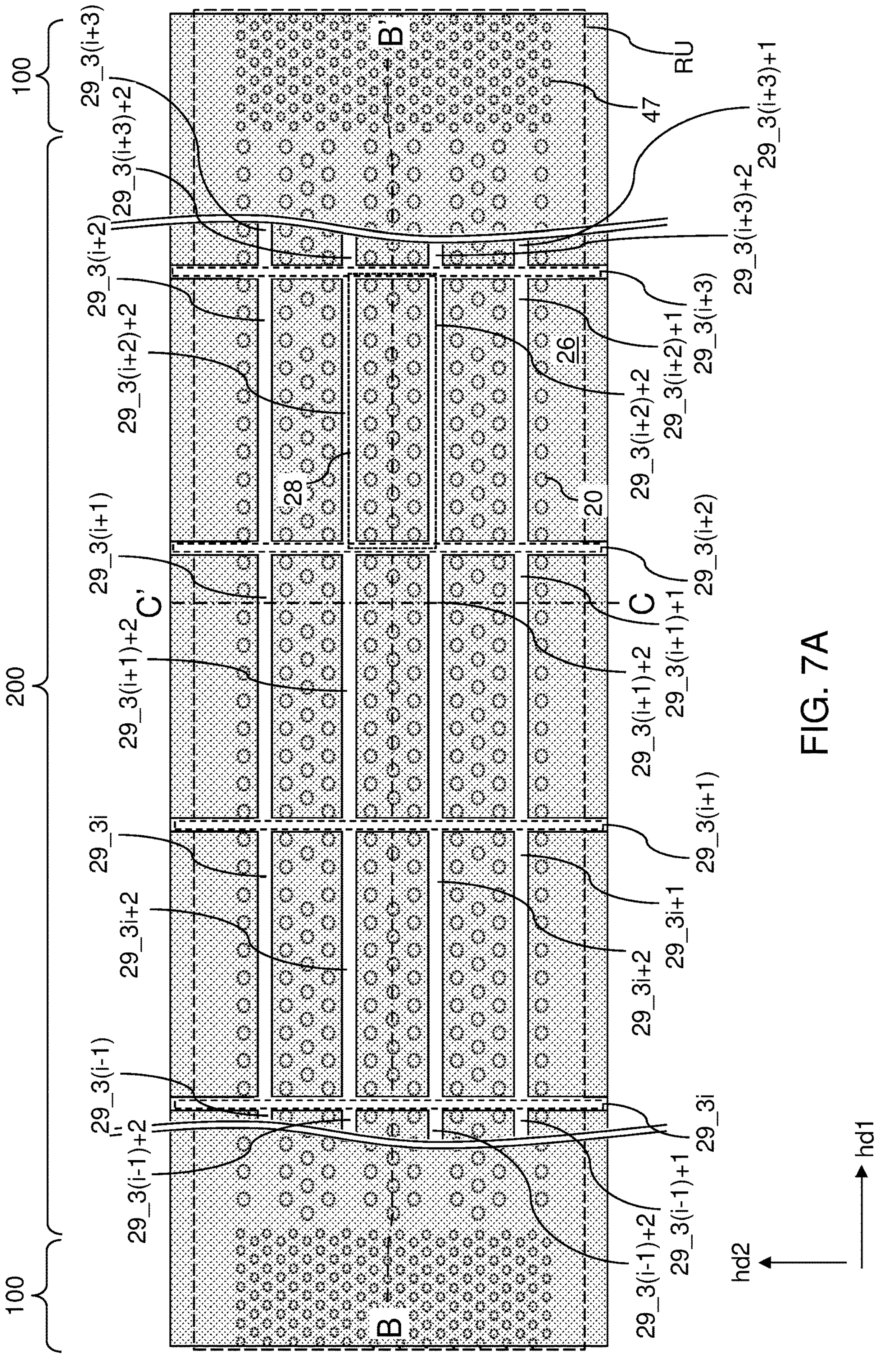
FIGS. 7A-7C are various views of the exemplary structure after selective vertical extension of second isolation trenches according to an embodiment of the present disclosure.
Figure 7B:
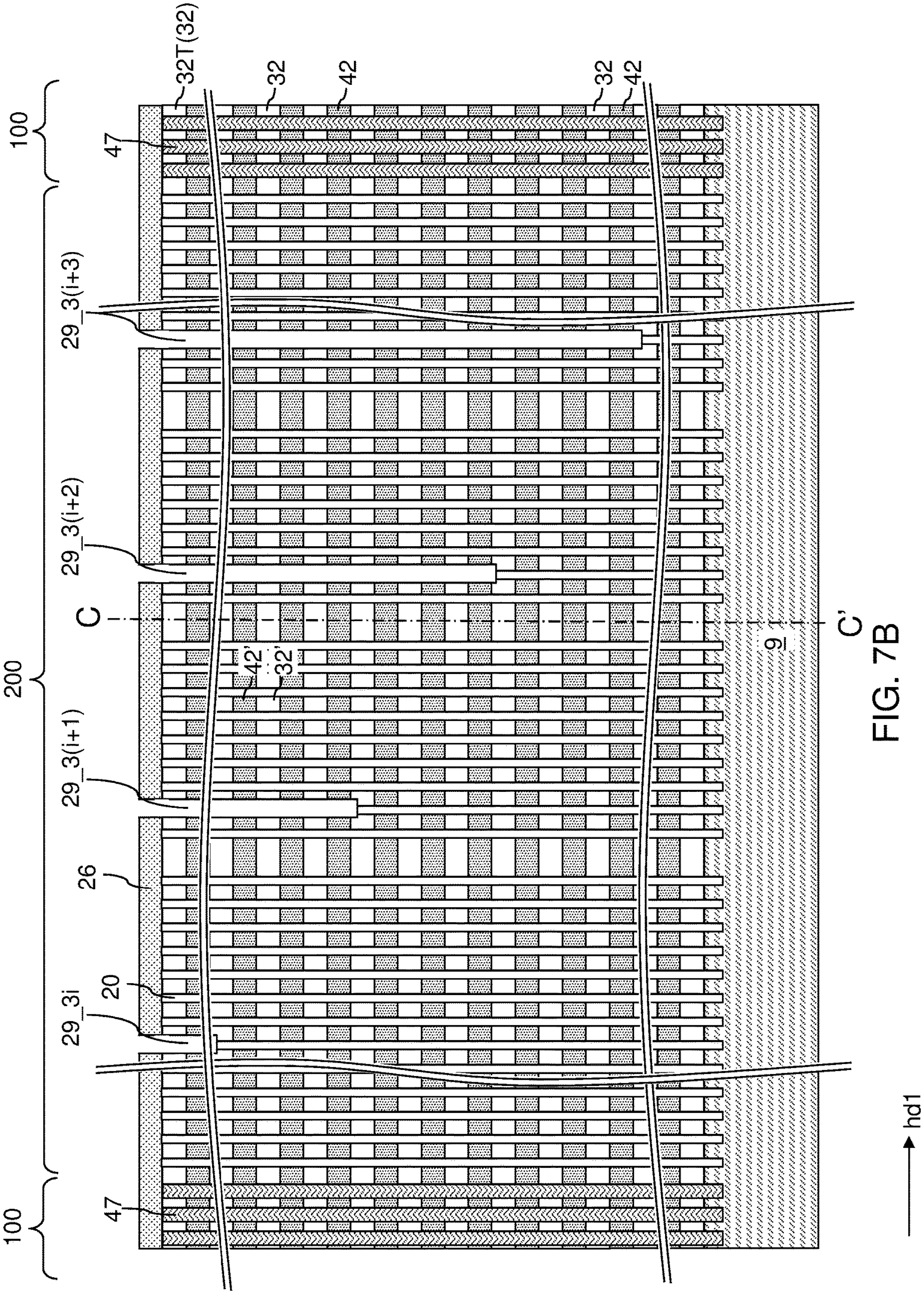
Figure 7C:
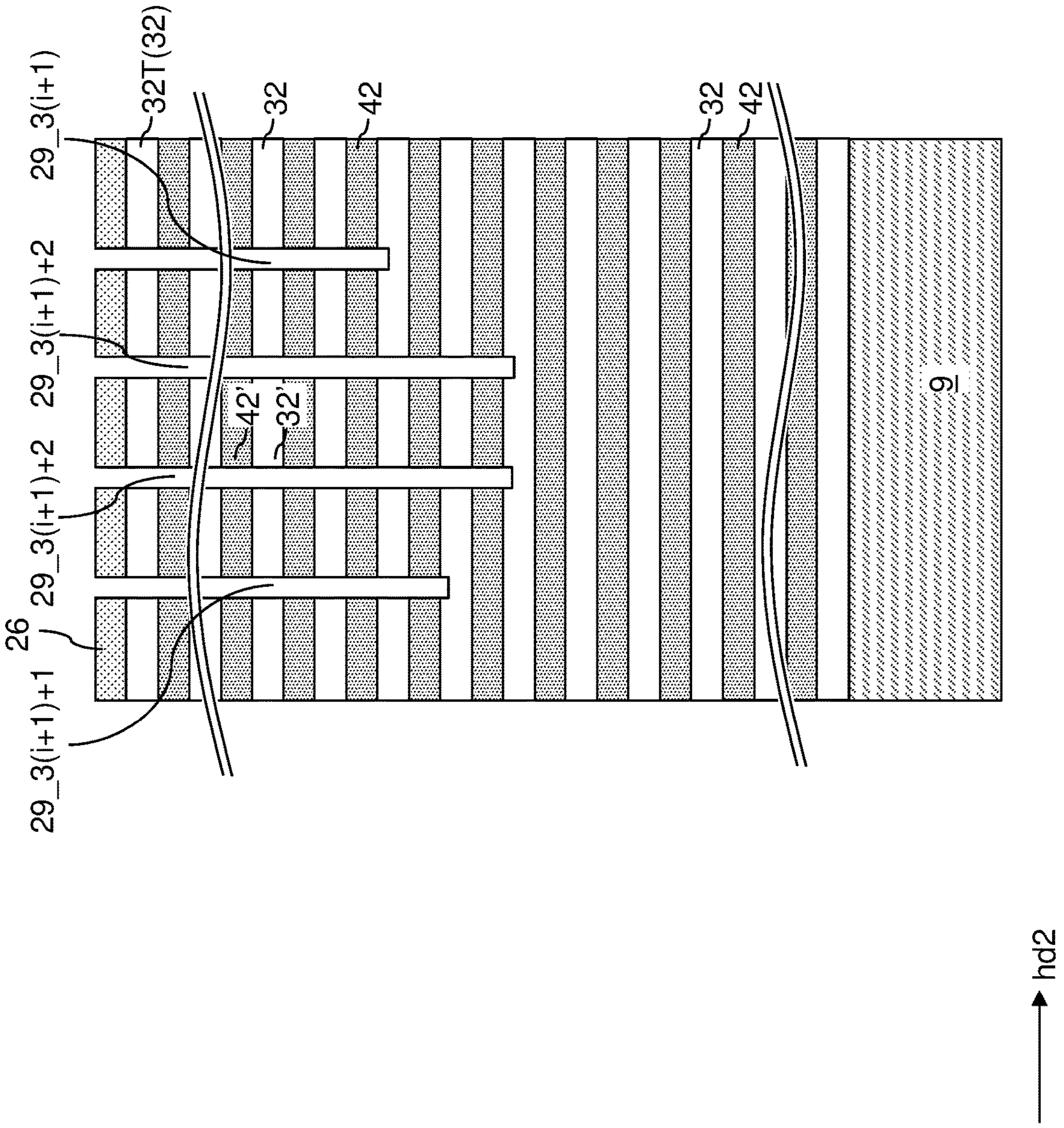

Yet alternatively, any other combination of masking schemes and anisotropic etch schemes may be employed to provide a network of isolation trenches 29_* described above. Referring to FIGS. 7A-7C, additional patterning sequences can be performed to selectively deepen a subset of the first isolation trenches 29_#. Each additional patterning sequence comprises a respective etch mask patterning step and a respective anisotropic etch step. Each etch mask patterning step provide a patterned etch mask (not illustrated), such as a patterned photoresist layer, over the patterned hard mask layer 26 only a selected subset of the first isolation trenches 29_# is not covered by the patterned etch mask while the remainder of the laterally-extending openings 27 in the patterned hard mask layer 26 is covered by the patterned etch mask. Each anisotropic etch step can vertically extend a respective subset of the first isolation trenches 29_# by a respective integer multiple of the unit vertical distance, i.e., by the respective integer multiple of the sum of the first thickness of each insulating layer 32 and the second thickness of each sacrificial material layer 42.

Generally, each first isolation trench 29_# that is laterally spaced from a most proximal laterally-extending boundary of the repetition units RU by at least another first isolation trench 29_# may be vertically extended. In one embodiment, each vertically extended first isolation trench 29_# may be vertically extended downward by a respective integer multiple of the unit vertical distance relative to the depth prior to vertical extension (i.e., relative to the depth immediately after the processing steps of FIGS. 6A-6C). In the illustrated example of FIGS. 7A-7C, a first isolation trench 29_# within each repetition unit RU may be vertically extended by the unit vertical distance, and another first isolation trench 29_# within each repetition unit RU may be vertically extended by twice the unit vertical distance.

The set of all isolation trenches 29_* defines a two-dimensional array of rectangular compartments 28. A used herein, a compartment 28 refers to a laterally bounded area within a lattice structure. A rectangular compartment 28 refers to a rectangular bounded area within a rectangular lattice structure. Within each rectangular compartment 28 that is laterally bounded by four isolation trenches 29_+, at least one pair of an insulating plate 32' and a dielectric material plate 42' can be formed, as shown in FIGS. 7B and 7C. Each insulating plate 32' is a patterned portion of a respective insulating layer 32, and has a respective horizontal cross-sectional shape. Each dielectric material plate 42' is a patterned portion of a respective sacrificial material layer 42, and has a respective horizontal cross-sectional shape.

In one embodiment, the depths of the second isolation trenches 29_# increase along the first horizontal direction hd1. In one embodiment, each of the second isolation trenches 29_# has a respective uniform depth. In one embodiment, a two-dimensional array of rectangular compartments 28 is provided within each repetition unit RU. The two-dimensional array of rectangular compartments 28 comprises an M×N rectangular array of rectangular compartments 28 in which M is an integer greater than 1, and N is an integer in a range from $2^4$ to $2^{10}$. Top surfaces of each vertically neighboring pair of insulating layers 32 in the alternating stack (32, 42) are vertically spaced from each other by the unit vertical distance. Top surfaces of each vertically neighboring pair of sacrificial material layers 42 in the alternating stack (32, 42) are vertically spaced from each other by the unit vertical distance.

In one embodiment, each neighboring pair of second isolation trenches 29_# may have a respective pair of bottom surfaces that are vertically offset from each other by a uniform vertical offset distance which is M times the unit vertical distance. In one embodiment, each of the first isolation trenches 29_# has a respective stepped bottom surface of which a height (as measured from the top surface of the substrate 8) decreases stepwise along the first horizontal direction hd1 by the uniform vertical offset distance at each location of the second isolation trenches 29_#. Thus, each of the first isolation trenches 29_# has a respective stepped bottom surface of which a depth (as measured from the horizontal plane including the top surface of the topmost insulating layer 32T) increases stepwise along the first horizontal direction hd1 by the uniform vertical offset distance at each location of the second isolation trenches 29_#. In one embodiment, within each vertical cross-sectional plane that contains the first isolation trenches 29_# and is perpendicular to the first horizontal direction hd1, bottom surfaces of at least one pair of the first isolation trenches 29_# of the first isolation trenches 29_# are vertically offset by a respective integer multiple of the unit vertical distance which is less than M times the unit vertical distance.

Figure 8A:
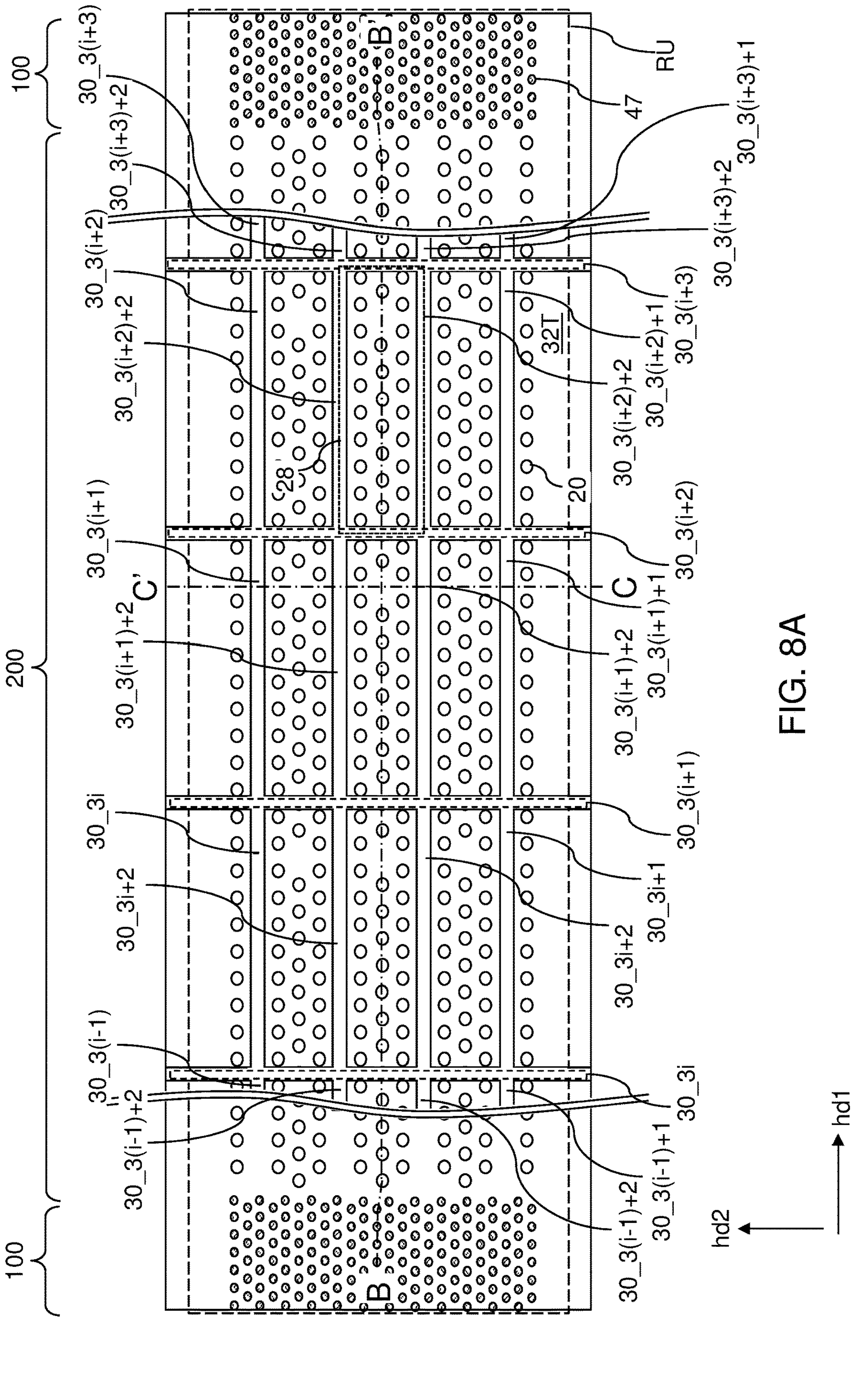
FIGS. 8A-8C are various views of the exemplary structure after formation of a dielectric grid structure according to an embodiment of the present disclosure.
Figure 8B:
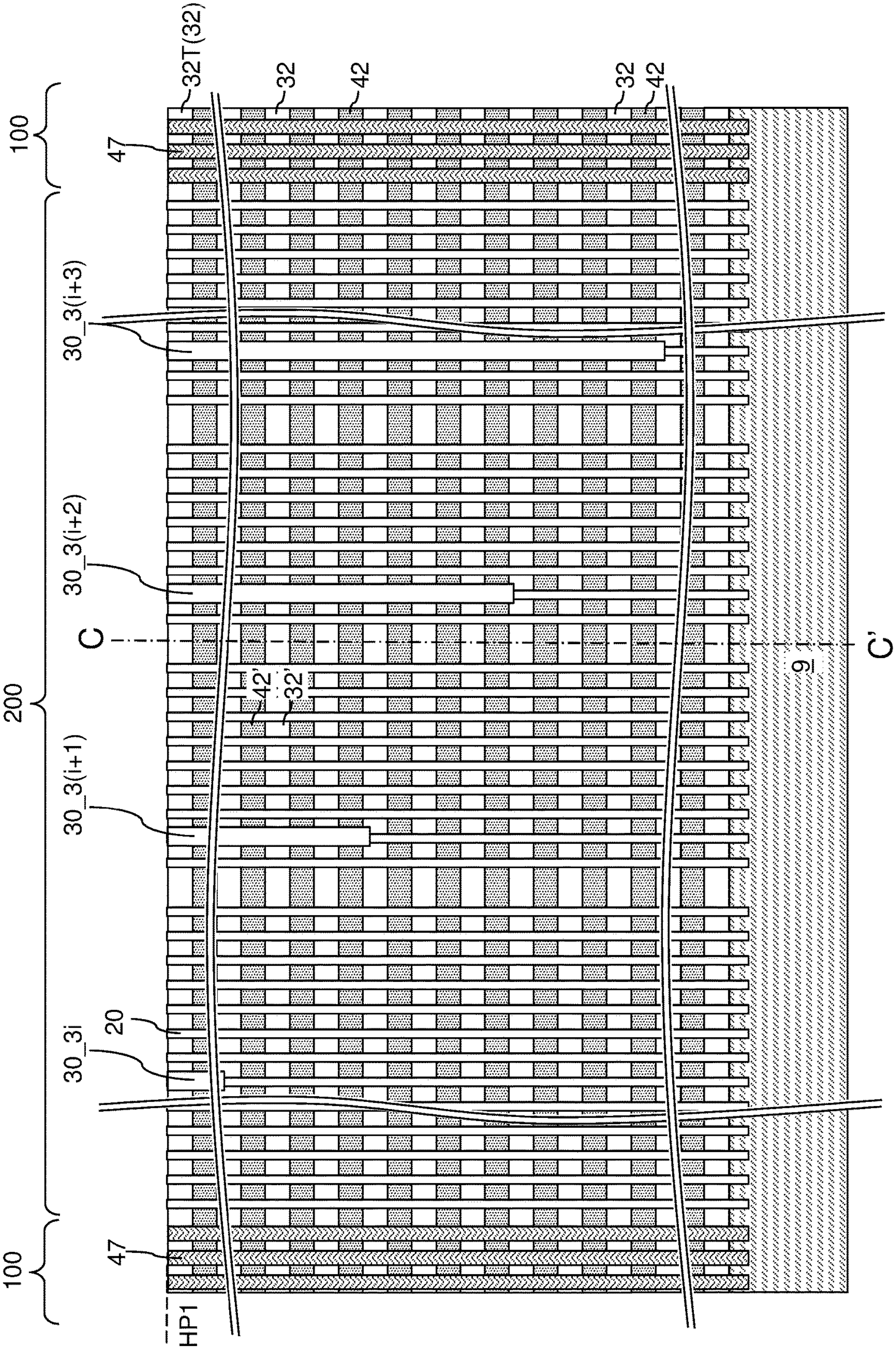
Figure 8C:
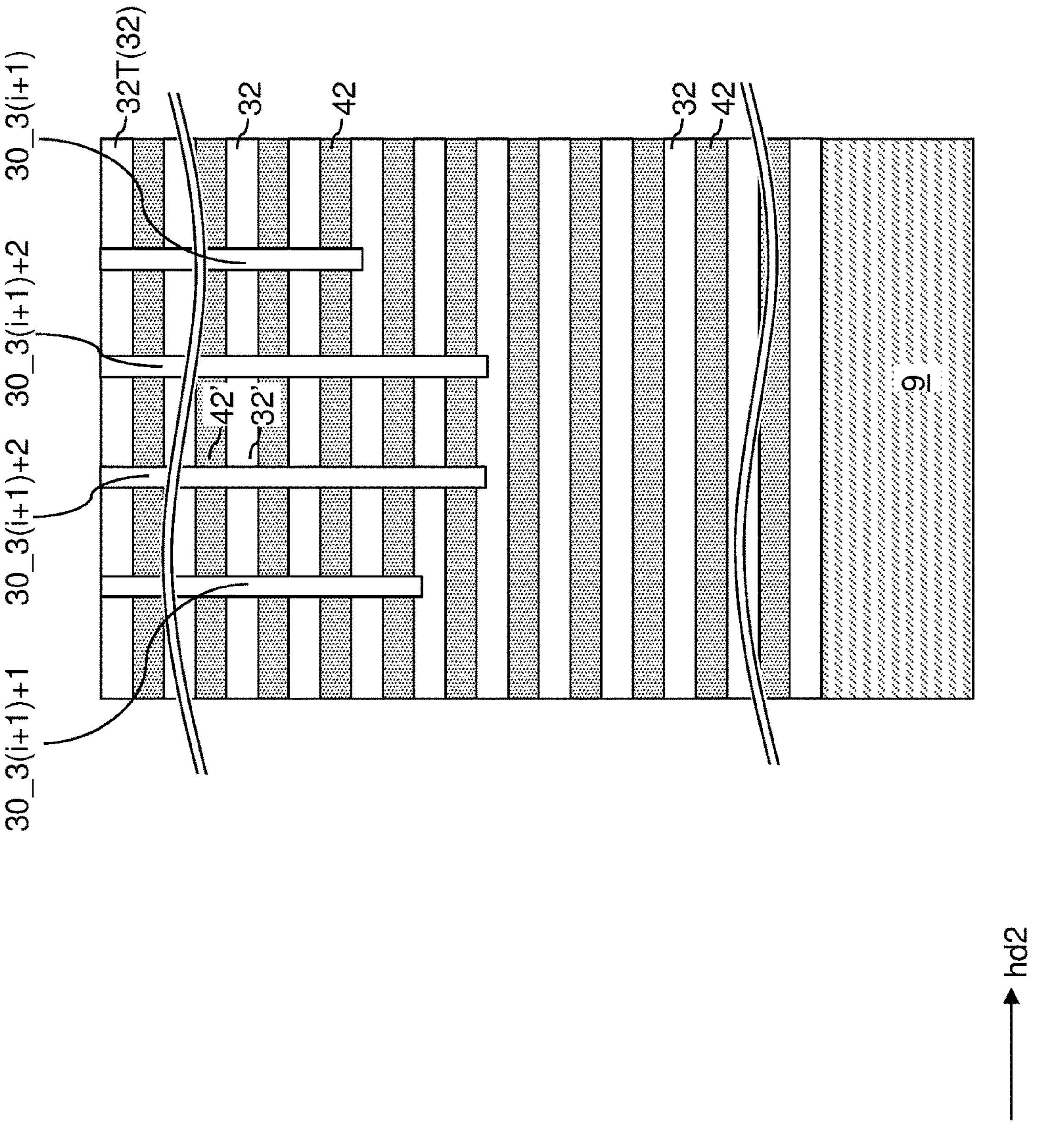

Referring to FIGS. 8A-8C, a suitable cleaning process may be performed to remove any residue of the etch mask materials. The patterned hard mask layer 26 may optionally be removed at this processing step using a selective etching process. A dielectric fill material, such as undoped silicate glass (i.e., silicon oxide) or a doped silicate glass may be deposited in the set of all isolation trenches 29_* by a conformal deposition process such as low pressure chemical vapor deposition. Excess portions of the dielectric fill material may be removed from above the topmost insulating layer 32T by performing a planarization process. The planarization process may comprise a chemical mechanical polishing process and/or a recess etch process. In one embodiment, the top surface of the remaining portion of the dielectric fill material that fills the set of all isolation trenches 29_* may be formed at or in proximity to the horizontal plane including the top surface of the topmost insulating layer 32T.

If the dielectric fill material is deposited over the patterned hard mask layer 26, the patterned hard mask layer 26 may be employed as a planarization stopping layer during planarization of the dielectric fill material. For example, the patterned hard mask layer 26 may be employed as a polish stop layer during a chemical mechanical polishing process or as an etch stop layer during a recess etch process that removes portions of the dielectric fill material from above the horizontal plane including the top surface of the topmost insulating layer 32T. Each remaining portion of the dielectric fill material that fills a respective single isolation trench 29_+ having a uniform depth constitutes a dielectric wall 30. Each dielectric wall 30 having a respective uniform depth is represented by a reference numeral 30_+, in which the reference numeral suffix "+" represents the total number of pairs of an insulating layer 32 and a sacrificial material layer 42 through which the dielectric wall 30_+ vertically extends. Each remaining portion of the dielectric fill material that fills two or more isolation trenches 29_# (or any isolation trench 29_# that includes two or more isolation trenches 29_+ having different depths) constitutes a dielectric wall 30_#. The remaining portion of the dielectric fill material that fills the set of all isolation trenches 29_* constitutes a dielectric grid structure 30_*. If the patterned hard mask layer 26 is present after formation of the dielectric grid structure 30_*, the patterned hard mask layer 26 can be removed selective to the dielectric grid structure 30_* and the topmost insulating layer 32T by performing a selective etch process without removing the dielectric grid structure 30_* or the topmost insulating layer 32T.

For example, a dielectric wall 30 labeled with "30_3*i*" represents a dielectric wall that vertically extends through 3*i* pairs of an insulating layer 32 and a sacrificial material layer 42 in which i is a positive integer. A dielectric wall 30 having two or more different depths, and thus, is formed by adjoining two or more dielectric walls 30_+ having depths that are different from each other, is herein referred to a dielectric wall 30_#. Multiple dielectric walls having two or more different depths are referred to as dielectric walls 30_#. The set of all dielectric walls 30_+ is herein referred to as all dielectric walls 30_*, which is the same as the dielectric grid structure 30_* Thus, the symbol + after "30_" represents any single positive integer representing the ratio of a height (i.e., a vertical dimension) of a dielectric wall to the unit vertical distance; the symbol # after "30_" represents a set of two or more positive integers representing the ratios of heights of multiple dielectric walls 30 to the unit vertical distance, and the symbol * after "30" represents the set of all positive integers representing the ratios of heights of multiple dielectric walls 30 to the unit vertical distance and present in the exemplary structure.

In summary, the first isolation trenches 29_# and the second isolation trenches 29_# can be filled with at least one dielectric fill material. First dielectric walls 30_# can be formed in the first isolation trenches 29_#, and second dielectric walls 30_# can be formed in the second isolation trenches 29_#. A dielectric grid structure 30_* can be formed in the alternating stack (32, 42). The dielectric grid structure 30_* includes a two-dimensional array of rectangular compartments 28 that is defined by an interwoven assembly of first dielectric walls 30_# laterally extending along a first horizontal direction hd1 and second dielectric walls 30_# laterally extending along a second horizontal direction hd2. The top surface of the dielectric grid structure 30_* can be formed within a first horizontal plane HP1 that includes the top surface of the topmost insulating layer 32T.

In one embodiment, the two-dimensional array of rectangular compartments 28 comprises an M×N rectangular array of rectangular compartments in which M is an integer greater than 1, and N is an integer in a range from $2^4$ to $2^{10}$. In one embodiment, top surfaces of each vertically neighboring pair of insulating layers 32 of the insulating layers 32 of the alternating stack (32, 42) are vertically spaced from each other by the unit vertical distance. In one embodiment, top surfaces of each vertically neighboring pair of sacrificial material layers 42 of the sacrificial material layers 42 of the alternating stack (32, 42) are vertically spaced from each other by the unit vertical distance. In one embodiment, each neighboring pair of second dielectric walls 30_# selected from the second dielectric walls 30_# of the dielectric grid structure 30_* has a respective pair of bottom surfaces that are vertically offset from each other by a uniform vertical offset distance which is M times the unit vertical distance.

While an embodiment is described in which a single dielectric fill material deposition process the volumes of the first isolation trenches 29_# and the second isolation trenches 29_#, embodiments are expressly contemplated herein in which the first isolation trenches 29_# and the second isolation trenches 29 # are filled employing two separate dielectric fill material deposition processes.

Figure 9A:
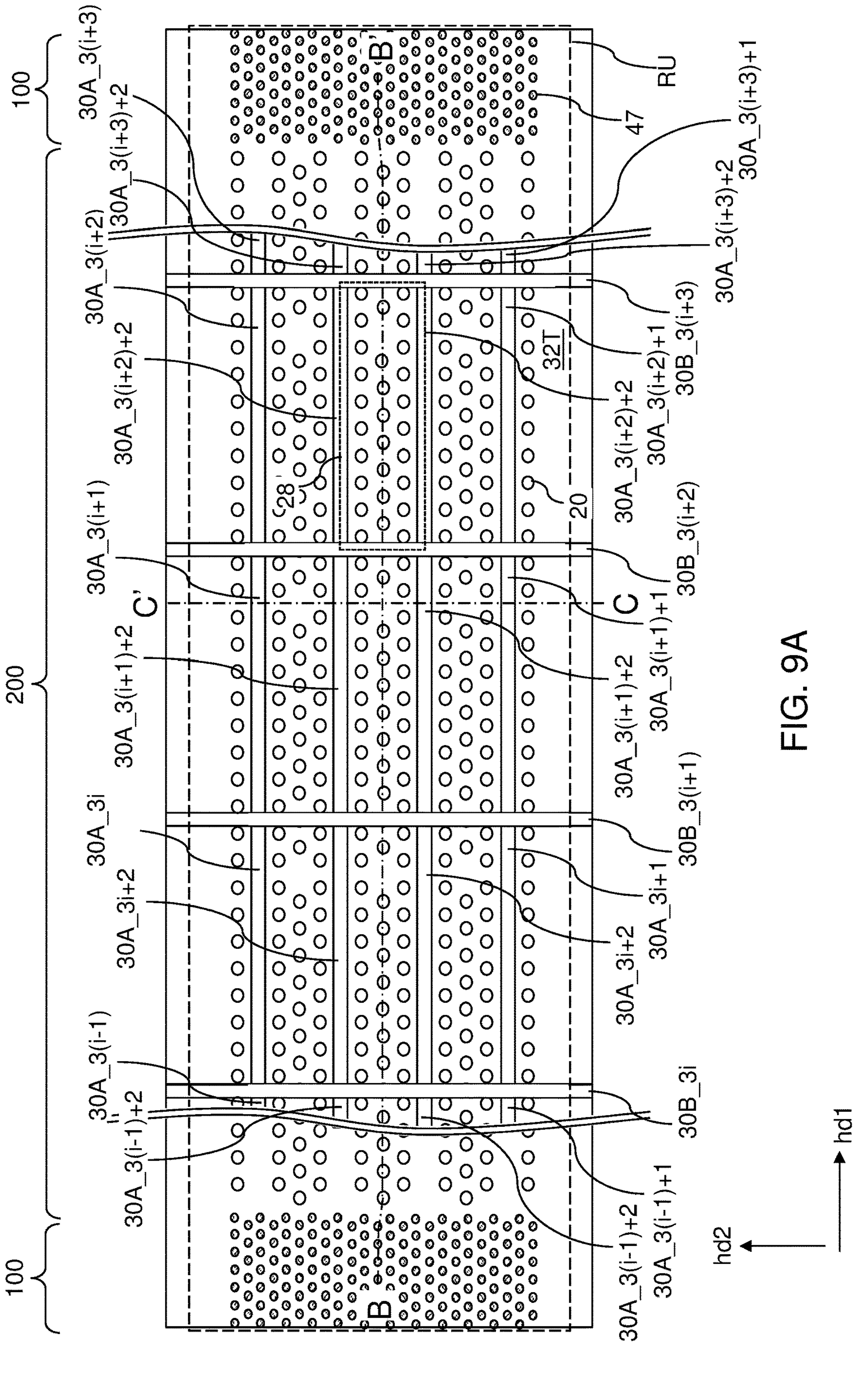
FIG. 9A is a top-down view of a first alternative configuration of the exemplary structure after formation of a dielectric grid structure.

Referring to FIG. 9A, a first alternative configuration of the exemplary structure is illustrated after formation of a dielectric grid structure 30_*. In this case, the first isolation trenches 29_# laterally extending along the first horizontal direction hd1 are formed first, and are filled with the first dielectric walls 30_#. Subsequently, the second isolation trenches 29_# laterally extending along the second horizontal direction hd2 are formed, and are filled with the second dielectric walls 30_#. The dielectric grid structure 30_* in the first alternative configuration of the exemplary structure may occupy the same volume as the dielectric grid structure 30_* in the exemplary structure of FIGS. 8A-8C.

Figure 9B:
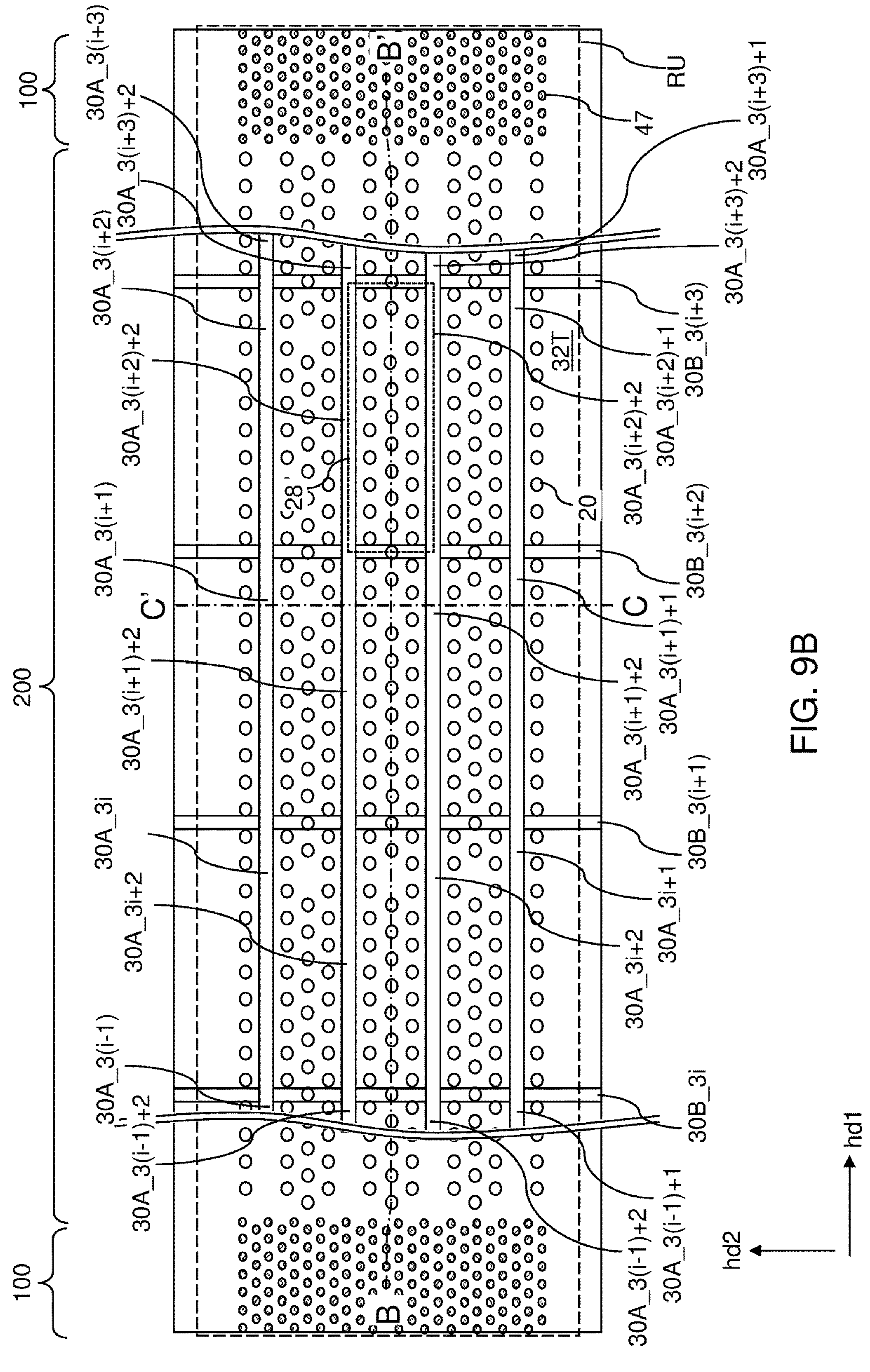
FIG. 9B is a top-down view of a second alternative configuration of the exemplary structure after formation of a dielectric grid structure.

FIG. 9B is a top-down view of a second alternative configuration of the exemplary structure after formation of a dielectric grid structure 30_*. In this case, the second isolation trenches 29_# laterally extending along the second horizontal direction hd2 are formed first, and are filled with the second dielectric walls 30_#. Subsequently, the first isolation trenches 29_# laterally extending along the first horizontal direction hd1 are formed, and are filled with the first dielectric walls 30_#. The dielectric grid structure 30_* in the second alternative configuration of the exemplary structure may occupy the same volume as the dielectric grid structure 30_* in the exemplary structure of FIGS. 8A-8C.

Referring collectively to FIGS. 8A-8C, 9A, and 9B, a dielectric grid structure 30_* embedded in the alternating stack (32, 42) can include a two-dimensional array of rectangular compartments 28 that is defined by an interwoven assembly of first dielectric walls 30_# laterally extending along a first horizontal direction hd1 and second dielectric walls 30_# laterally extending along a second horizontal direction hd2. For each selected sacrificial material layer 42 of the sacrificial material layers 42 of the alternating stack (32, 42) that is not a topmost sacrificial material layer 42 or a bottommost sacrificial material layer 42, at least one rectangular compartment 28 is present within the two-dimensional array of rectangular compartments 28 of which an entire area is fully occupied by the selected sacrificial material layer 42 and by each sacrificial material layer 42 that underlies the selected sacrificial material layer 42, and is occupied by a respective vertical stack of at least one pair of an insulating plate 32' and a dielectric material plate 42'. For the bottommost sacrificial material layer 42, at least one rectangular compartment 28 is present within the two-dimensional array of rectangular compartments of which an entire area is fully occupied by the bottommost sacrificial material layer 42, and is occupied by a respective vertical stack of multiple pairs of an insulating plate 32' and a dielectric material plate 42'.

In one embodiment, the depths of bottom surfaces of the second dielectric walls 30_# increase along the first horizontal direction hd1. In one embodiment, each bottom surface of the second dielectric walls 30_# has a respective uniform depth. In other words, each second dielectric wall 30_+ has a respective bottom surface having a respective uniform depth.

In one embodiment, the two-dimensional array of rectangular compartments 28 comprises an M×N rectangular array of rectangular compartments 28 in which M is an integer greater than 1, and N is an integer in a range from $2^4$ to $2^{10}$. In one embodiment, top surfaces of each vertically neighboring pair of insulating layers 32 of the insulating layers 32 of the alternating stack (32, 42) are vertically spaced from each other by the unit vertical distance. In one embodiment, top surfaces of each vertically neighboring pair of sacrificial material layers 42 of the sacrificial material layers 42 of the alternating stack (32, 42) are vertically spaced from each other by the unit vertical distance. In one embodiment, each neighboring pair of second dielectric walls 30_# selected from the second dielectric walls 30_# of the dielectric grid structure 30_* has a respective pair of bottom surfaces that are vertically offset from each other by a uniform vertical offset distance which is M times the unit vertical distance.

In one embodiment, each of the first dielectric walls 30_# has a respective stepped bottom surface of which a height decreases stepwise along the first horizontal direction hd1 by the uniform vertical offset distance at each location of the second dielectric walls 30_#. In one embodiment, within each vertical cross-sectional plane that contains the first dielectric walls 30_# and is perpendicular to the first horizontal direction hd1, bottom surfaces of at least one pair of the first dielectric walls 30_# of the first dielectric walls 30_# of the dielectric grid structure 30_* are vertically offset by a respective integer multiple of the unit vertical distance which is less than M times the unit vertical distance.

Figure 10A:
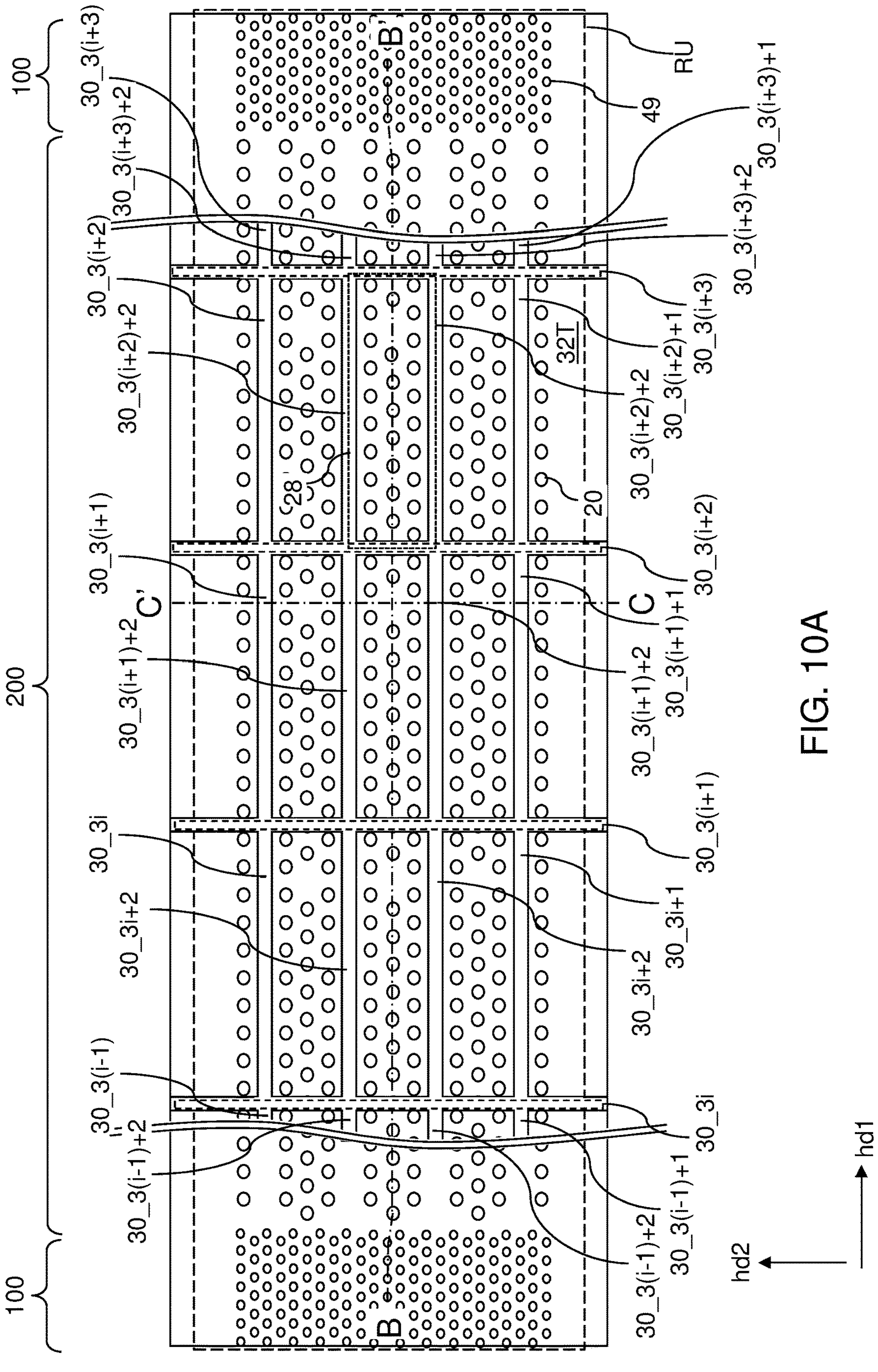
FIGS. 10A-10C are various views of the exemplary structure after removal of the sacrificial memory opening fill structures from within the memory openings according to an embodiment of the present disclosure.
Figure 10B:
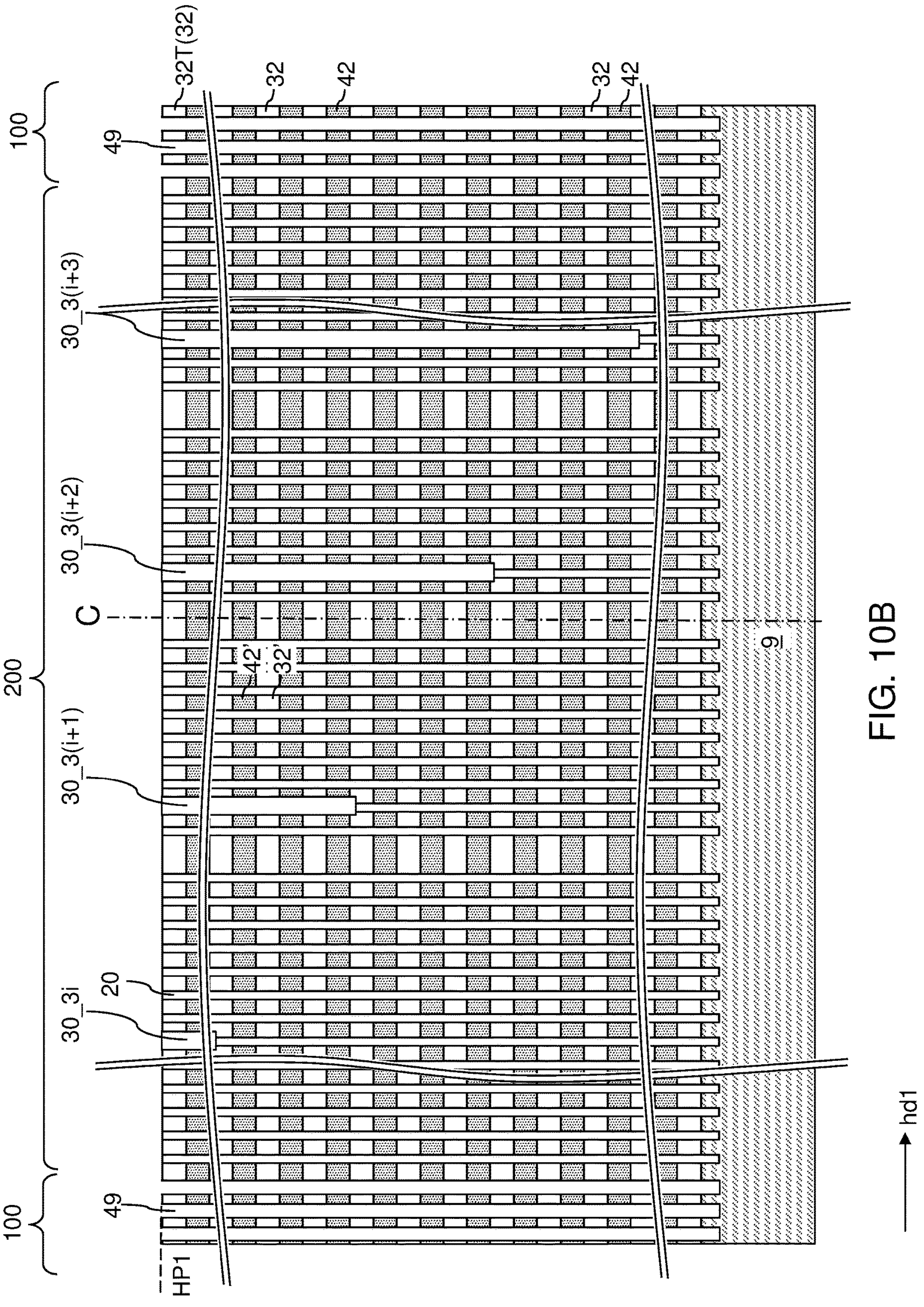
Figure 10C:
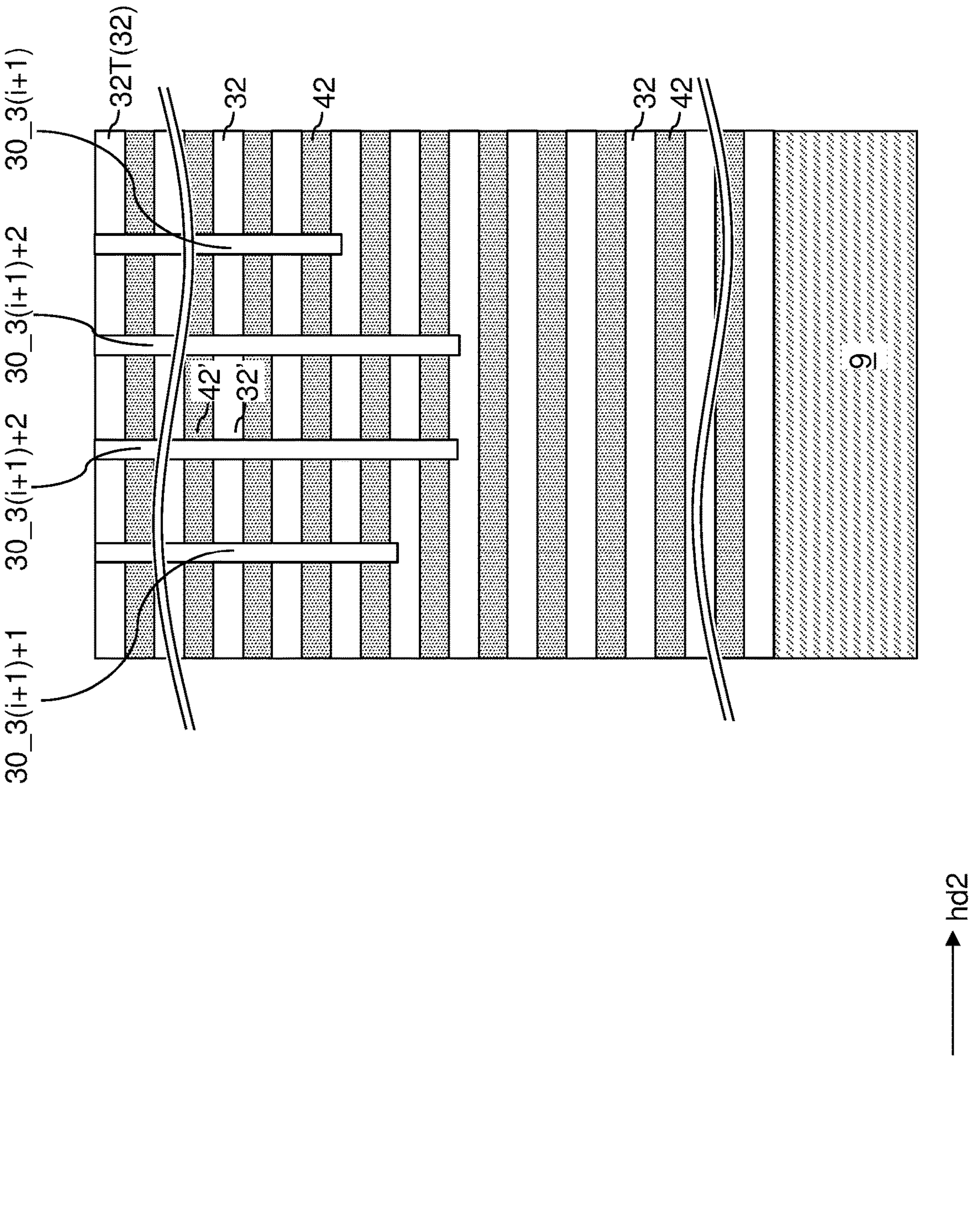

Referring to FIGS. 10A-10C, the sacrificial memory opening fill structures 47 can be removed selective to the materials of the alternating stack (32, 42) and the semiconductor material layer 9 by performing a selective removal process, which may comprise an ashing process or a selective etch process (which may comprise a dry etch process or a wet etch process). Voids are formed in the volumes of the memory openings 49.

Figure 11A:
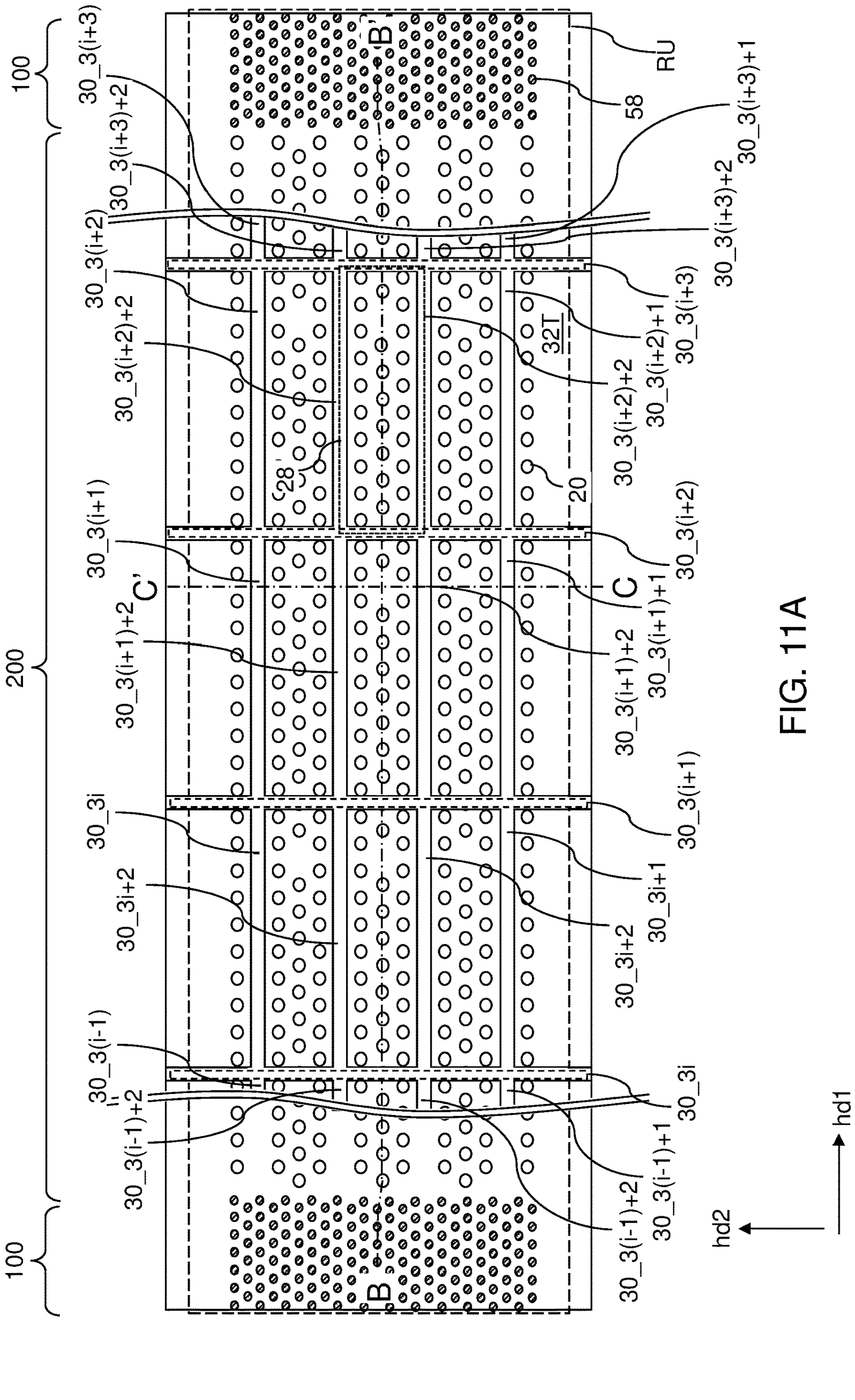
FIGS. 11A-11D are various views of the exemplary structure after formation of memory opening fill structures in the memory openings according to an embodiment of the present disclosure.
Figure 11B:
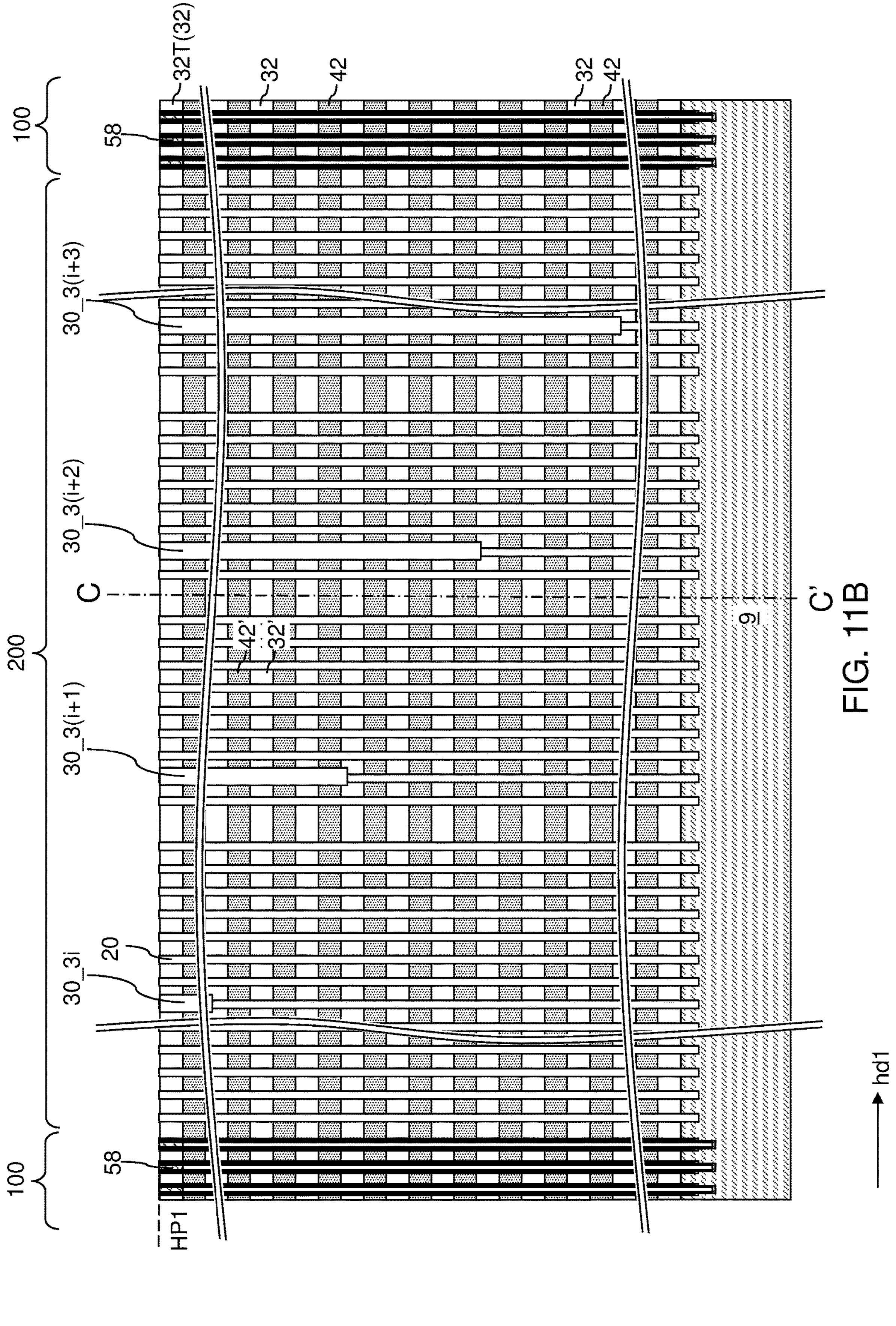
Figure 11C:
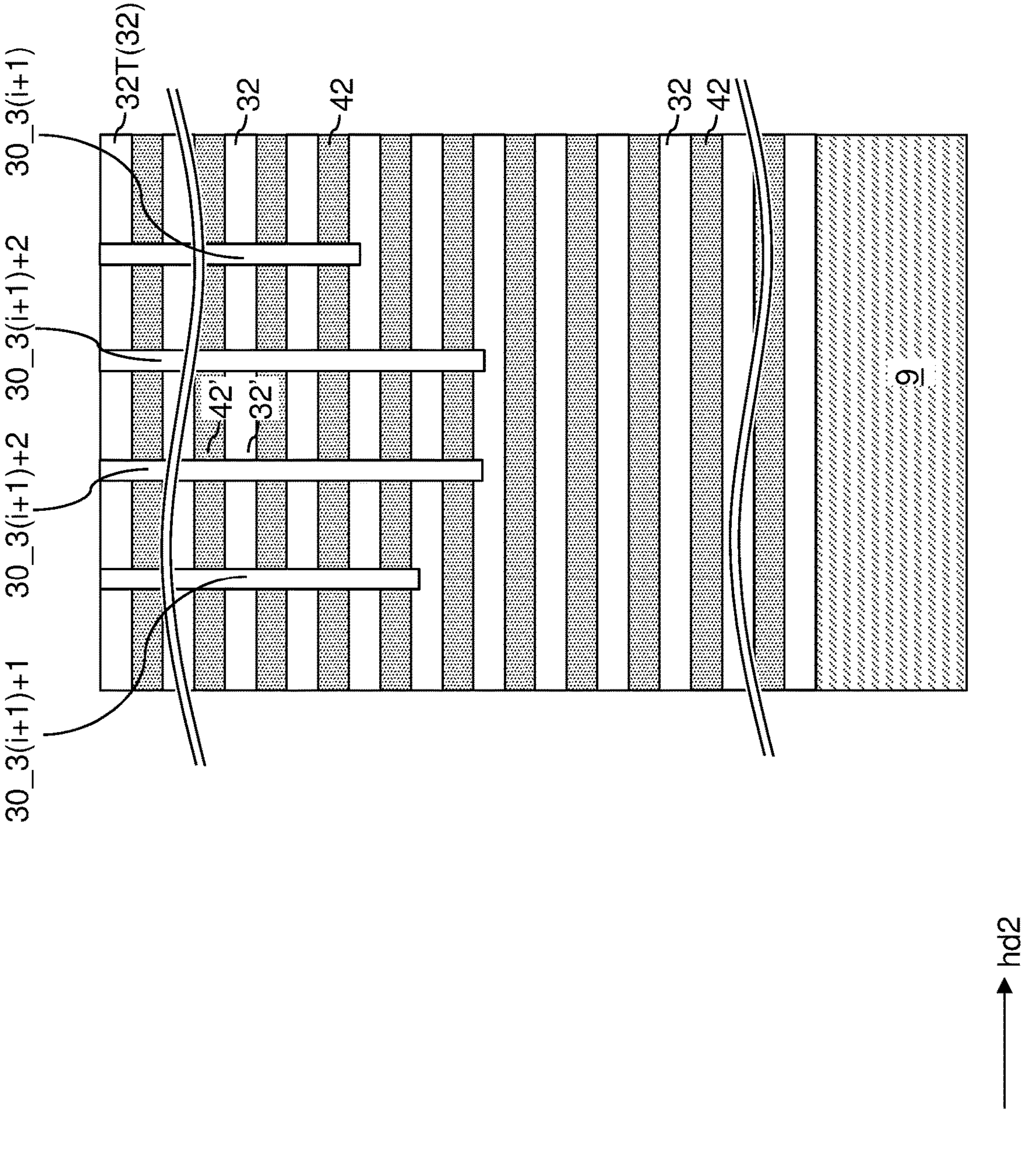
Figure 11D:
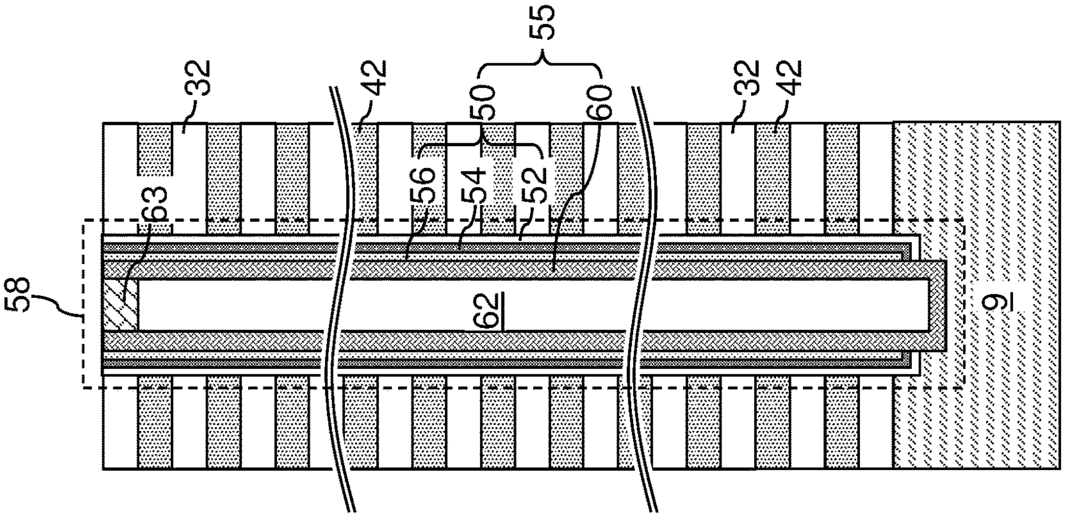

Referring to FIGS. 11A-11C, a memory opening fill structure 58 can be formed within each memory opening 49. For example, a memory film 50 can be formed in a peripheral region of each memory opening 49 by performing at least one conformal deposition process. In one embodiment shown in FIG. 6C, the memory film 50 may include a layer stack of a blocking dielectric layer 52, a memory material layer 54 (which may comprise a charge storage layer, such as a silicon nitride layer, or any alternative type of memory material layer, such as a ferroelectric material layer), and an optional dielectric liner 56 (such as a tunneling dielectric layer). Generally, the memory film 50 comprises a vertical stack of memory elements, which may be located at levels of the sacrificial material layers 42. For example, portions of a charge material layer located at the levels of the sacrificial material layers constitute charge storage material portions, which are memory elements. An optional anisotropic etch process may be performed to remove horizontally-extending portions of the memory film 50, for example, at the bottom of each memory opening 49 and from above the alternating stack (32, 42). A vertical semiconductor channel 60 and a dielectric core 62 can be formed in an inner region of each memory opening 49. The vertical semiconductor channels 60 may comprise a polysilicon or an amorphous silicon layer have a doping of a first conductivity type. A drain region 63 having a doping of a second conductivity type may be formed at an upper end of each vertical semiconductor channel 60. The combination of the memory film 50 and the vertical semiconductor channel 60 within each memory opening 49 constitutes a memory stack structure 55. The set of all material portions filling a memory opening 49 constitutes a memory opening fill structure 58. Each of the memory opening fill structures 58 comprises a respective vertical stack of memory elements.

In another alternative embodiment, the steps described above with respect to FIGS. 4A-4C are omitted. In this alternative embodiment, dummy memory opening fill structures are formed in the support openings 19 at the same time as the memory opening fill structures 58 are formed in the memory openings 49. The dummy memory opening fill structures function as the support pillar structures 20, and are electrically inactive. In other words, the dummy memory opening fill structures are not electrically connected to bit lines to be formed during a subsequent step.

Figure 12A:
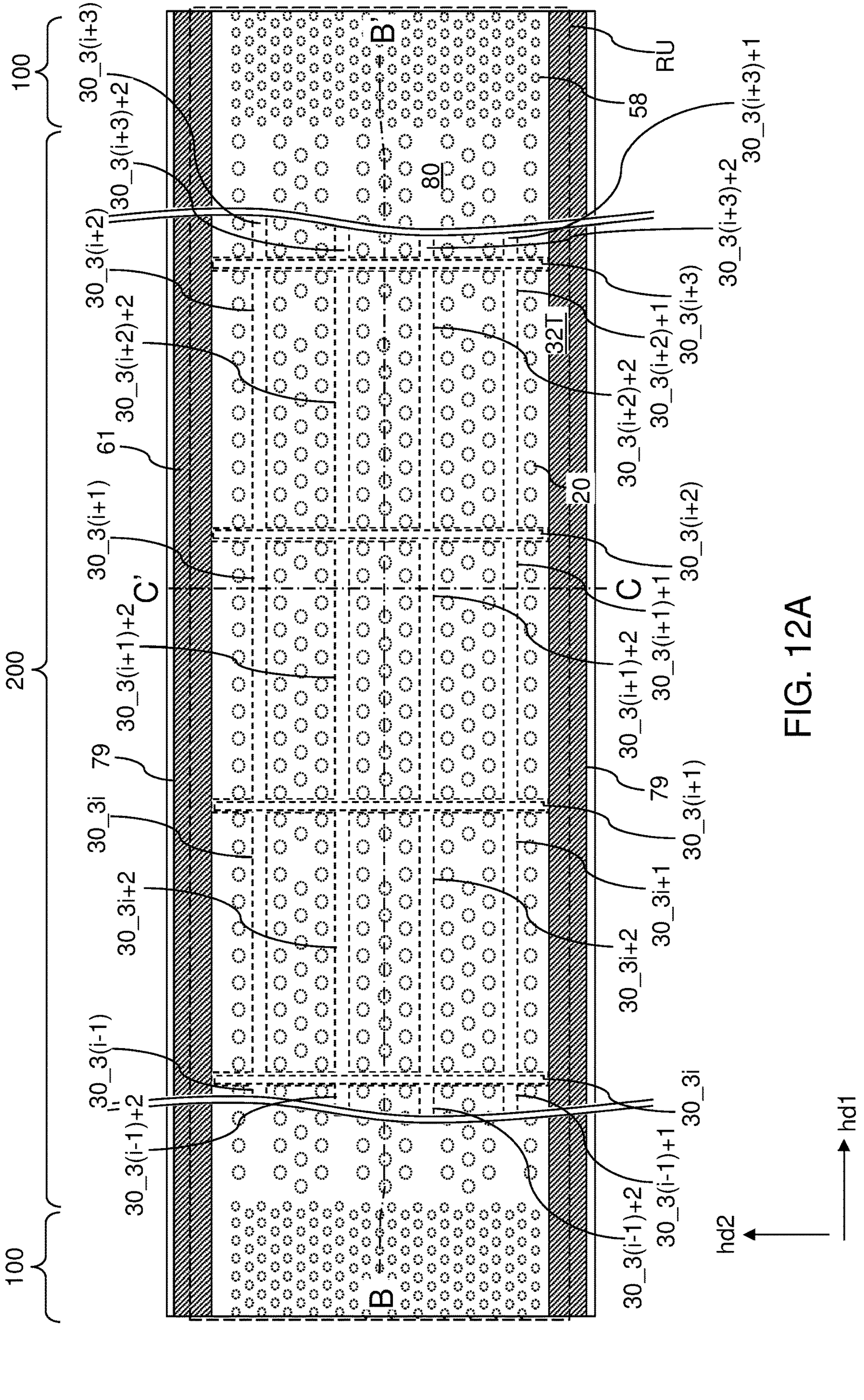
FIGS. 12A-12C are various views of the exemplary structure after formation of a contact-level dielectric layer and backside trenches according to an embodiment of the present disclosure.
Figure 12B:
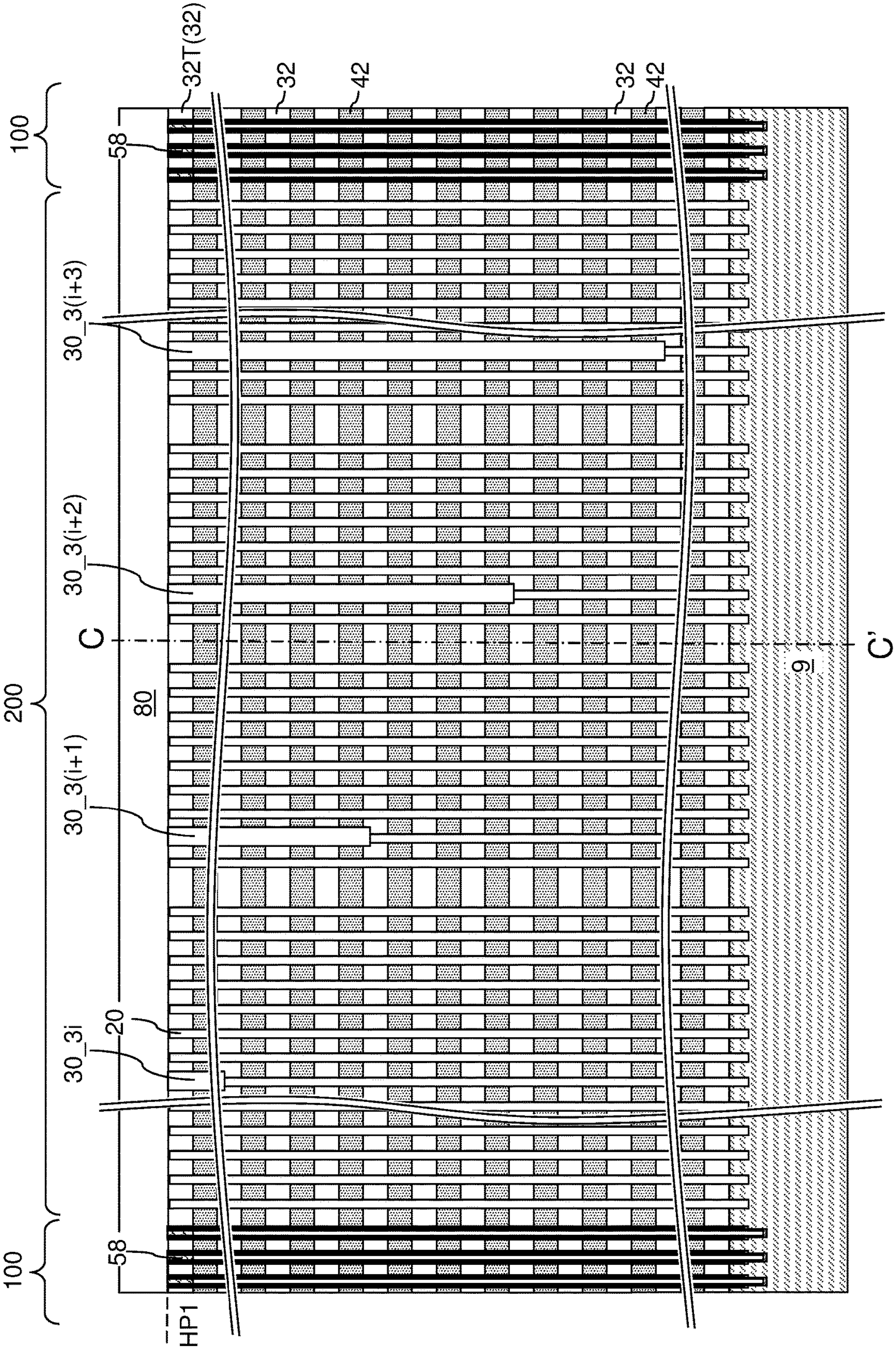
Figure 12C:
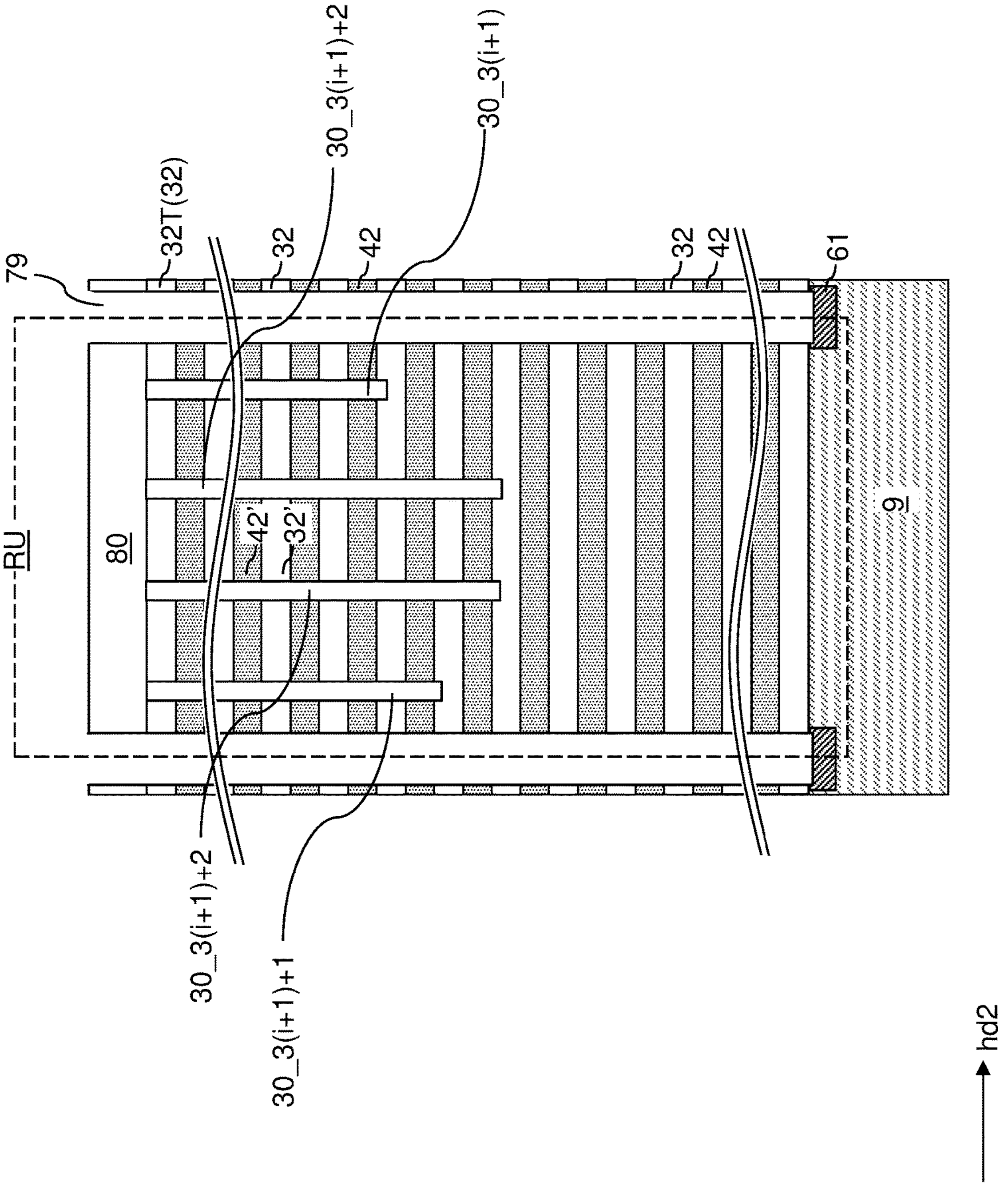

Referring to FIGS. 12A-12C, a dielectric material, such as silicon oxide, can be deposited over the alternating stack (32, 42) to form a contact-level dielectric layer 80. A photoresist layer can be applied over the contact-level dielectric layer 80, and can be lithographically patterned to form various elongated openings therethrough. The elongated openings in the photoresist layer may comprise slit-shaped openings that are formed at or around the boundaries between neighboring pairs of repetition units (e.g., memory blocks) RU at which the memory opening fill structures 58 and the support pillar structures 20 are not present. In one embodiment, each elongated opening in the photoresist layer may be centered at a respective boundary line of a repetition unit RU that laterally extends along the first horizontal direction hd1.

An anisotropic etch process can be performed to transfer the pattern of the elongated openings in the photoresist layer through the contact-level dielectric layer 80 and the alternating stack of insulating layers 32 and sacrificial material layers 42 and optionally into an upper portion of the semiconductor material layer 9. Backside trenches 79 are formed underneath the slit-shaped openings in the photoresist layer. The backside trenches 79 are formed between a respective cluster of memory openings 49 to separate laterally adjacent memory blocks. The backside trenches 79 laterally extend along the first horizontal direction hd1. Generally, a pair of backside trenches 79 can laterally extend along a first horizontal direction hd1 through the alternating stacks (32, 42) such that each neighboring pair of alternating stacks (32, 42) are laterally spaced from each other along the second horizontal direction hd2. Source regions 61 may optionally be formed by implanting dopants of the second conductivity type into surface portions of the semiconductor material layer 9 that underlies the backside trenches 79.

In one embodiment, the backside trenches 79 cut through each of the second dielectric walls 30_#. Each alternating stack (32, 42) may be laterally bounded by a neighboring pair of a first backside trench 79 and a second backside trench 79 that are laterally spaced from each other along the second horizontal direction hd2. A first vertical plane passing through the geometrical center of the first backside trench 79 and perpendicular to the second horizontal direction hd2 may be located at a first boundary of the repetition unit RU, and a second vertical plane passing through the geometrical center of the second backside trench 79 and perpendicular to the second horizontal direction hd2 may be located at a second boundary of the repetition unit RU.

In summary, at least two first dielectric walls 30_# are located between the first backside trench 79 and the second backside trench 79. In one embodiment, (M+1) first dielectric walls 30_# may be located between the first backside trench 79 and the second backside trench 79. In one embodiment, each of the second dielectric walls 30_# embedded in the alternating stack (32, 42) between the first backside trench 79 and the second backside trench 79 may have end surfaces that are exposed to the first backside trench 79 and the second backside trench 79. In one embodiment, each of the first dielectric walls 30_# is laterally spaced from and is located between the first backside trench 79 and the second backside trench 79.

Referring to FIGS. 13A-13F, an isotropic etch process can be performed to etch the material of the sacrificial material layers 42 selective to materials of the insulating layers 32, the contact-level dielectric layer 80, the outermost layer of each memory film 50 (such as a blocking dielectric layer 52), and the semiconductor material layer 9. For example, if the sacrificial material layers 42 comprise silicon nitride, a wet etch process employing hot phosphoric acid may be performed to remove the sacrificial material layers 42. A laterally-extending cavity 43 can be formed within each void that is formed by removal of a portion of a sacrificial material layer 42.

Figure 13A:
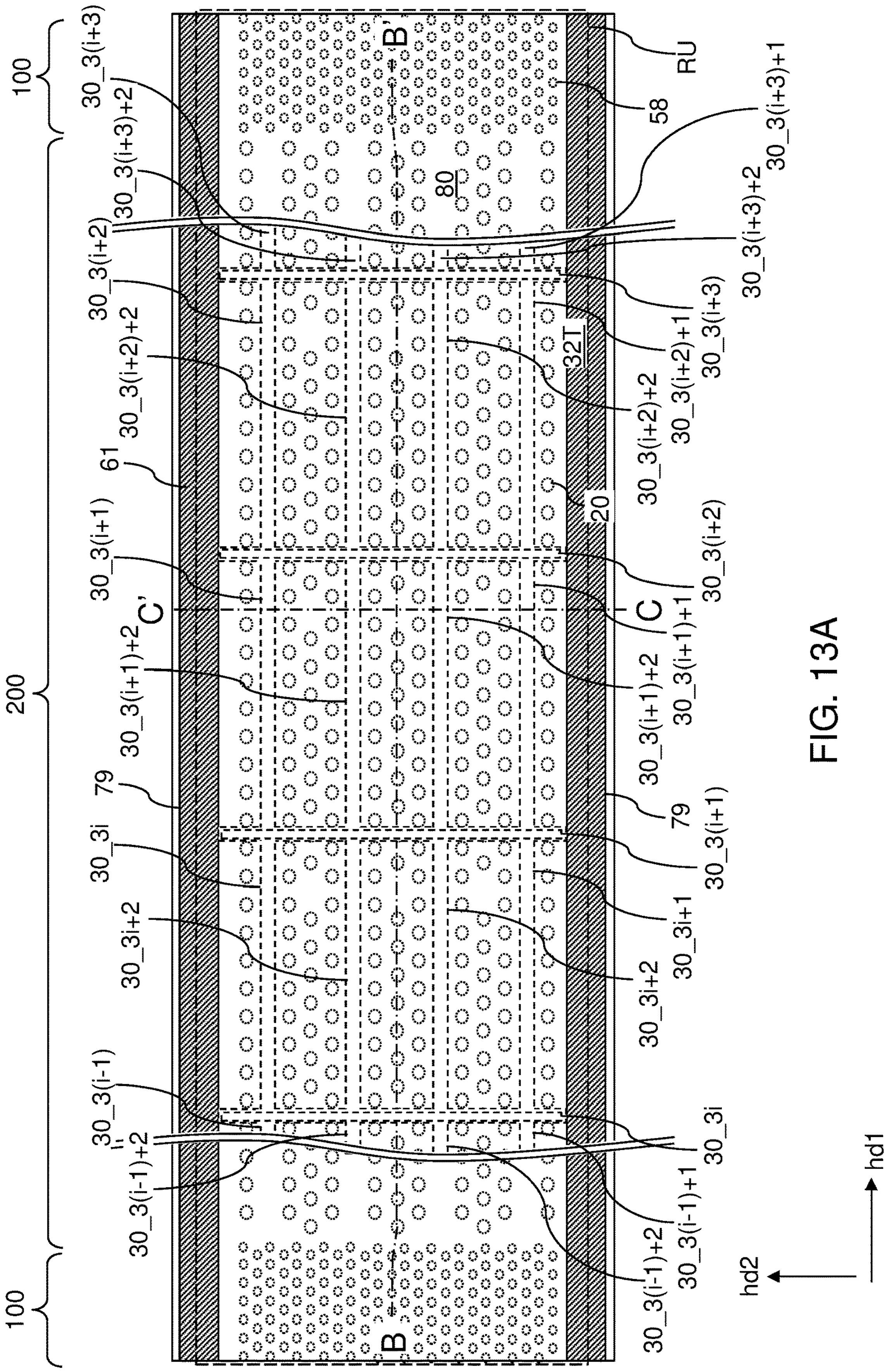
FIGS. 13A-13F are various views of the exemplary structure after formation of laterally-extending cavities according to an embodiment of the present disclosure.
Figure 13B:
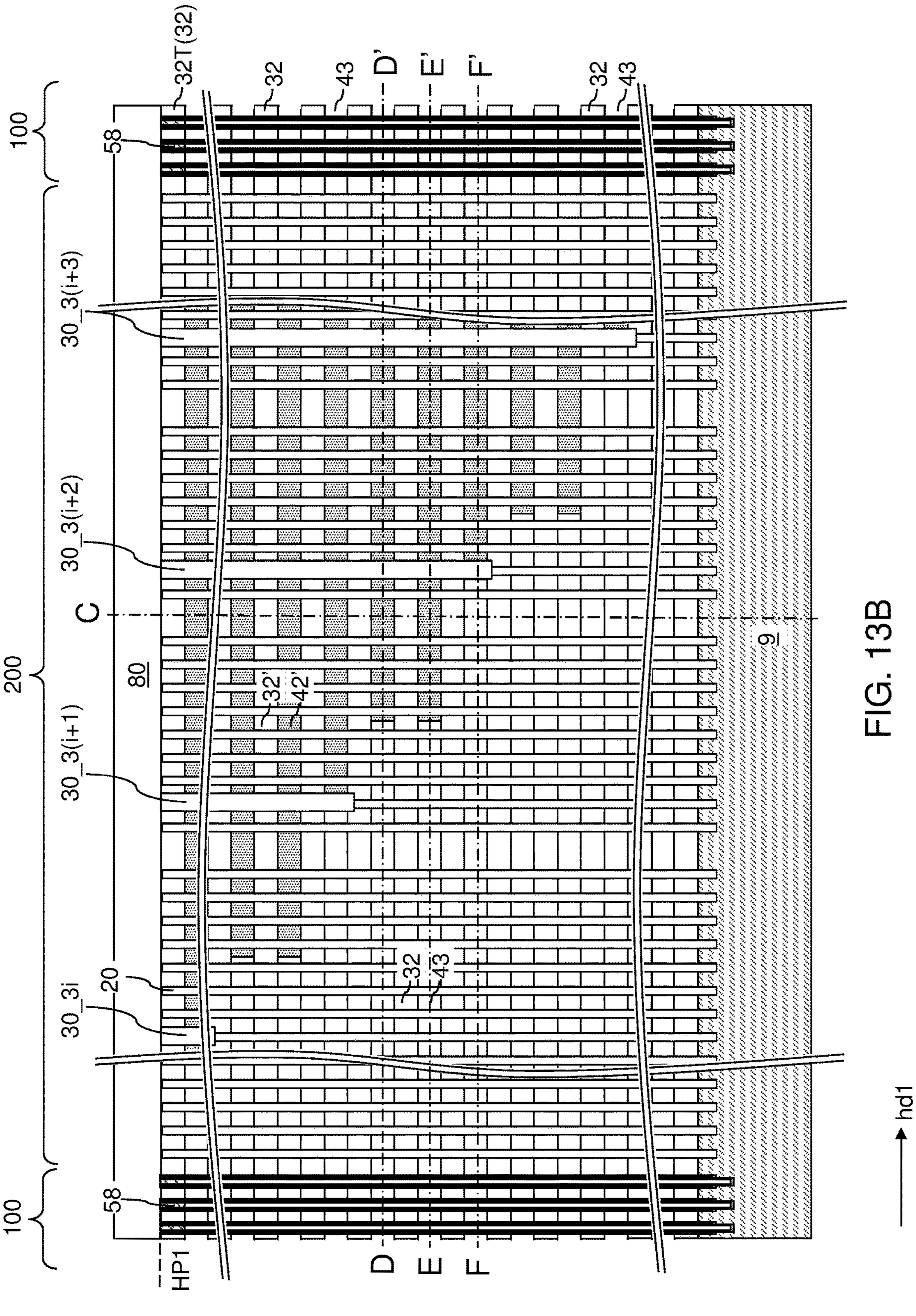
Figure 13C:
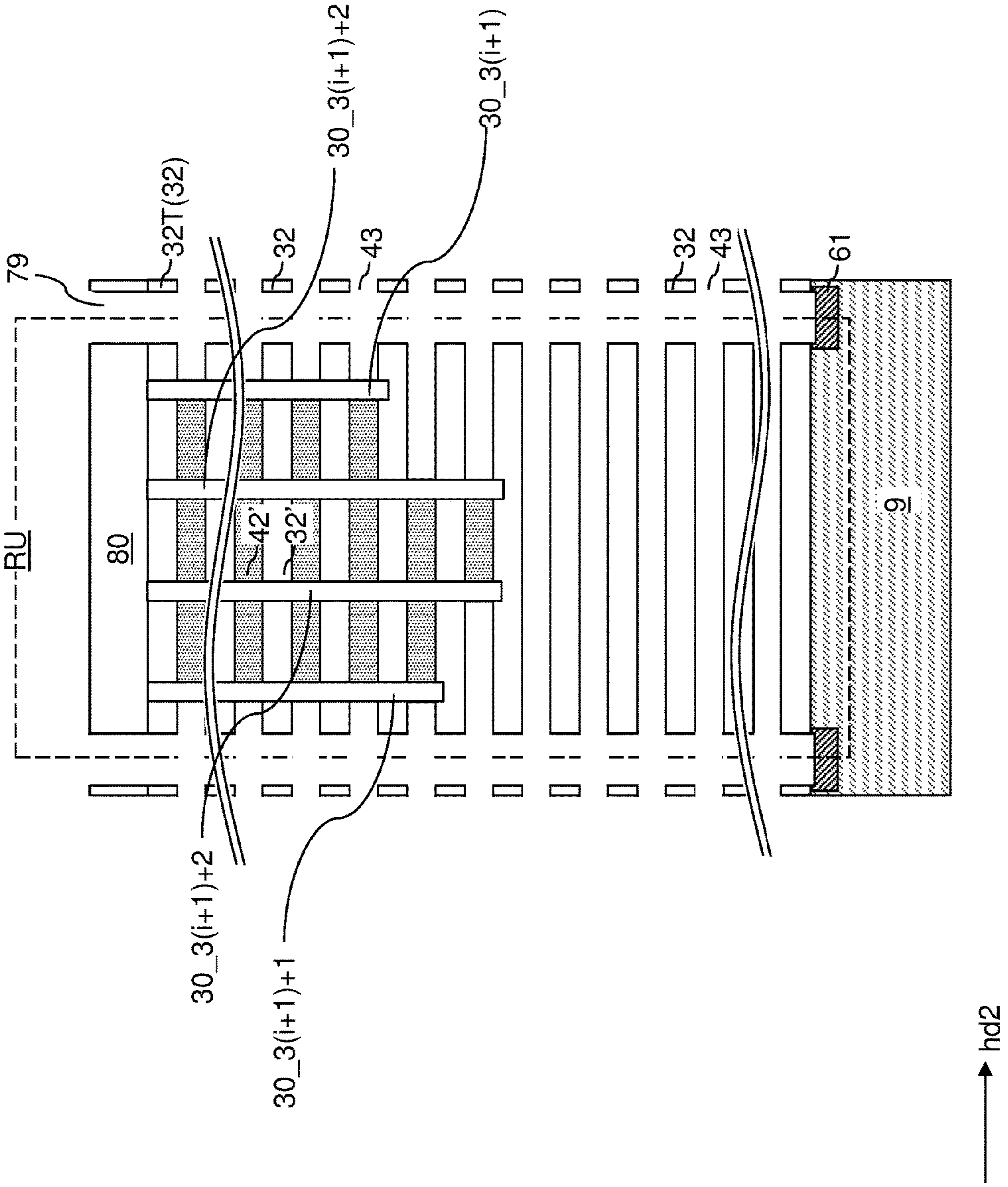
Figure 13D:
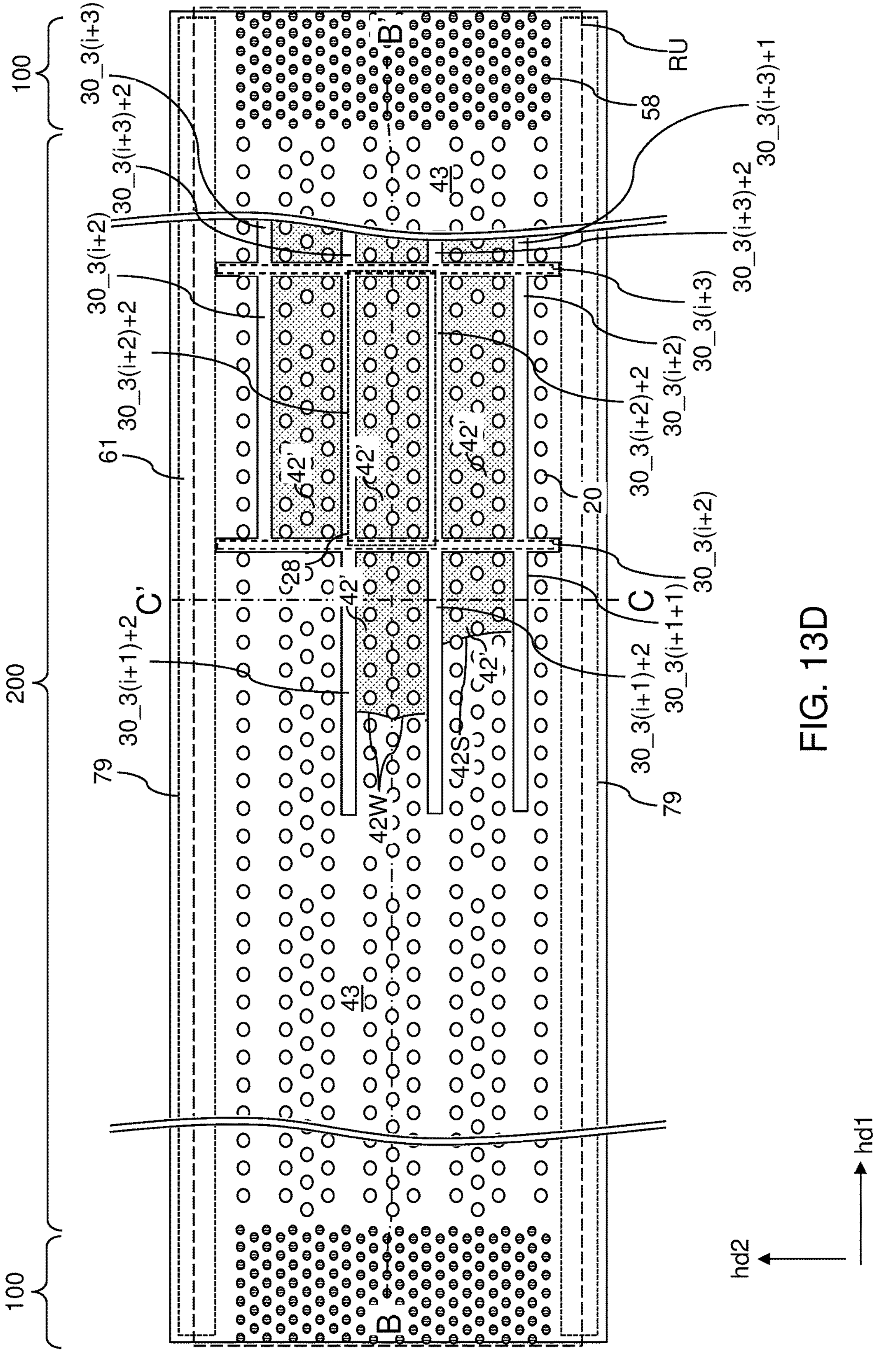
Figure 13E:
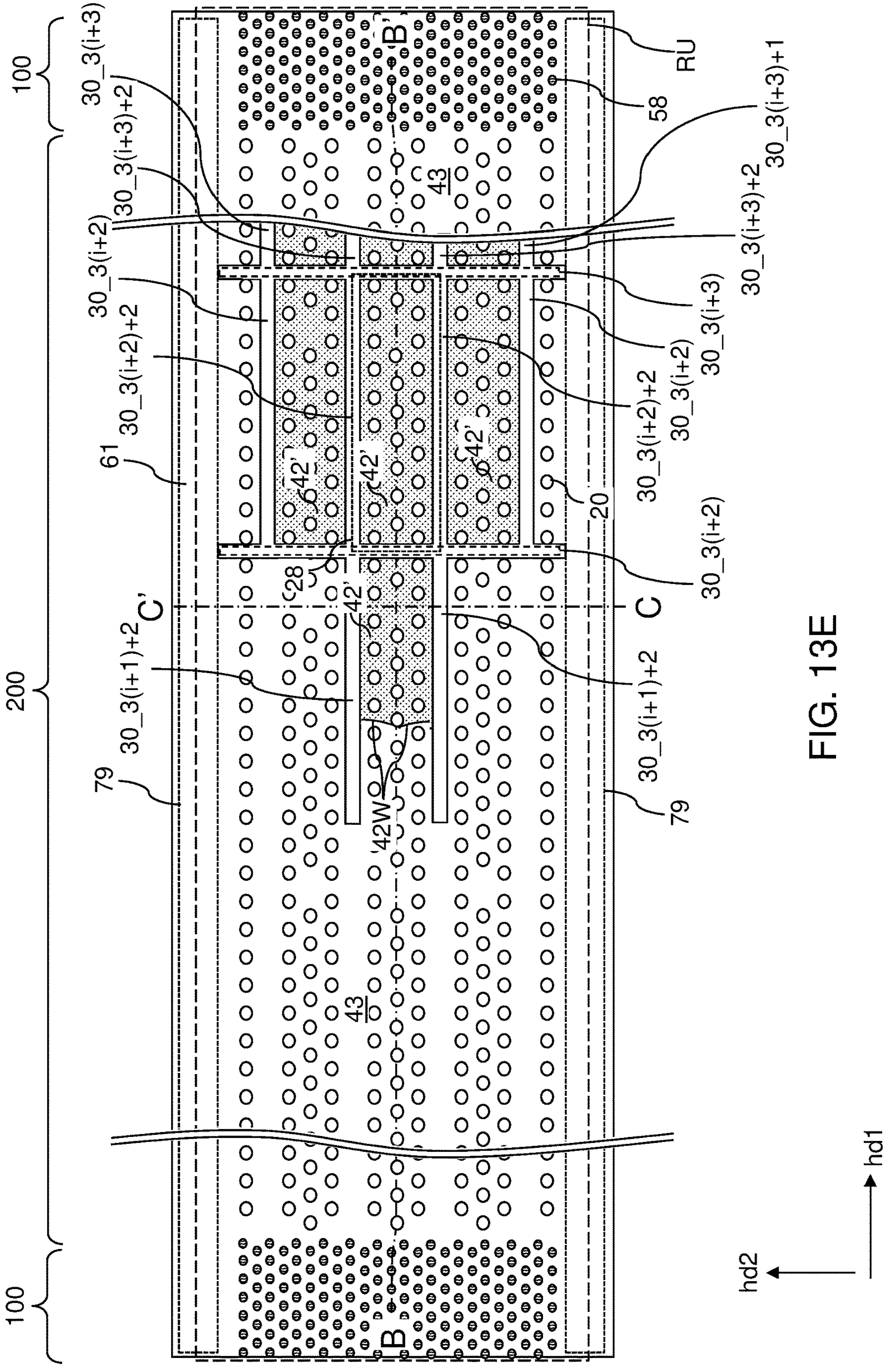
Figure 13F:
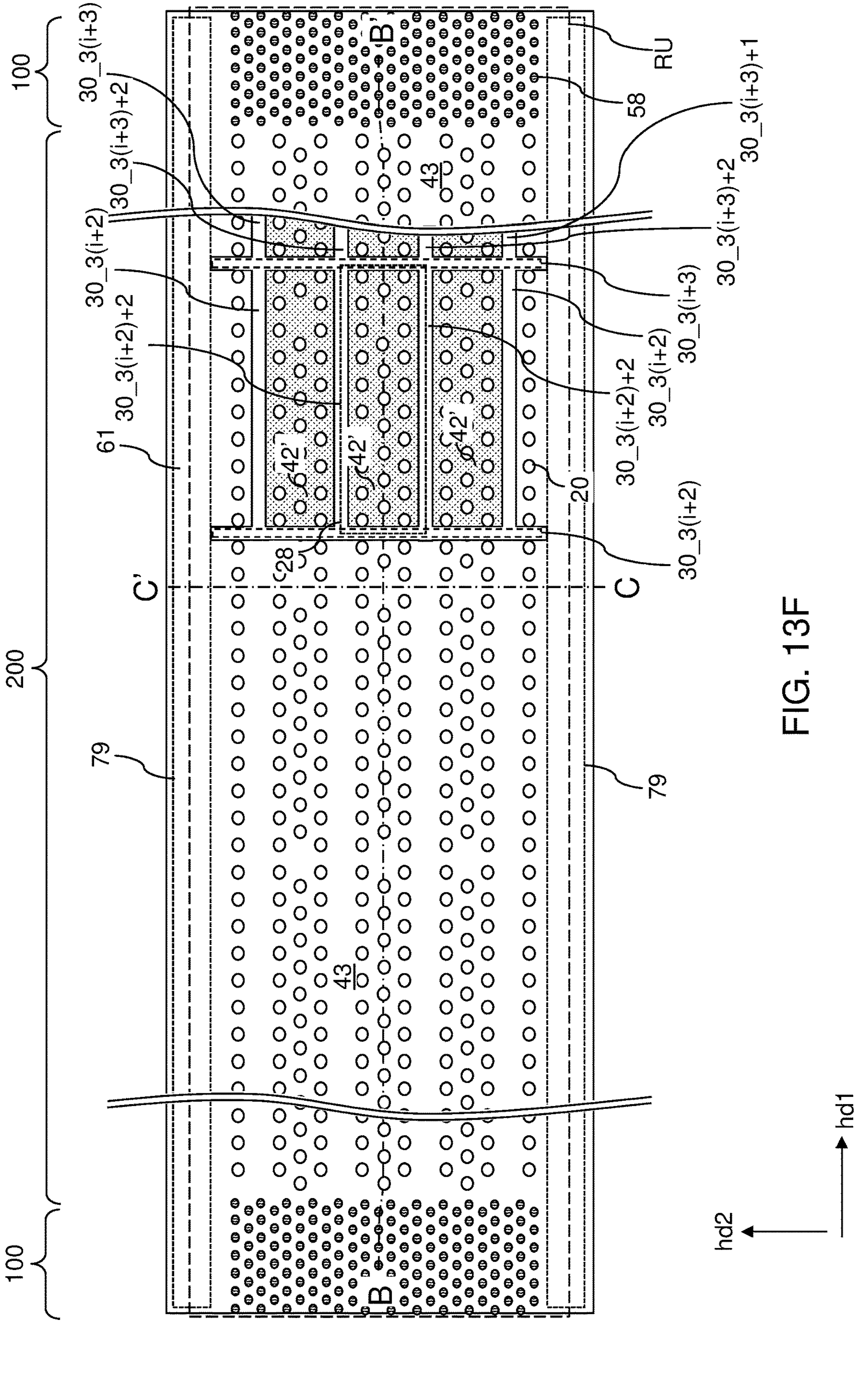
Figure 14A:
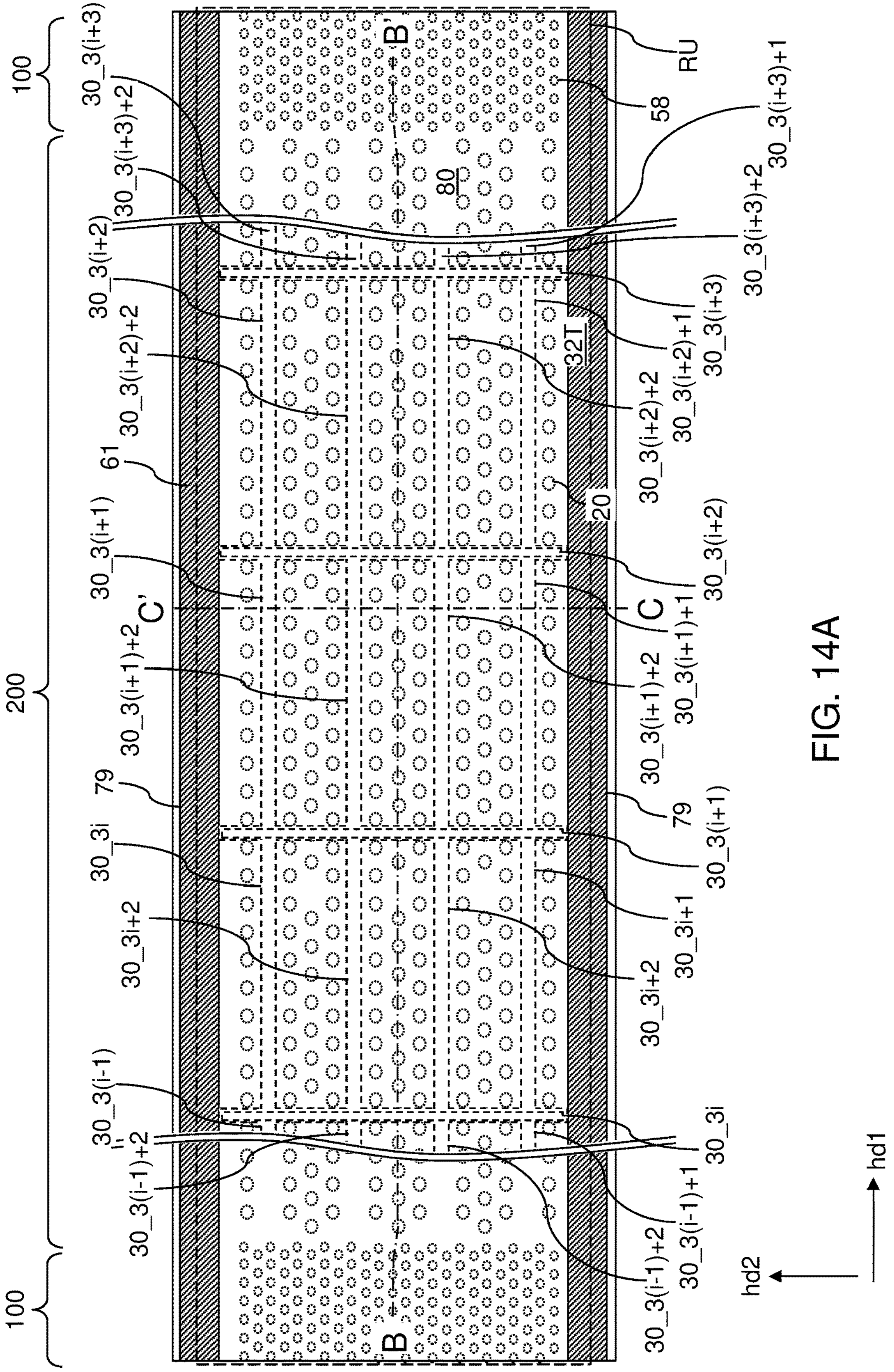
FIGS. 14A-14F are various views of the exemplary structure after formation of electrically conductive layers in the laterally-extending cavities according to an embodiment of the present disclosure.
Figure 14B:
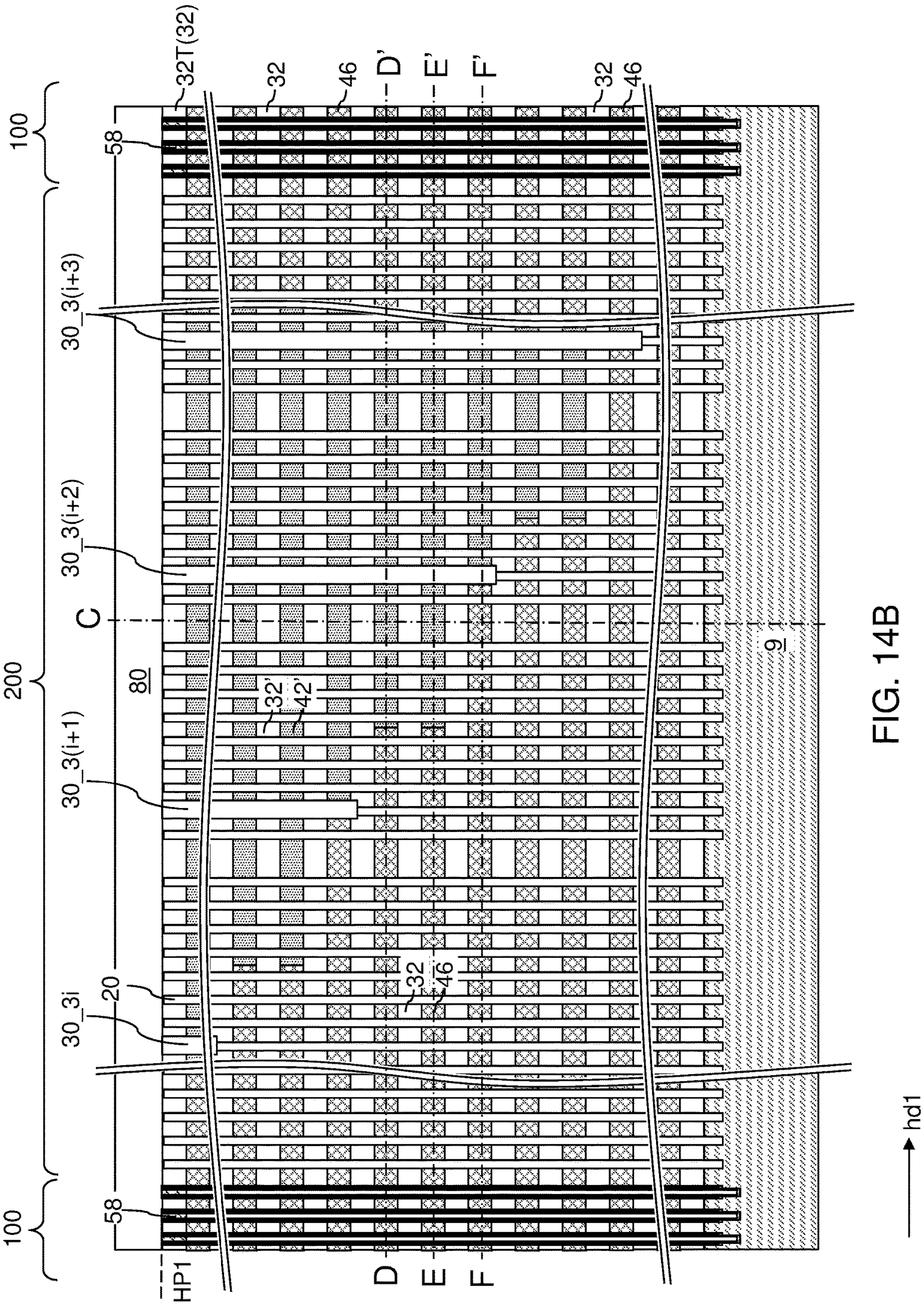
Figure 14C:
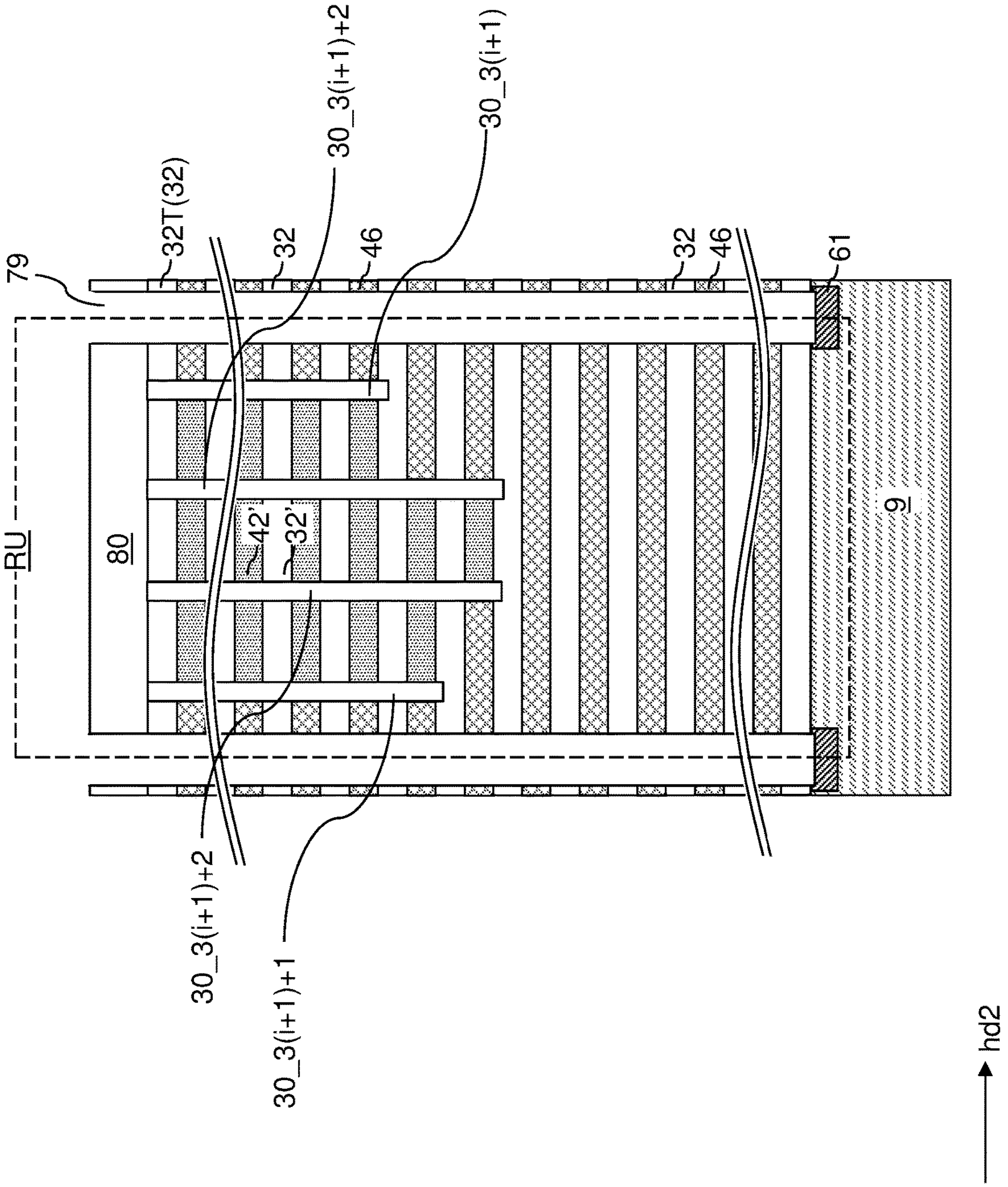
Figure 14D:
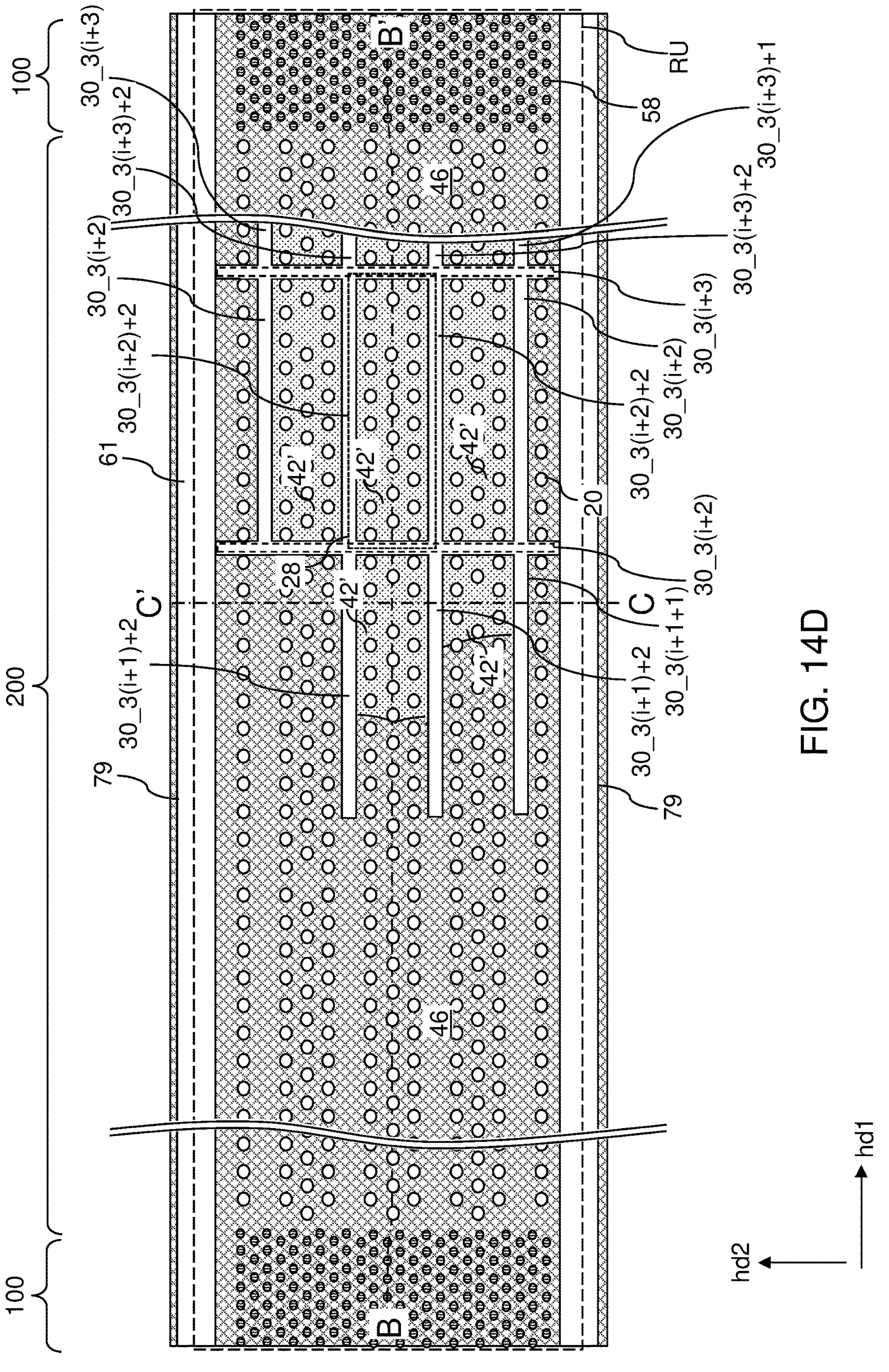
Figure 14E:
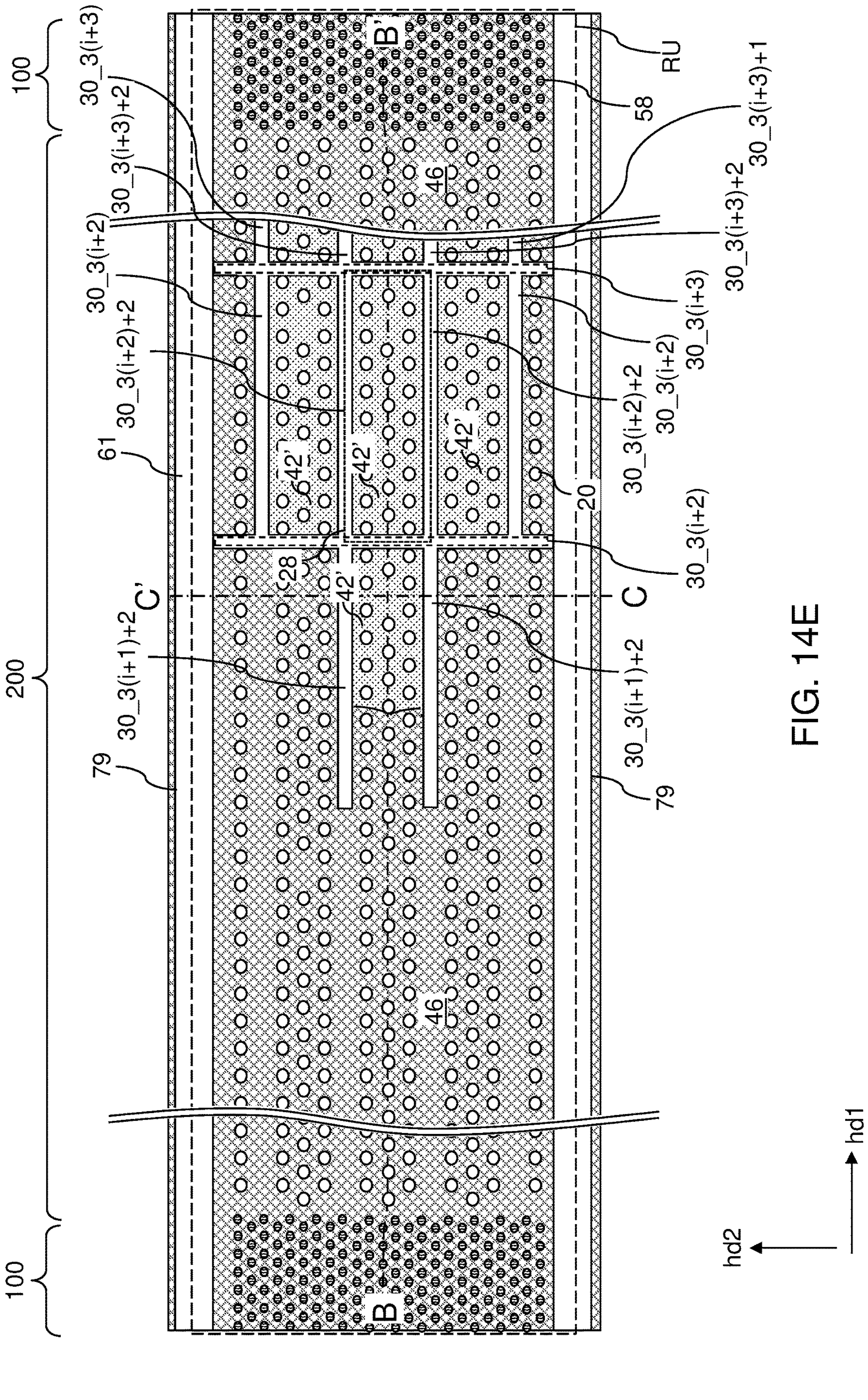
Figure 14F:
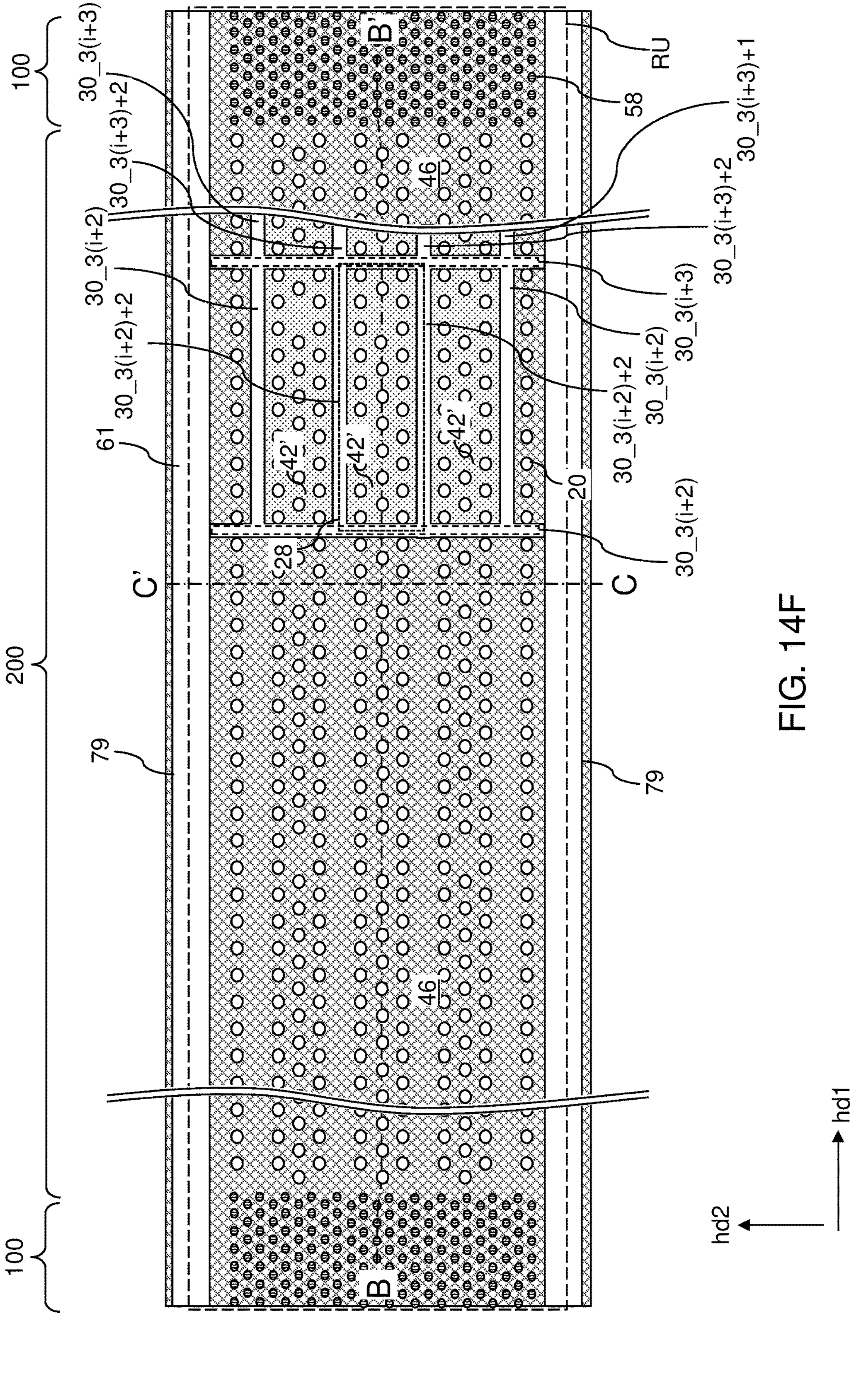

The isotropic etch process can remove a predominant fraction of the sacrificial material layers 42 in regions located outside the dielectric grid structures 30_*. Unetched portions of the sacrificial material layers 42 constitute additional dielectric material plates 42'. At least some of the additional dielectric material plates 42' may have a respective non-rectangular shape in a horizontal cross-sectional view, as shown in FIGS. 13D and 13E. During the isotropic etch process, removal of the material of the sacrificial material layers 42 proceed isotropically from the sidewalls of the backside trenches 79. The lateral extent of the removal of the material of the sacrificial material layers 42 is limited by the dielectric walls 30_# of the dielectric grid structure 30_*, and by the maximum etch distance of the isotropic etch process imposed by the finite duration of the isotropic etch process.

In one embodiment, the duration of the isotropic etch process can be selected such that the maximum etch distance of the isotropic etch process is in the range from 50% to 80%, such as from 55% to 75%, of the lateral spacing between each neighboring pair of backside trenches 79 along the second horizontal direction hd2. The difference in the depths of the bottom surfaces of dielectric walls 30_# within segments of first dielectric walls 30_#(which laterally extend along the first horizontal direction hd1) located between a respective neighboring pair of seconds dielectric walls 30_#(which laterally extend along the second horizontal direction hd2) causes the segments of dielectric walls 30_# to block lateral diffusion of an isotropic etchant along the second horizontal direction hd2 into the rectangular compartments 28 that are distal from the backside to trenches 79, i.e., are distal from boundaries of the repetition unit RU that laterally extend along the first horizontal direction hd1.

However, the isotropic etchant may laterally defuse between each neighboring pair of segments of the first dielectric walls 30_# because of partial etching of a portion of a sacrificial material layer 42 within each such rectangular compartment 28. Each remaining unetched portion of the sacrificial material layers 42 within such rectangular compartments constitutes the additional dielectric material plates 42', which may comprise non-rectangular dielectric material plates 42'. In one embodiment, a first subset of the non-rectangular dielectric material plates 42' may comprise a single laterally-concave and vertically-straight sidewall 42S, as shown in FIG. 13D. A second subset of the non-rectangular dielectric material plates 42' may have a pair of laterally-concave and vertically-straight sidewalls 42W, as shown in FIGS. 13D and 13E. As used herein, a "laterally-concave" surface refers to a surface having a concave profile in a horizontal cross-sectional view. As used herein, a "vertically-straight" surface refers to a surface having a straight profile in a vertical cross-sectional view.

In summary, the laterally-extending cavities 43 can be formed by introducing an isotropic etchant that etches a material of the sacrificial material layers 42 into the backside trenches 79. The dielectric grid structure 30_* function as an etch-stop structure that limits lateral extents of the laterally-extending cavities 43. In one embodiment, for each laterally-extending cavity 43 that is not a topmost laterally-extending cavity 43 and occupies an area of a respective rectangular compartment 28 within the two-dimensional array of rectangular compartments 28, at least one pair of an insulating plate 32' and a dielectric material plate 42' is located above the laterally-extending cavity 43 within the area of the respective rectangular compartment 28.

In one embodiment, within a volume that is laterally bounded by a neighboring pair of second dielectric walls 30_#, a first subset of the laterally-extending cavities 43 has a first lateral extent along the second horizontal direction hd2 that is less than a lateral spacing between a neighboring pair of backside trenches 79 along the second horizontal direction hd2, and a second subset of the laterally-extending cavities 43 has a second lateral extent along the second horizontal direction hd2 that equals the lateral spacing between the neighboring pair of backside trenches 79 along the second horizontal direction hd2.

Referring to FIGS. 14A-14F, a backside blocking dielectric layer (not shown) may be optionally deposited by a conformal deposition process in peripheral portions of the laterally-extending cavities 43, in peripheral portions of the backside of trenches 79, and over the contact-level dielectric layer 80. If employed, the backside blocking dielectric layer may comprise a dielectric metal oxide material having a thickness in the range from 1 nm to 10 nm, such as from 2 nm to 6 nm.

At least one conductive material, such as a combination of a metallic barrier liner material and a metal fill material, may be conformally deposited in the laterally-extending cavities 43, in peripheral regions of the backside trenches 79, and above the contact-level dielectric layer 80. The metallic barrier liner material may comprise a conductive metallic compound material such as TiN, TaN, WN, MON, TiC, TaC, WC, alloys thereof, or a combination thereof. The metal fill material may comprise W, Ti, Ta, Mo, Co, Ru, Cu, alloys thereof, or combinations thereof. The total thickness of the at least one conductive material is greater than one half of the height of each laterally-extending cavity 43.

A recess etch process can be performed to remove portions of the at least one conductive material that are present within the volumes of the backside trenches 79 or above the contact-level dielectric layer 80. The recess etch process may comprise an anisotropic etch process. Each remaining portion of the at least one conductive material filling a respective laterally-extending cavity 43 constitutes an electrically conductive layer 46. In one embodiment, sidewalls of the electrically conductive layers 46 in an alternating stack (32, 46) may be vertically coincident with (i.e., located within same vertical planes as) sidewalls of a pair of backside trenches 79.

In summary, regions of the sacrificial material layers 42 that are proximal to the backside trenches 79 are replaced with electrically conductive layers 46. An alternating stack (32, 46) of insulating layers 32 and electrically conductive layers 46 is formed between each neighboring pair of backside trenches 79 that are laterally spaced apart from each other along the second horizontal direction hd2. A dielectric grid structure 30_* is embedded in the alternating stack (32, 46), and includes a two-dimensional array of rectangular compartments 28 that is defined by an interwoven assembly of first dielectric walls 30_# laterally extending along a first horizontal direction hd1 and second dielectric walls 30_# laterally extending along a second horizontal direction hd2. For each electrically conductive layer 46 that is not a topmost electrically conductive layer 46 or a bottommost electrically conductive layer 46, at least one rectangular compartment 28 is present within the two-dimensional array of rectangular compartments 28 of which an entire area is fully occupied by the electrically conductive layer 46 and by each electrically conductive layer 46 that underlies the electrically conductive layer 46, but is not fully occupied by any electrically conductive layer 46 that overlies the selected electrically conductive layer 46.

In one embodiment, within a volume that is laterally bounded by a neighboring pair of second dielectric walls 30_#, a first subset of the electrically conductive layers 46 has a first lateral extent along the second horizontal direction hd2 that is less than a lateral spacing between a neighboring pair of backside trenches 79 along the second horizontal direction hd2, and a second subset of the electrically conductive layers 46 has a second lateral extent along the second horizontal direction hd2 that equals the lateral spacing between the neighboring pair of backside trenches 79 along the second horizontal direction hd2. A portion of each rectangular compartment 28 that is partly occupied by the non-rectangular dielectric material plate 42' may be occupied by a portion of a respective electrically conductive layer 46 that overlies another electrically conductive layer 46.

Figure 15A:
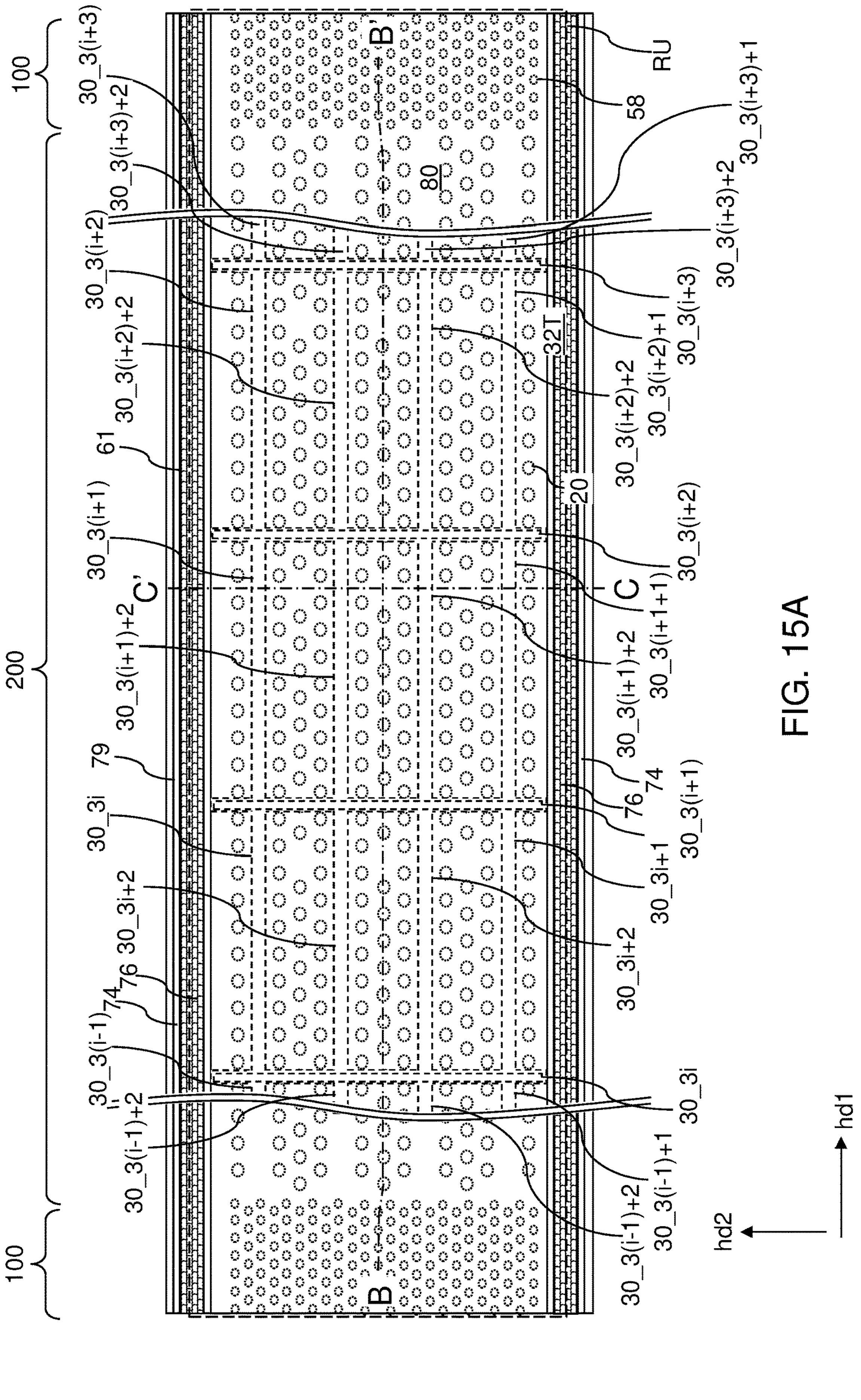
FIGS. 15A-15C are various views of the exemplary structure after formation of backside trench fill structures according to an embodiment of the present disclosure.
Figure 15B:
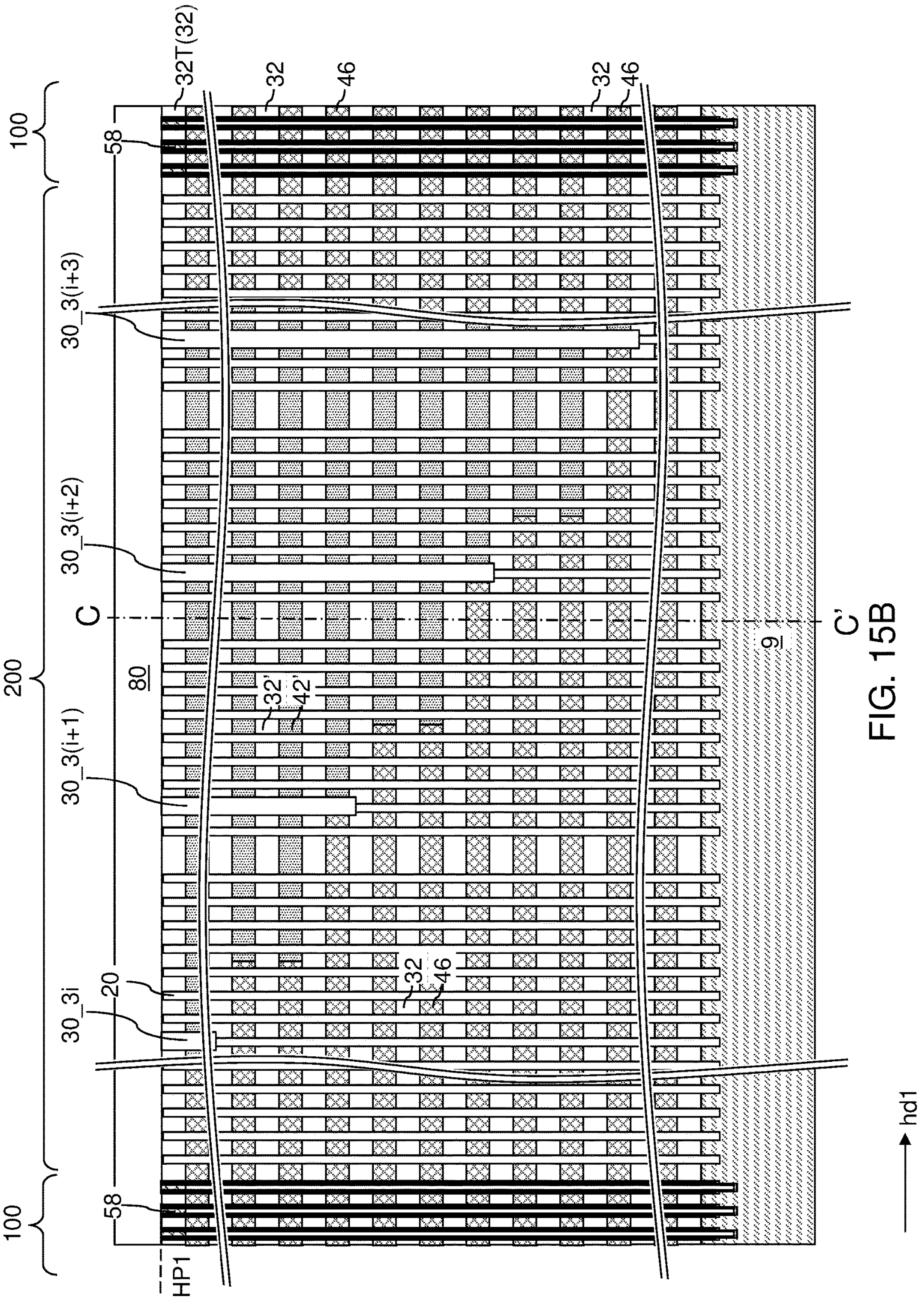
Figure 15C:
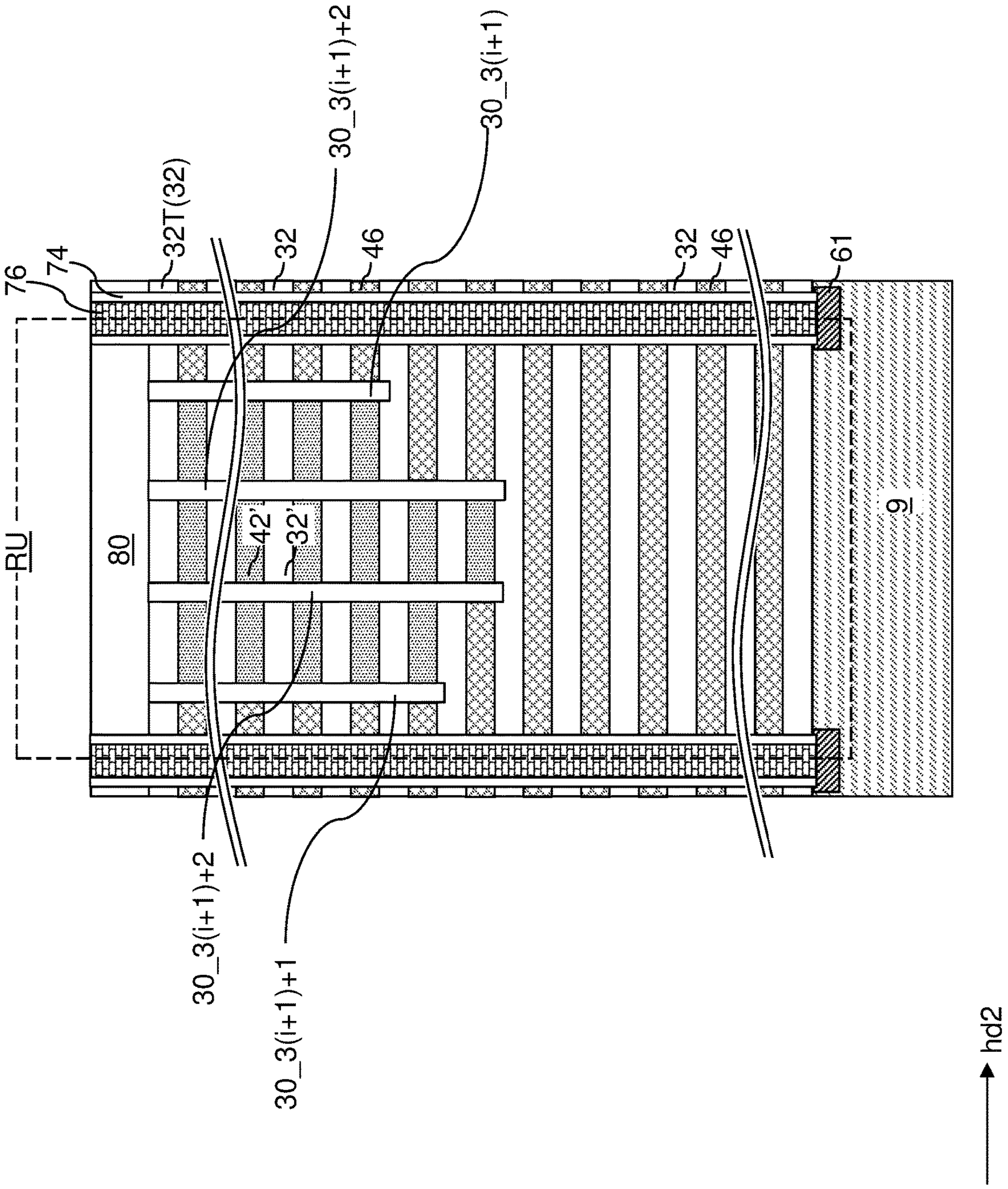
Figure 16A:
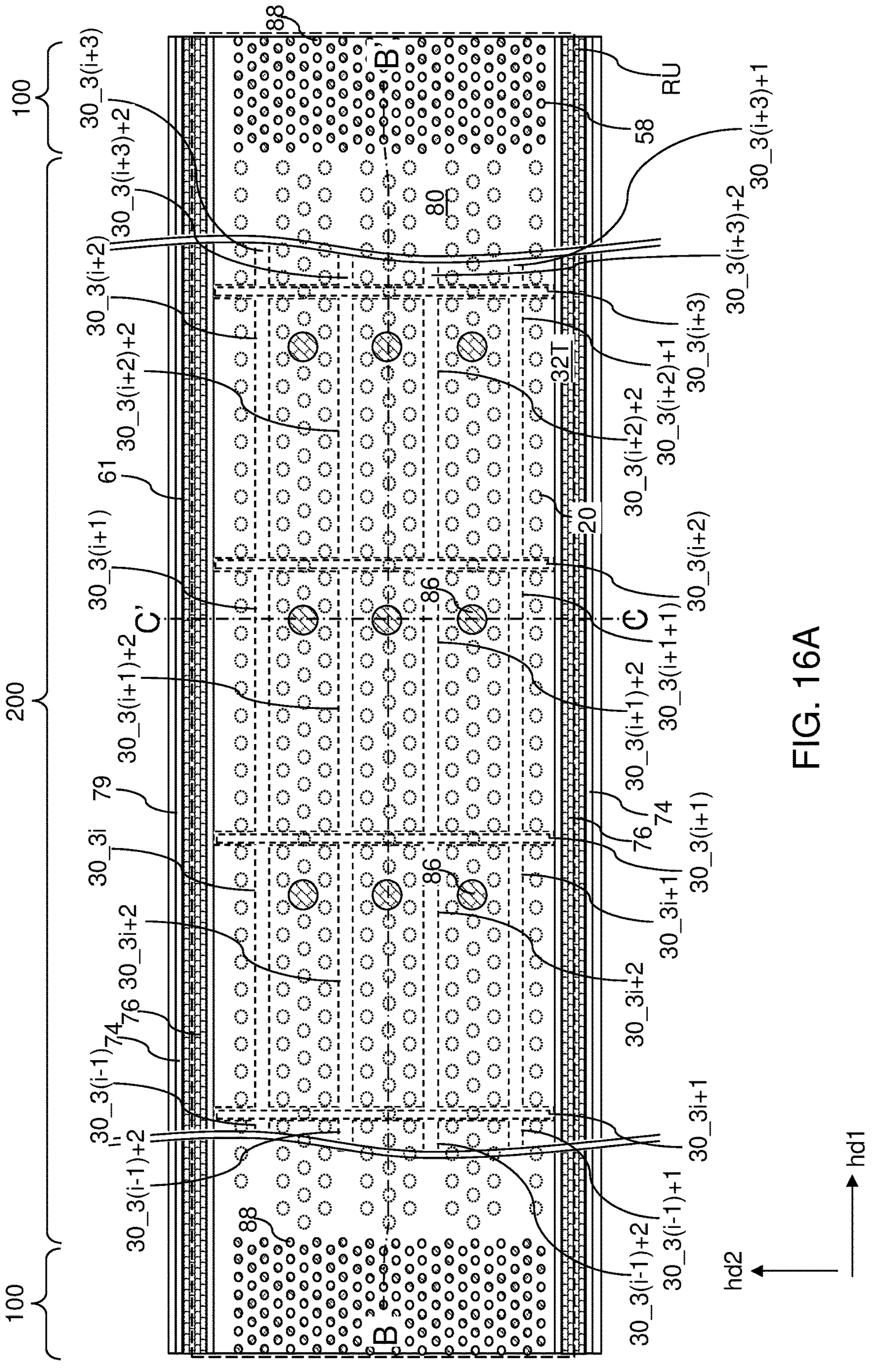
FIGS. 16A-16F are various views of the exemplary structure after formation of layer contact via structures and drain contact via structures according to an embodiment of the present disclosure.
Figure 16B:
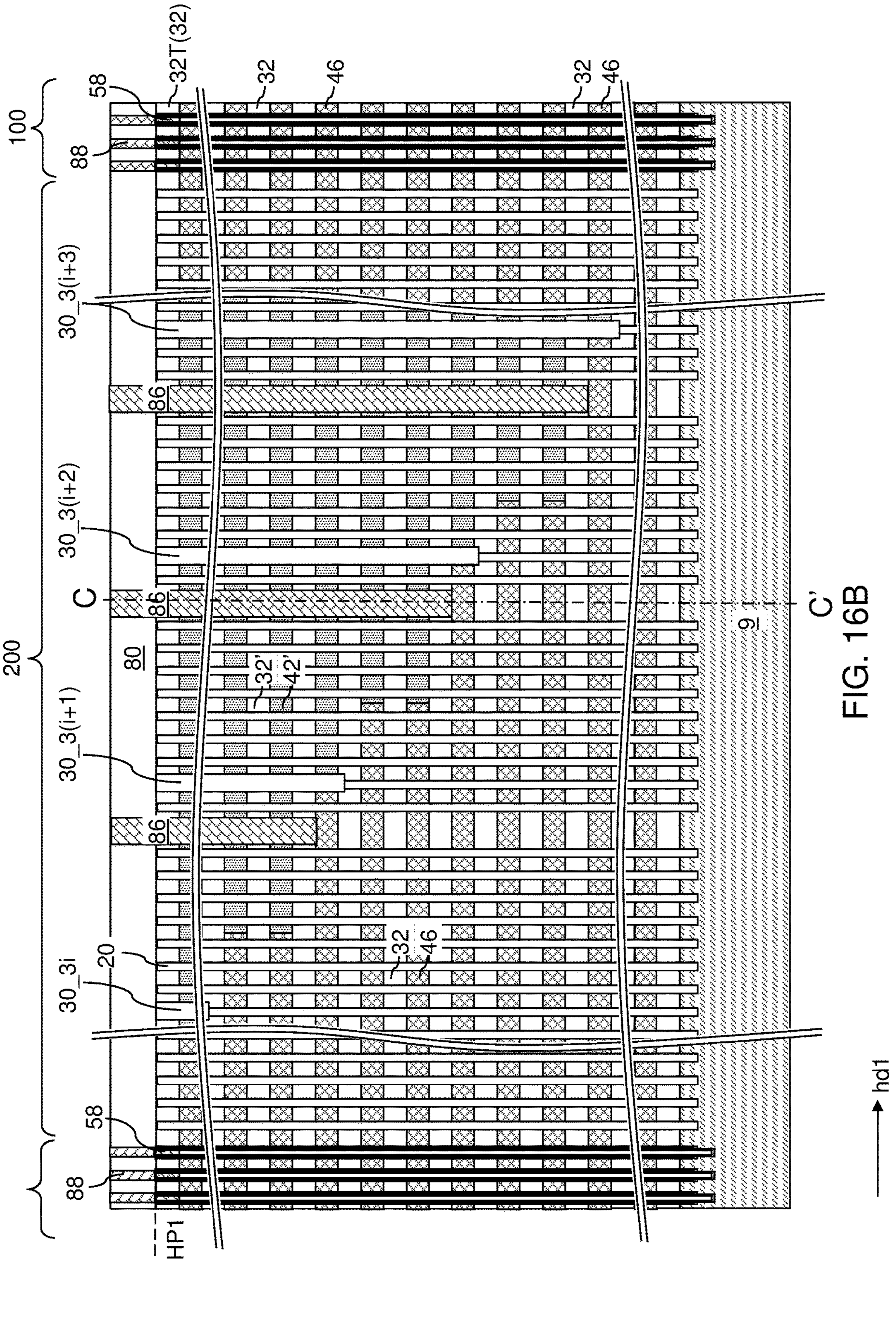
Figure 16C:
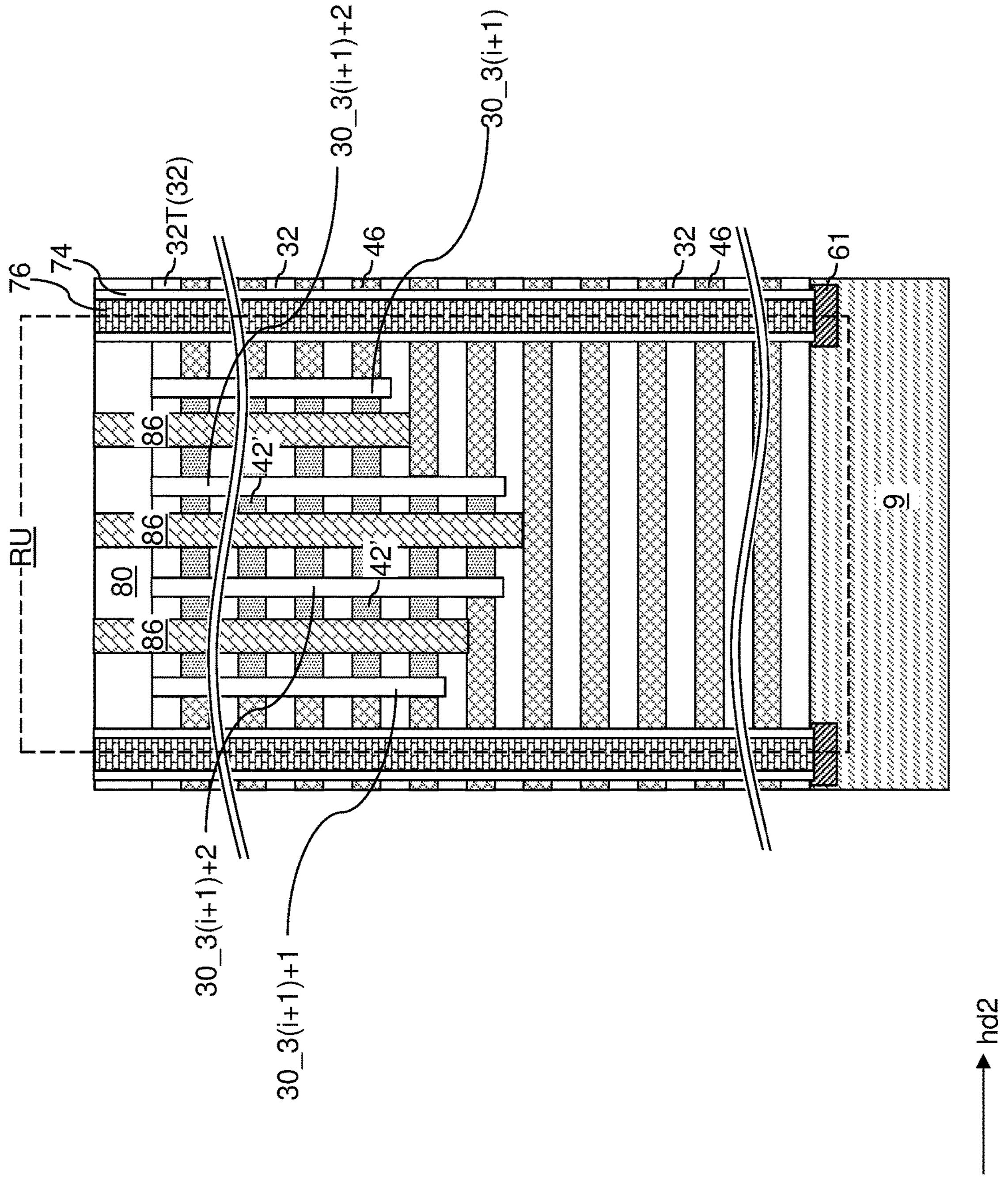
Figure 16D:
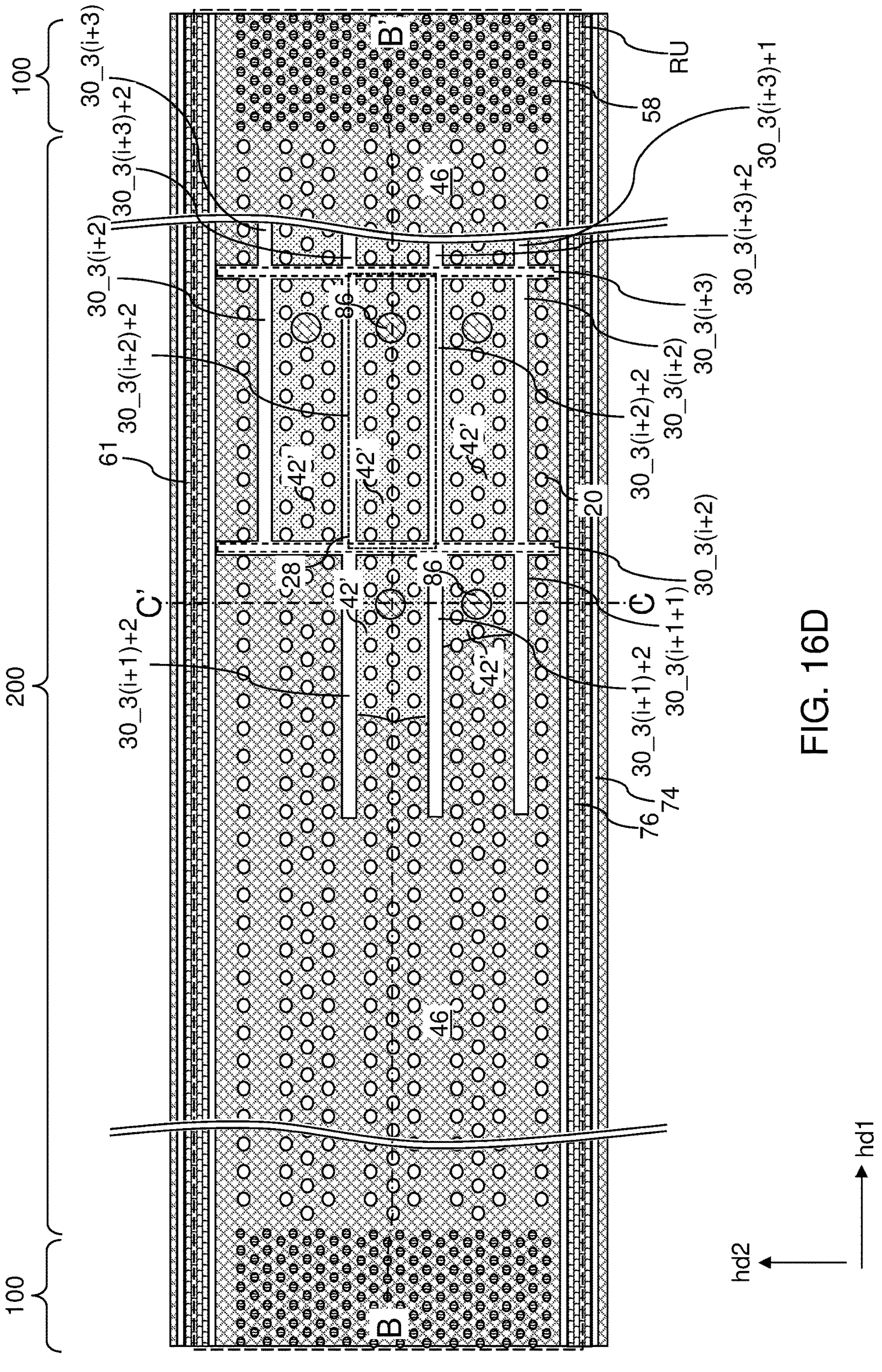
Figure 16E:
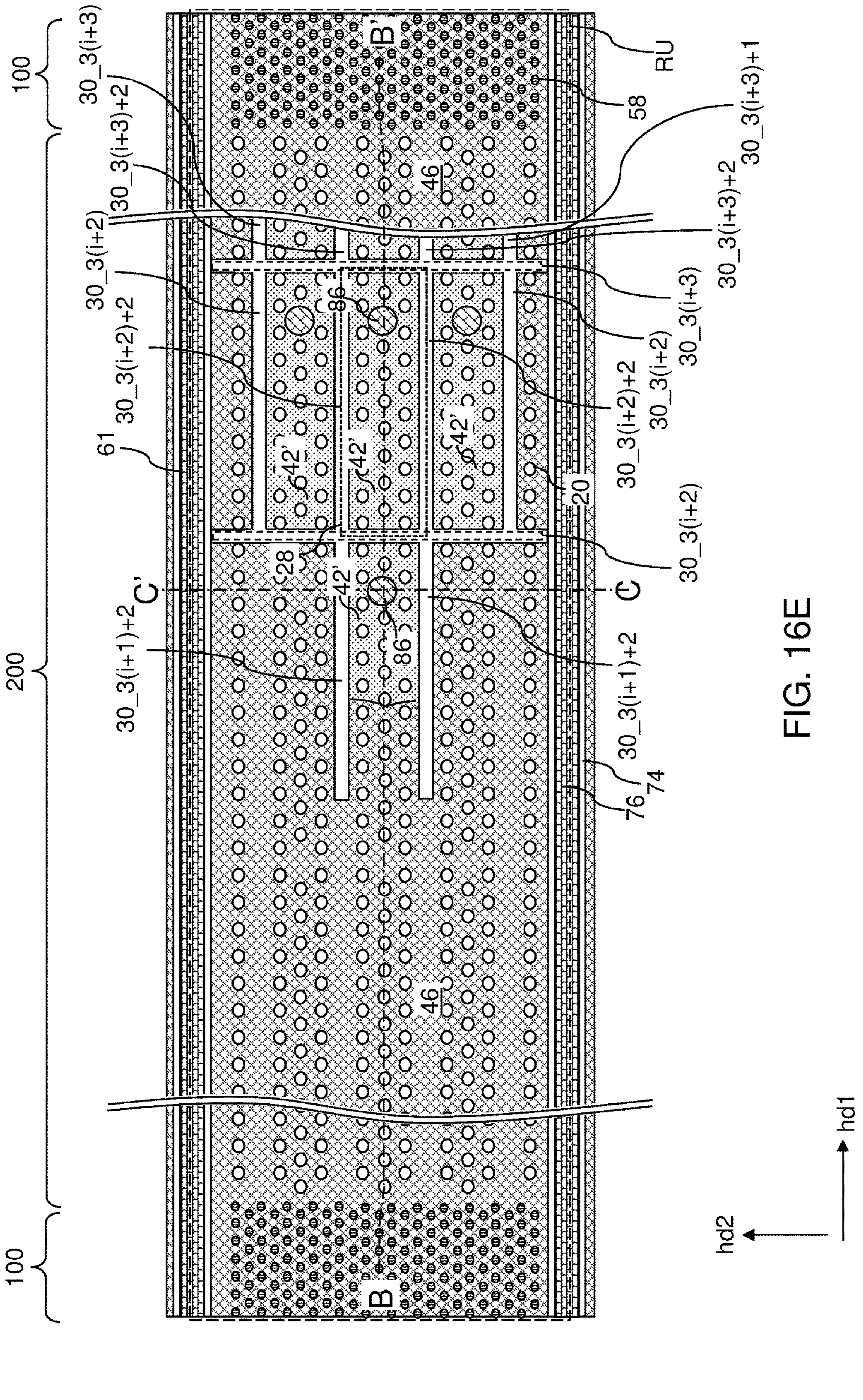
Figure 16F:
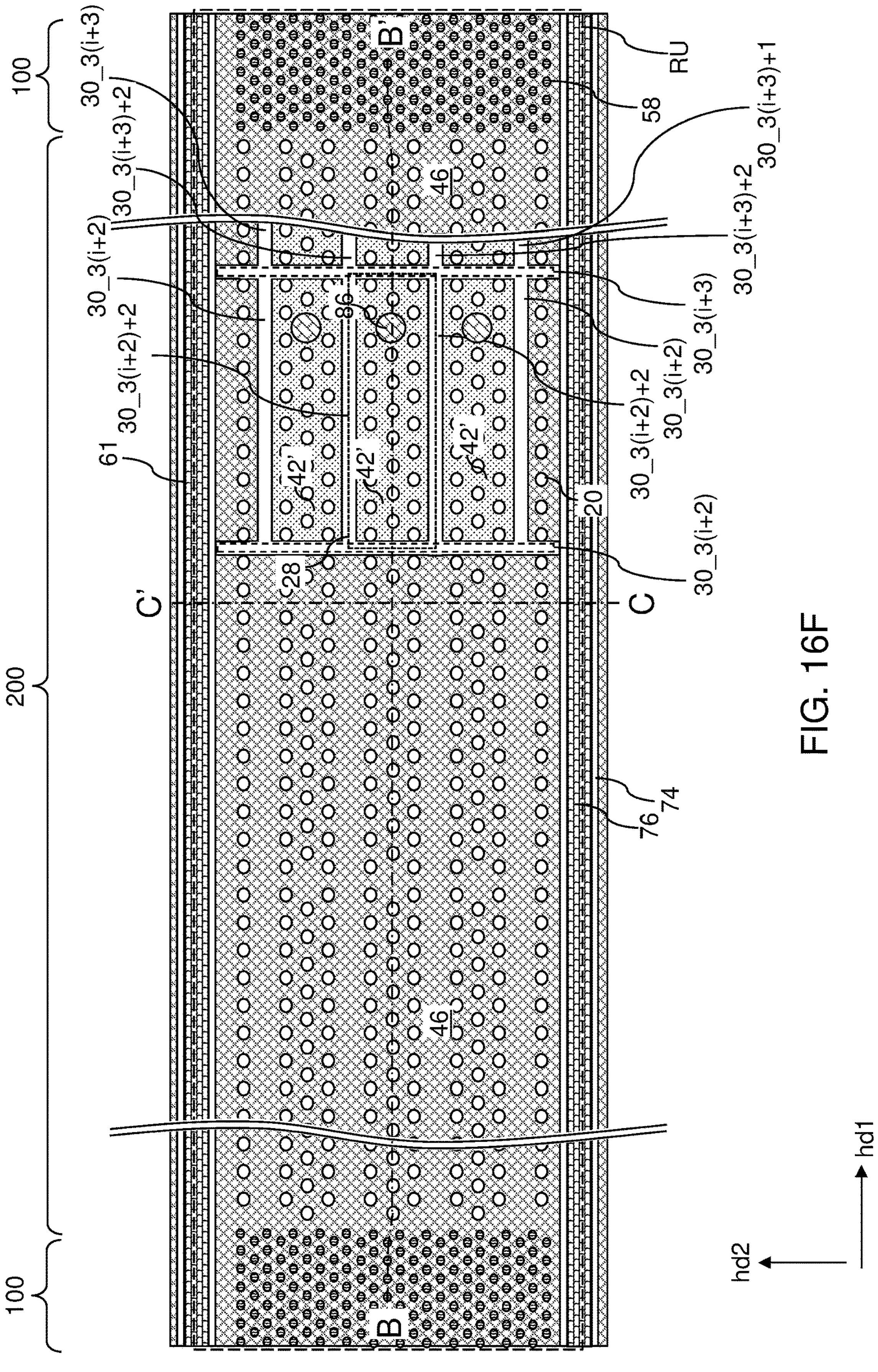

Referring to FIGS. 15A-15C, an insulating material layer can be formed in the backside trenches 79 and over the contact-level dielectric layer 80 by a conformal deposition process. An optional anisotropic etch can be performed to remove horizontal portions of the insulating material layer from above the contact-level dielectric layer 80 and at the bottom of each backside trench 79. Each remaining portion of the insulating material layer constitutes an insulating spacer 74. A lateral isolation cavity can be present within a volume surrounded by each insulating spacer 74. A top surface of the semiconductor material layer 9 can be physically exposed at the bottom of each backside trench 79.

An optional backside contact structure 76 can be formed within each lateral isolation cavity. The backside contact structures 76 can be formed by depositing at least one conductive material in the backside cavities. For example, the at least one conductive material can include a conductive liner and a conductive fill material portion. The conductive liner can include a conductive metallic liner such as TIN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof. Excess portions of the at least one conductive material can be removed from above the horizontal plane including the top surface of the contact-level dielectric layer 80 by a planarization process. The planarization process may comprise a recess etch process and/or a chemical mechanical polishing process. Each remaining portion of the at least one conductive material constitutes a backside contact structure 76. A pair of backside trench fill structures (74, 76) can laterally contact each alternating stack (32, 46) of insulating layers 32 and electrically conductive layers 46. The pair of backside trench fill structures (74, 76) can be laterally spaced apart from each other by the alternating stack (32, 46). Each of pair of backside trench fill structures (74, 76) comprises a respective insulating sidewall that laterally extends along the first horizontal direction hd1 and contacting a respective set of sidewalls of the alternating stack (32, 46).

For each alternating stack (32, 46) of insulating layers 32 and electrically conductive layers 46, a neighboring pair of a first backside trench fill structure (74, 76) and a second backside trench fill structure (74, 76) is provided. The first backside trench fill structure (74, 76) comprises a first dielectric surface contacting a first lengthwise sidewall of the alternating stack (32, 46) that laterally extends along the first horizontal direction hd1. The second backside trench fill structure (74, 76) comprises a second dielectric surface contacting a second lengthwise sidewall of the alternating stack (32, 46) that laterally extends along the first horizontal direction hd1. In one embodiment, each of the second dielectric walls 30_# contacts the first dielectric surface and the second dielectric surface.

Referring to FIGS. 16A-16F, a photoresist layer (not shown) can be applied over the contact-level dielectric layer 80, and can be lithographically patterned to form openings within the areas of the two-dimensional array of rectangular compartments 28 (which are defined by the dielectric grid structure 30_*) in a plan view. If the two-dimensional array of rectangular compartments 28 comprises an M×N array of rectangular compartments 28, an M×N array of openings can be formed over the M×N array of rectangular compartments. Further, if any non-rectangular dielectric material plate 42' is present with an area of any rectangular compartment 28, the opening in the photoresist layer which overlies such a rectangular compartment 28 is formed entirely within the area of such a non-rectangular dielectric material plate 42'.

An anisotropic etch process can be performed to transfer the pattern of the openings in the photoresist layer through the contact-level dielectric layer 80 and through any underlying insulating plate 32' and any underlying dielectric material plate 42'. The etch chemistry of the anisotropic etch process can be selected such that the anisotropic etch process change the materials of the contact-level dielectric layer 80, the insulating plates 32', and the dielectric material plates 42' selective to the material(s) of the electrically conductive layers 46. A terminal step of the anisotropic etch process may etch through a horizontally-extending portion of a respective backside blocking dielectric layer (not shown). Various etch chemistries may be employed for the anisotropic etch process. In an illustrative example, the insulating layers 32 may comprise silicon oxide, the sacrificial material plates 42' may comprise silicon nitride, and the chemistry of the anisotropic etch process may employe at least one fluorocarbon etchant (such as $CF_4$ or $CHF_3$), sulfur hexafluoride ($SF_6$), or nitrogen trifluoride ($NF_3$). Layer contact via cavities can be formed within the two-dimensional array of rectangular compartments 28. In one embodiment, at least one layer contact via cavity may be formed within each rectangular compartment 28 in the two-dimensional array of rectangular compartments 28. A top surface of an electrically conductive layer 46 can be physically exposed underneath each layer contact via cavity.

Additionally, drain contact via cavities can be formed through the contact-level dielectric layer 80 over the drain regions 63 of the memory opening fill structures 58. A top surface of a drain region 63 can be physically exposed at the bottom of each drain contact via cavity. The photoresist layer can be subsequently removed, for example, by ashing.

At least one conductive material can be deposited in the layer contact via cavities and in the drain contact via cavities. The at least one conductive material may comprise a combination of a metallic barrier material (such as TiN, TaN, WN, MON, etc.) and a metallic fill material (such as W, Cu, Mo, Ru, etc.). Excess portions of the at least one conductive material may be removed from above the horizontal plane including the top surface of the contact-level dielectric layer 80. Each layer contact via cavity can be filled with a respective remaining portion of the at least one conductive material, which constitutes a layer contact via structure 86. Each drain contact via cavity can be filled with a respective remaining portion of the at least one conductive material, which constitutes a drain contact via structure 88. Each layer contact via structure 86 can be formed directly on the top surface of a respective one of the electrically conductive layers 46 exposed within the area of a respective rectangular compartment 28. Each drain contact via structures 88 can be formed directly on the top surface of a respective one of the drain regions 63. Subsequently, bit lines (not shown) are formed in electrical contact with the drain contact via structures 88. Additional metal interconnect structures (not shown) embedded within additional dielectric material layers (not shown) can be formed, and electrical connections to the layer contact via structures 86 may be provided within the additional dielectric material layers.

In summary, layer contact via structures 86 can be formed through a respective rectangular compartment 28 within the two-dimensional array of rectangular compartments 28 and directly on a top surface of a respective one of the electrically conductive layers 46. Thus, the layer contact via structures 86 vertically extend through a respective rectangular compartment 28 within the two-dimensional array of rectangular compartments 28 and contacts a top surface of a respective one of the electrically conductive layers 46.

While an embodiment is illustrated in which the compartments 28 comprise rectangular (e.g., square or elongated rectangular) compartments 28 having a rectangular horizontal cross-sectional shapes, in alternative embodiments, the compartments 28 may have other horizontal cross-sectional shapes, such as other polygonal (e.g., triangular, hexagonal, etc.), combination shapes (e.g., combination of concave polygonal with circular or oval shapes) or irregular shapes, depending on the shape of the dielectric wall grid structure 30_*. Thus, while an embodiment is illustrated in which the first and second dielectric walls 30 extend in straight lines at 90 degrees with respect to each other to form a dielectric lattice structure 30_* which has a shape of a dielectric grid structure 30_*, in other embodiments, the first and second dielectric walls 30 may extend in non-straight (e.g., curved) lines and/or at angles other than 90 degrees (e.g., 1 to 89 degrees or 91 to 179 degrees) with respect to each other. Thus, the dielectric lattice structure 30_* may have a shape other than a grid, such as a triangular, pentagonal, hexagonal, combination (e.g., combination of concave polygonal with circular or oval shapes), irregular, etc. lattice.

Referring collectively to FIGS. 1-16F, a three-dimensional memory device comprises: an alternating stack (32, 46) of insulating layers 32 and electrically conductive layers 46; memory openings 49 vertically extending through the alternating stack (32, 46); memory opening fill structures 58 located in the memory openings 49, wherein each of the memory opening fill structures 58 comprises a respective vertical semiconductor channel 60 and a respective vertical stack of memory elements (e.g., portions of the memory film 50); a dielectric lattice structure 30_* embedded in the alternating stack (32, 46) and including a two-dimensional array of compartments 28 that is formed by an assembly of first dielectric walls 30_# laterally extending at least substantially along a first horizontal direction hd1, and second dielectric walls 30_# laterally extending at least substantially along a second horizontal direction hd2, and layer contact via structures 86 vertically extending through respective compartments 28 within the two-dimensional array of compartments 28 and contacting a top surface of a respective one of the electrically conductive layers 46.

In one embodiment, the dielectric lattice structure 30_* comprises a dielectric grid structure 30_*; the two-dimensional array of compartments 28 comprises a two-dimensional array of rectangular compartments 28 each having a rectangular horizontal cross-sectional shape; the first dielectric walls 30_# laterally extend along the first horizontal direction hd1; and the second dielectric walls 30_# laterally extend along the second horizontal direction hd2 which is perpendicular to the first horizontal direction hd1.

In one embodiment, for each selected electrically conductive layer 46 of the electrically conductive layers 46 that is not a topmost electrically conductive layer 46 or a bottommost electrically conductive layer 46, at least one rectangular compartment 28 is present within the two-dimensional array of rectangular compartments 28 of which an entire area is fully occupied by the selected electrically conductive layer 46 and by each electrically conductive layer 46 that underlies the selected electrically conductive layer 46, but is not fully occupied by any electrically conductive layer 46 that overlies the selected electrically conductive layer 46.

In one embodiment, the second dielectric walls 30_# have top surfaces within a first horizontal plane HP1 and have bottom surfaces at different depths from the first horizontal plane. In one embodiment, the three-dimensional memory device of comprises: a first backside trench fill structure (74, 76) comprising a first dielectric surface contacting a first lengthwise sidewall of the alternating stack (32, 46) that laterally extends along the first horizontal direction hd1; and a second backside trench fill structure (74, 76) comprising a second dielectric surface contacting a second lengthwise sidewall of the alternating stack (32, 46) that laterally extends along the first horizontal direction hd1, wherein each of the second dielectric walls 30_# contacts the first dielectric surface and the second dielectric surface.

In one embodiment, each of the first dielectric walls 30_# is laterally spaced from and is located between the first dielectric surface and the second dielectric surface. In one embodiment, a first subset of the electrically conductive layers 46 that is contacted by a respective one of a first subset of the layer contact via structures 86 has a first lateral extent along the second horizontal direction hd2 that is less than a lateral spacing between the first lengthwise sidewall of the alternating stack (32, 46) and the second lengthwise sidewall of the alternating stack (32, 46) in proximity to a respective portion that is contacted by the respective one of the first subset of the layer contact via structures 86; and a second subset of the electrically conductive layers 46 that is contacted by a respective one of a second subset of the layer contact via structures 86 has a second lateral extent along the second horizontal direction hd2 that equals the lateral spacing between the first lengthwise sidewall of the alternating stack (32, 46) and the second lengthwise sidewall of the alternating stack (32, 46) in proximity to a respective portion that is contacted by the respective one of the second subset of the layer contact via structures 86.

In one embodiment, the depths of the second dielectric walls 30_# increase along the first horizontal direction hd1. In one embodiment, each of the second dielectric walls 30_# has a respective uniform depth. In one embodiment, the two-dimensional array of rectangular compartments comprises an M×N rectangular array of rectangular compartments in which M is an integer greater than 1, and N is an integer in a range from $2^4$ to $2^{10}$; top surfaces of each vertically neighboring pair of electrically conductive layers 46 of the electrically conductive layers 46 of the alternating stack (32, 46) are vertically spaced from each other by a unit vertical distance; and each neighboring pair of second dielectric walls 30_# of the second dielectric walls 30_# of the dielectric grid structure 30_* has a respective pair of bottom surfaces that are vertically offset from each other by a uniform vertical offset distance which is M times the unit vertical distance.

In one embodiment, each of the first dielectric walls 30_# has a respective stepped bottom surface of which a height decreases stepwise along the first horizontal direction hd1 by the uniform vertical offset distance at each location of the second dielectric walls 30_#. In one embodiment, within each vertical cross-sectional plane that contains the first dielectric walls 30_# and is perpendicular to the first horizontal direction hd1, bottom surfaces of at least one pair of the first dielectric walls 30_# of the first dielectric walls 30_# of the dielectric grid structure 30_* are vertically offset by a respective integer multiple of the unit vertical distance which is less than M times the unit vertical distance.

In one embodiment, each layer contact via structures 86 that contacts a respective electrically conductive layer 46 that is not the topmost electrically conductive layer 46 vertically extends through a respective stack of at least one pair of an insulating plate 32' and a dielectric material plate 42' that is located entirely within an area of a respective compartment 28 within the two-dimensional array of compartments 28. In one embodiment, a subset of the layer contact via structures 86 vertically extends through and directly contacts each of a respective vertical stack of at least one pair of a rectangular insulating plate 32' and a dielectric material plate 42' that is located entirely within an area of a compartment 28 within the two-dimensional array of compartments 28.

In one embodiment, one of the layer contact via structures 86 vertically extends through, and directly contacts each of, a non-rectangular dielectric material plate 42' that is located entirely within an area of, and having a lesser area than, a rectangular compartment within the two-dimensional array of rectangular compartments. In one embodiment, a portion of the rectangular compartment that is partly occupied by the non-rectangular dielectric material plate 42' is occupied by a portion of an electrically conductive layer 46 that overlies another electrically conductive layer 46 that is contacted by said one of the layer contact via structures 86.

The various embodiments of the present disclosure may be employed to provide a reliable method for forming layer contact via structures 86 to the electrically conductive layers (e.g., word lines) 46. The electrically conductive layers 46 may be employed as etch stop layers during formation of the layer contact via cavities. Thus, the anisotropic etch process that forms the layer contact via cavities can have a larger process window because of the use of the electrically conductive layers 46 as etch stop layers. Each layer contact via cavity can vertically extend to a top surface of a respective one of the electrically conductive layers 46 without punching through any electrically conductive layer 46. Thus, each layer contact via structure 86 can be formed in direct contact with the only one of the electrically conductive layers 46, and electrical opens or electrical shorts to other electrically conductive layers 46 can be reduced or avoided.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph or in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

The invention claimed is:

1. A three-dimensional memory device, comprising:
- an alternating stack of insulating layers and electrically conductive layers;
- memory openings vertically extending through the alternating stack;
- memory opening fill structures located in the memory openings, wherein each of the memory opening fill structures comprises a respective vertical channel and a vertical stack of memory elements;
- a dielectric lattice structure embedded in the alternating stack and including a two-dimensional array of compartments that is formed by an assembly of first dielectric walls laterally extending at least substantially along a first horizontal direction and second dielectric walls laterally extending at least substantially along a second horizontal direction; and
- layer contact via structures vertically extending through respective compartments within the two-dimensional array of compartments and contacting a top surface of a respective one of the electrically conductive layers.

2. The three-dimensional memory device of claim 1, wherein:
- the dielectric lattice structure comprises a dielectric grid structure;
- the two-dimensional array of compartments comprises a two-dimensional array of rectangular compartments, each having a rectangular horizontal cross-sectional shape;
- the first dielectric walls laterally extend along the first horizontal direction; and
- the second dielectric walls laterally extend along the second horizontal direction which is perpendicular to the first horizontal direction.

3. The three-dimensional memory device of claim 2, wherein for each selected electrically conductive layer of the electrically conductive layers that is not a topmost electrically conductive layer or a bottommost electrically conductive layer, at least one rectangular compartment is present within the two-dimensional array of rectangular compartments of which an entire area is fully occupied by the selected electrically conductive layer and by each electrically conductive layer that underlies the selected electrically conductive layer, but is not fully occupied by any electrically conductive layer that overlies the selected electrically conductive layer.

4. The three-dimensional memory device of claim 2, wherein the second dielectric walls have top surfaces within a first horizontal plane and have bottom surfaces at different depths from the first horizontal plane.

5. The three-dimensional memory device of claim 4, further comprising:
- a first backside trench fill structure comprising a first dielectric surface contacting a first lengthwise sidewall of the alternating stack that laterally extends along the first horizontal direction; and
- a second backside trench fill structure comprising a second dielectric surface contacting a second lengthwise sidewall of the alternating stack that laterally extends along the first horizontal direction,
- wherein each of the second dielectric walls contacts the first dielectric surface and the second dielectric surface.

6. The three-dimensional memory device of claim 5, wherein each of the first dielectric walls is laterally spaced from and is located between the first dielectric surface and the second dielectric surface.

7. The three-dimensional memory device of claim 6, wherein:
- a first subset of the electrically conductive layers that is contacted by a respective one of a first subset of the layer contact via structures has a first lateral extent along the second horizontal direction that is less than a lateral spacing between the first lengthwise sidewall of the alternating stack and the second lengthwise sidewall of the alternating stack in proximity to a respective portion that is contacted by the respective one of the first subset of the layer contact via structures; and
- a second subset of the electrically conductive layers that is contacted by a respective one of a second subset of the layer contact via structures has a second lateral extent along the second horizontal direction that equals the lateral spacing between the first lengthwise sidewall of the alternating stack and the second lengthwise sidewall of the alternating stack in proximity to a respective portion that is contacted by the respective one of the second subset of the layer contact via structures.

8. The three-dimensional memory device of claim 4, wherein:

the depths of bottom surfaces of the second dielectric walls increase along the first horizontal direction; and each bottom surface of the second dielectric walls has a respective uniform depth.

9. The three-dimensional memory device of claim 2, wherein:

the two-dimensional array of rectangular compartments comprises an M×N rectangular array of rectangular compartments in which M is an integer greater than 1, and N is an integer in a range from $2^4$ to $2^{10}$;

top surfaces of each vertically neighboring pair of electrically conductive layers of the electrically conductive layers of the alternating stack are vertically spaced from each other by a unit vertical distance; and each neighboring pair of second dielectric walls of the second dielectric walls of the dielectric grid structure has a respective pair of bottom surfaces that are vertically offset from each other by a uniform vertical offset distance which is M times the unit vertical distance.

10. The three-dimensional memory device of claim 9, wherein:

each of the first dielectric walls has a respective stepped bottom surface of which a height decreases stepwise along the first horizontal direction by the uniform vertical offset distance at each location of the second dielectric walls; and within each vertical cross-sectional plane that contains the first dielectric walls and is perpendicular to the first horizontal direction, bottom surfaces of at least one pair of the first dielectric walls of the first dielectric walls of the dielectric grid structure are vertically offset by a respective integer multiple of the unit vertical distance which is less than M times the unit vertical distance.

11. The three-dimensional memory device of claim 2, wherein one of the layer contact via structures vertically extends through and directly contacts each of a non-rectangular dielectric material plate that is located entirely within an area of and having a lesser area than a rectangular compartment within the two-dimensional array of rectangular compartments.

12. The three-dimensional memory device of claim 11, wherein a portion of the rectangular compartment that is partly occupied by the non-rectangular dielectric material plate is occupied by a portion of an electrically conductive layer that overlies another electrically conductive layer that is contacted by said one of the layer contact via structures.

13. The three-dimensional memory device of claim 1, wherein each of the layer contact via structures that contacts a respective electrically conductive layer that is not the topmost electrically conductive layer, vertically extends through a respective stack of at least one pair of an insulating plate and a dielectric material plate that is located entirely within an area of a respective compartment within the two-dimensional array of compartments.

14. The three-dimensional memory device of claim 1, wherein a subset of the layer contact via structures vertically extends through and directly contacts each of a respective vertical stack of at least one pair of a rectangular insulating plate and a rectangular dielectric material plate that is located entirely within an area of a respective compartment within the two-dimensional array of compartments.

15. A method of forming a three-dimensional memory device, comprising:

forming an alternating stack of insulating layers and sacrificial material layers;

forming memory openings vertically extending through the alternating stack;

forming memory opening fill structures in the memory openings, wherein each of the memory opening fill structures comprises a respective vertical stack of memory elements and a respective vertical semiconductor channel;

forming a dielectric grid structure in the alternating stack, wherein the dielectric grid structure includes a two-dimensional array of rectangular compartments that is defined by an assembly of first dielectric walls laterally extending along a first horizontal direction and second dielectric walls laterally extending along a second horizontal direction;

forming backside trenches through the alternating stack;

replacing regions of the sacrificial material layers that are proximal to the backside trenches with electrically conductive layers; and forming layer contact via structures through a respective rectangular compartment within the two-dimensional array of rectangular compartments and directly on a top surface of a respective one of the electrically conductive layers.

16. The method of claim 15, wherein, for each selected electrically conductive layer of the electrically conductive layers that is not a topmost electrically conductive layer or a bottommost electrically conductive layer, at least one rectangular compartment is present within the two-dimensional array of rectangular compartments of which an entire area is fully occupied by the selected electrically conductive layer and by each electrically conductive layer that underlies the selected electrically conductive layer, but is not fully occupied by any electrically conductive layer that overlies the selected electrically conductive layer.

17. The method of claim 15, wherein the dielectric grid structure is formed by:

forming first isolation trenches that laterally extend along the first horizontal direction;

forming second isolation trenches that laterally extend along the second horizontal direction which is perpendicular to the first horizontal direction; and filling the first isolation trenches and the second isolation trenches with at least one dielectric fill material.

18. The method of claim 17, wherein:

depths of the second isolation trenches increase along the first horizontal direction;

the backside trenches cut through each of the second dielectric walls; and at least two first dielectric walls of the first dielectric walls are located between a neighboring pair of a first backside trench and a second backside trench of the backside trenches.

19. The method of claim 15, further comprising:

forming laterally-extending cavities by introducing an isotropic etchant that etches a material of the sacrificial material layers into the backside trenches, wherein the dielectric grid structure functions as an etch-stop structure that limits lateral extents of the laterally-extending cavities; and for each selected electrically conductive layer that is not a topmost electrically conductive layer and occupies an area of a respective rectangular compartment within the two-dimensional array of rectangular compartments, at least one pair of an insulating plate and a dielectric material plate is located above the selected electrically conductive layer within the area of the respective rectangular compartment.

20. The method of claim 15, wherein:

the two-dimensional array of rectangular compartments comprises an M×N rectangular array of rectangular compartments in which M is an integer greater than 1, and N is an integer in a range from $2^4$ to $2^{10}$;

top surfaces of each vertically neighboring pair of electrically conductive layers of the electrically conductive layers of the alternating stack are vertically spaced from each other by a unit vertical distance; and each neighboring pair of second dielectric walls of the second dielectric walls of the dielectric grid structure has a respective pair of bottom surfaces that are vertically offset from each other by a uniform vertical offset distance which is M times the unit vertical distance.

* * * * *